(12) United States Patent
Meiser et al.

(10) Patent No.: US 10,964,808 B2
(45) Date of Patent: Mar. 30, 2021

(54) SILICON CARBIDE SEMICONDUCTOR DEVICE WITH TRENCH GATE STRUCTURE AND VERTICAL PN JUNCTION BETWEEN BODY REGION AND DRIFT STRUCTURE

(71) Applicant: Infineon Technologies AG, Neubiberg (DE)

(72) Inventors: Andreas Meiser, Sauerlach (DE); Romain Esteve, Munich (DE); Roland Rupp, Lauf (DE)

(73) Assignee: Infineon Technologies AG, Neubiberg (DE)

( * ) Notice: Subject to any disclaimer, the term of this patent is extended or adjusted under 35 U.S.C. 154(b) by 188 days.

(21) Appl. No.: 16/144,880

(22) Filed: Sep. 27, 2018

(65) Prior Publication Data

US 2019/0097042 A1    Mar. 28, 2019

(30) Foreign Application Priority Data

Sep. 28, 2017  (DE) .......................... 102017122634.6

(51) Int. Cl.
*H01L 29/78* (2006.01)
*H01L 29/10* (2006.01)
(Continued)

(52) U.S. Cl.
CPC ...... *H01L 29/7813* (2013.01); *H01L 29/0696* (2013.01); *H01L 29/086* (2013.01);
(Continued)

(58) Field of Classification Search
CPC .............. H01L 29/0696; H01L 29/086; H01L 29/0865; H01L 29/6606; H01L 29/66068;
(Continued)

(56) References Cited

U.S. PATENT DOCUMENTS 9,911,818 B2    3/2018  Nakano et al.
2014/0151798 A1  6/2014  Meiser et al.
(Continued)

FOREIGN PATENT DOCUMENTS

DE    102014117780 A1    6/2016
JP      2001284585 A    10/2001
(Continued)

OTHER PUBLICATIONS

Tega, Naoki, et al., "Channel Properties of SiC Trench-Etched Double-Implanted MOS (TED MOS)", IEEE Transactions on Electron Devices, vol. 63, No. 9, Sep. 2016, pp. 3439-3444.
(Continued)

*Primary Examiner* — Cuong Q Nguyen
(74) *Attorney, Agent, or Firm* — Murphy, Bilak & Homiller, PLLC

(57) ABSTRACT

A semiconductor device includes trench gate structures that extend from a first surface into a semiconductor body of silicon carbide. The trench gate structures include a gate electrode and are spaced apart from one another along a first horizontal direction and extend into a body region with a longitudinal axis parallel to the first horizontal direction. First sections of first pn junctions between the body regions and a drift structure are tilted to the first surface and parallel to the first horizontal direction. Source regions form second pn junctions with the body regions. A gate length of the gate electrode along a second horizontal direction orthogonal to the first horizontal direction is greater than a channel length between the first sections of the first pn junctions and the second pn junctions.

30 Claims, 41 Drawing Sheets

(51) Int. Cl.
  *H01L 29/08* (2006.01)
  *H01L 29/739* (2006.01)
  *H01L 29/66* (2006.01)
  *H01L 29/06* (2006.01)
  *H01L 29/16* (2006.01)
  *H01L 29/423* (2006.01)
  *H01L 29/417* (2006.01)
  *H01L 29/04* (2006.01)
  *H01L 29/872* (2006.01)

(52) U.S. Cl.
  CPC ...... *H01L 29/0865* (2013.01); *H01L 29/0878* (2013.01); *H01L 29/1033* (2013.01); *H01L 29/1095* (2013.01); *H01L 29/1608* (2013.01); *H01L 29/4236* (2013.01); *H01L 29/66068* (2013.01); *H01L 29/66734* (2013.01); *H01L 29/739* (2013.01); *H01L 29/7803* (2013.01); *H01L 29/7806* (2013.01); *H01L 29/7832* (2013.01); *H01L 29/045* (2013.01); *H01L 29/41766* (2013.01); *H01L 29/872* (2013.01)

(58) Field of Classification Search
  CPC ......... H01L 29/66143; H01L 29/66734; H01L 29/7806; H01L 29/7813; H01L 29/1095; H01L 29/1608; H01L 29/872; H01L 29/4236
  See application file for complete search history.

(56) References Cited

U.S. PATENT DOCUMENTS

| | | | |
|---|---|---|---|
| 2016/0163852 A1* | 6/2016 | Siemieniec | H01L 29/1095 257/77 |
| 2016/0260798 A1 | 9/2016 | Rupp et al. | |
| 2017/0263712 A1* | 9/2017 | Siemieniec | H01L 29/1095 |

FOREIGN PATENT DOCUMENTS

| | | |
|---|---|---|
| JP | 2008141056 A | 6/2008 |
| JP | 2009043966 A | 2/2009 |
| JP | 2009117593 A | 5/2009 |
| JP | 2009117649 A | 5/2009 |
| JP | 2013077761 A | 4/2013 |
| JP | 2014003191 A | 1/2014 |
| JP | 2014063775 A | 4/2014 |
| WO | 2010110246 A1 | 9/2010 |

OTHER PUBLICATIONS

Tega, Naoki, et al., "Novel trench-etched double-diffused SiC MOS (TED MOS) for overcoming tradeoff between RonA and Qgd", Proceedings of the 27th International Symposium on Power Semiconductor Devices & IC's, May 10-14, 2015, Kowloon Shangri-La, Hong Kong, pp. 81-84.

* cited by examiner

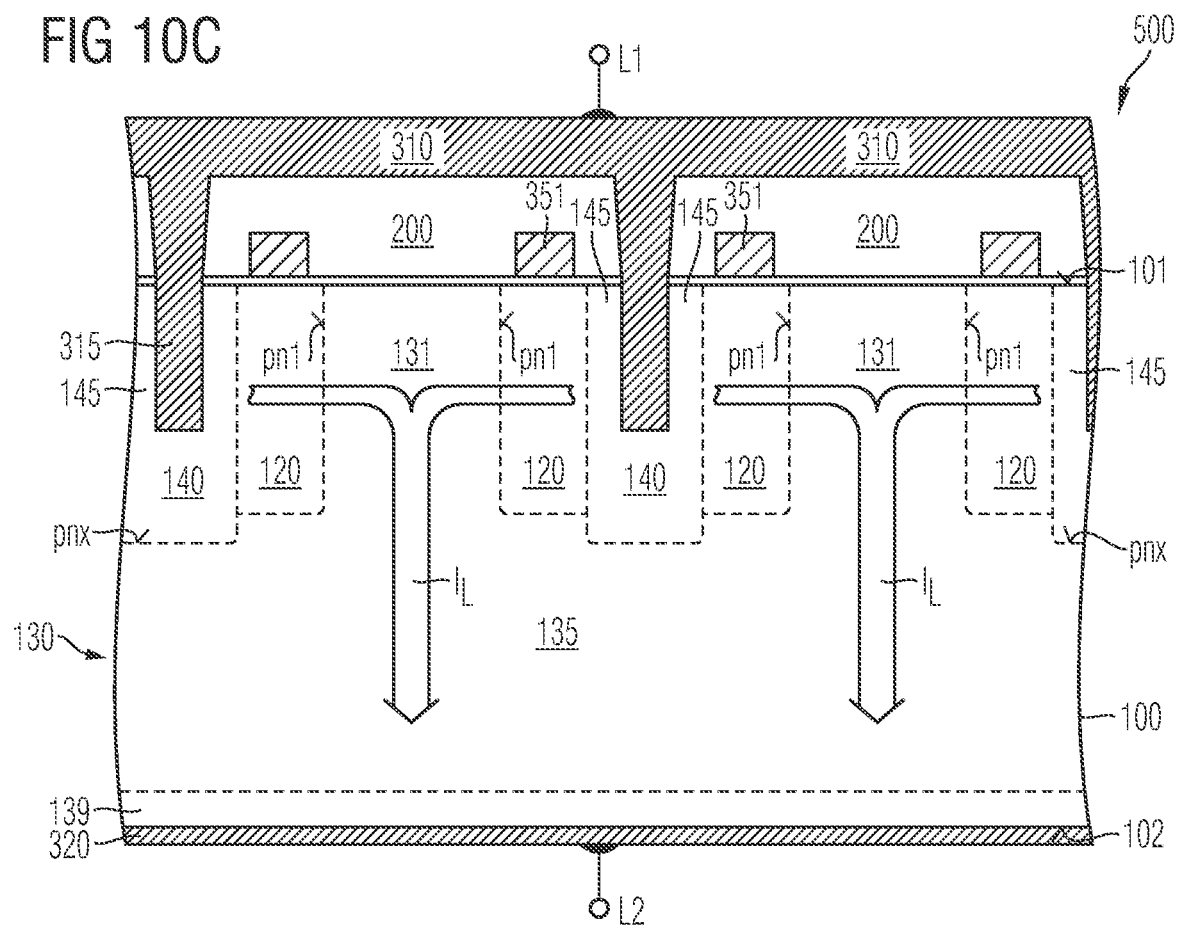
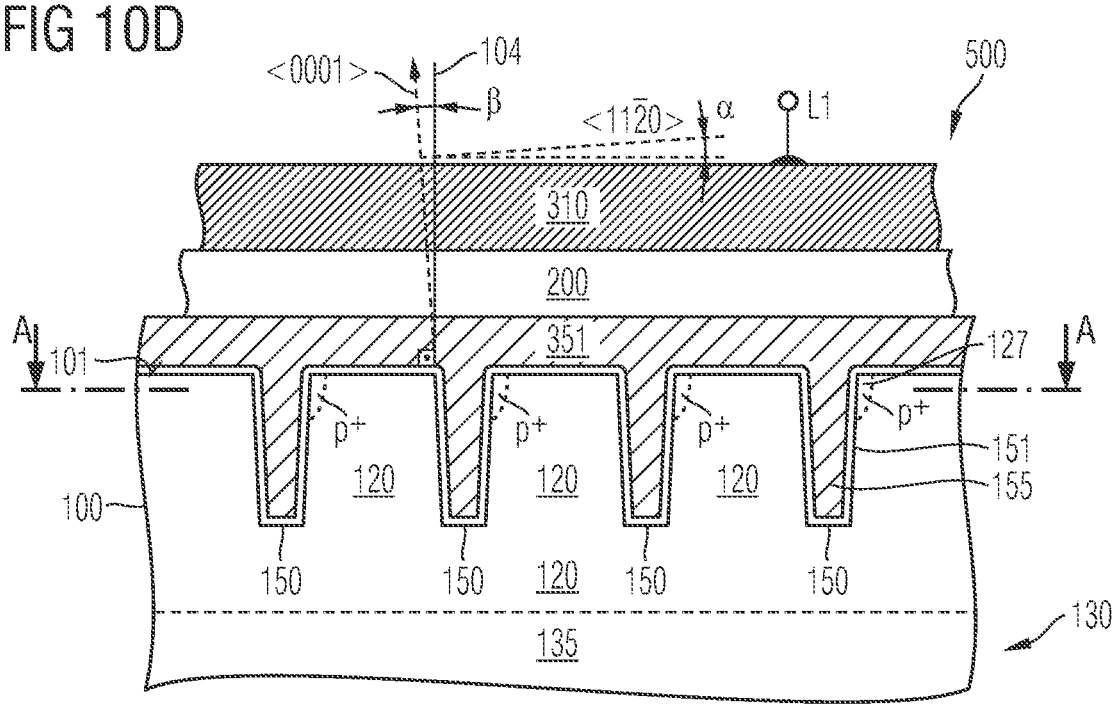

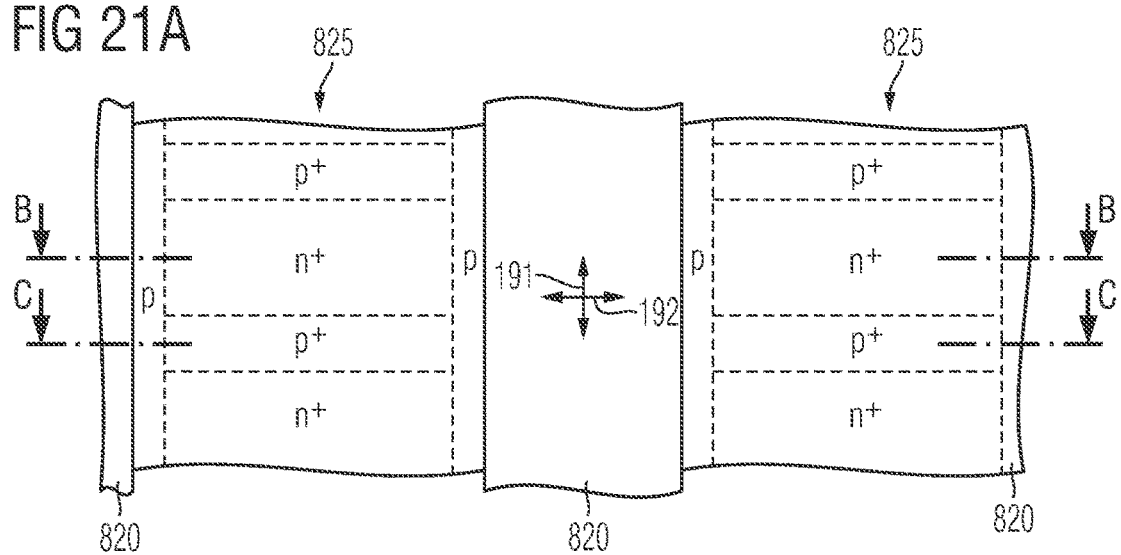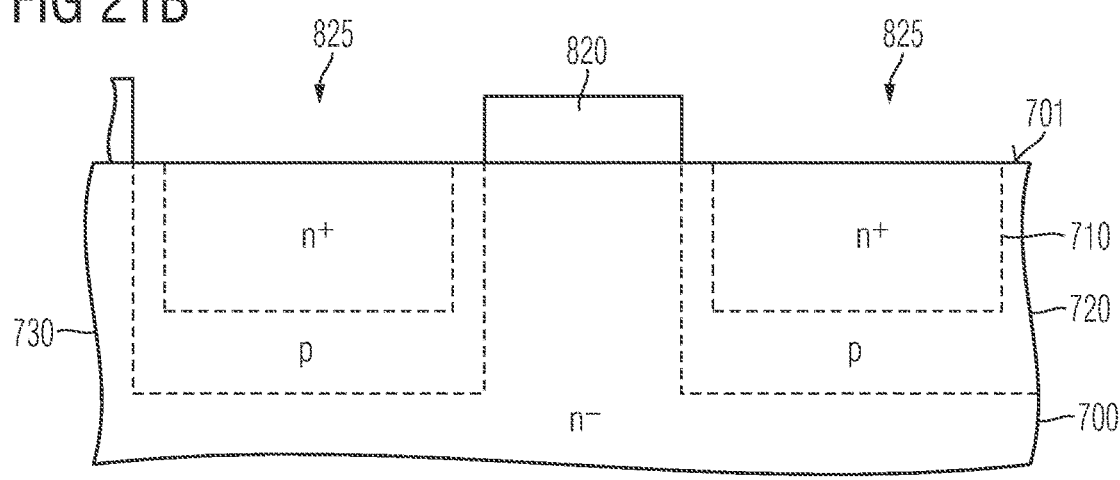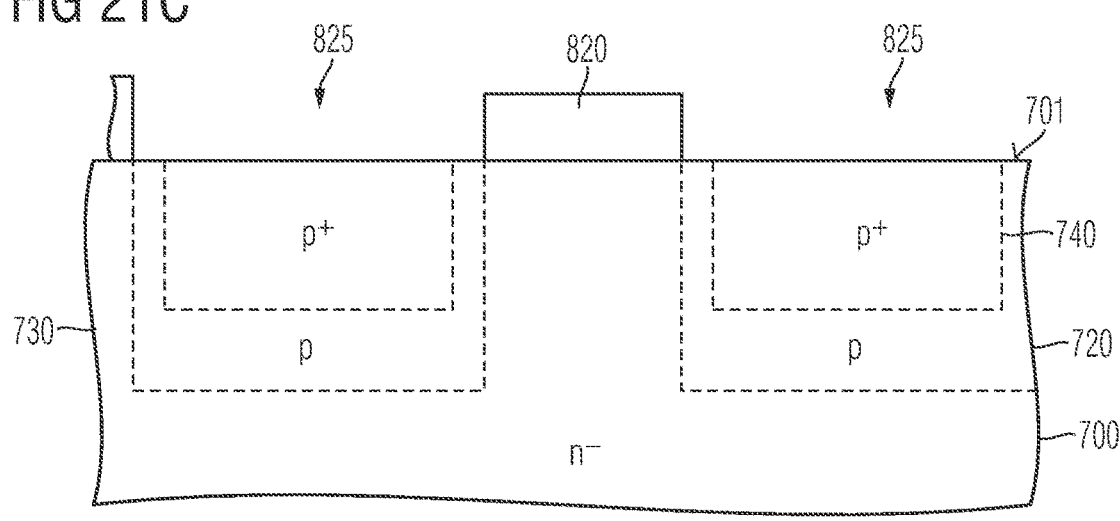

SILICON CARBIDE SEMICONDUCTOR DEVICE WITH TRENCH GATE STRUCTURE AND VERTICAL PN JUNCTION BETWEEN BODY REGION AND DRIFT STRUCTURE

BACKGROUND

Silicon carbide (SiC) shows significantly higher dielectric breakdown field strength than silicon such that vertical power semiconductor devices with a load current flow between a first surface at a front side and a second surface on the back of a SiC semiconductor die can be significantly thinner than silicon devices with the same breakdown voltage capability. As a consequence SiC semiconductor devices can combine high breakdown voltages of more than 600 V with significantly lower on-state resistance than their silicon counterparts. In SiC semiconductor switches with trench gates and vertical channel, the electric field a gate dielectric at the bottom of the trench gates is exposed to is significantly higher than in silicon devices such that instead of the properties of a drift region, the dielectric strength of a gate dielectric may determine the voltage blocking capability. In SiC semiconductor switches with trench gates and lateral channel, the body region may completely embed the lower portion of the trench gates.

There is a need for SiC semiconductor devices with well-defined gate threshold and high avalanche ruggedness.

SUMMARY

The present disclosure relates to a semiconductor device including trench gate structures extending from a first surface into a semiconductor body of silicon carbide and spaced apart from one another along a first horizontal direction. The trench gate structures include a gate electrode and extend into a body region with a longitudinal axis parallel to the first horizontal direction. First sections of first pn junctions between the body regions and a drift structure are tilted to the first surface and parallel to the first horizontal direction. Source regions form second pn junctions with the body regions. A gate length of the gate electrode along a second horizontal direction orthogonal to the first horizontal direction is greater than a channel length between the first sections of the first pn junctions and the second pn junctions.

The present disclosure further relates to a semiconductor device including trench gate structures extending from a first surface into a semiconductor body on silicon carbide and spaced apart from one another along a first horizontal direction. The trench gate structures extend into a body region with a longitudinal axis parallel to the first horizontal direction. First sections of first pn junctions between the body regions and a drift structure are tilted to the first surface and parallel to the first horizontal direction and a vertical extension of the body region is greater than a vertical extension of the trench gate structures. A channel blocking structure at a bottom of the trench gate structures suppresses formation of an inversion channel in a portion of the body region along a bottom surface of the trench gate structures within a maximum operating range of a gate voltage of the semiconductor device.

The present disclosure also relates to a semiconductor device including a drift structure that includes a drift layer and a current spread region. The drift layer is at a distance to a first surface of a semiconductor body including silicon carbide. The current spread region is between the first surface and the drift layer. A body region with a longitudinal axis parallel to a first horizontal direction is between the current spread region and a source region along a second horizontal direction orthogonal to the first horizontal direction. Trench gate structures extend into the body region. A source contact structure extends into the semiconductor body and adjoins the source region.

The present disclosure further relates to a method of manufacturing semiconductor devices. Dopants are introduced selectively through first segments of first mask openings in a first dopant mask to form source regions of a first conductivity type in a semiconductor substrate including silicon carbide, wherein a longitudinal axis of the first mask openings extends into a first horizontal direction. Dopants are introduced selectively through second segments of the first mask openings to form pinning regions of a complementary second conductivity type, wherein the first and second segments alternate along the first horizontal direction. Dopants are introduced selectively through second mask openings in a second dopant mask to form body regions of the second conductivity type, wherein a width of the second mask openings along a second horizontal direction orthogonal to the first horizontal direction is greater than a width of the first mask openings. Forming the first dopant mask includes modifying the second dopant mask or forming the second dopant mask includes modifying the first dopant mask.

Further embodiments are described in the dependent claims. Those skilled in the art will recognize additional features and advantages upon reading the following detailed description and on viewing the accompanying drawings.

BRIEF DESCRIPTION OF THE DRAWINGS

The accompanying drawings are included to provide a further understanding of the present embodiments and are incorporated in and constitute a part of this specification. The drawings illustrate the present embodiments and together with the description serve to explain principles of the embodiments. Further embodiments and intended advantages will be readily appreciated as they become better understood by reference to the following detailed description.

FIG. 10C is a schematic vertical cross-sectional view of the semiconductor device portion of FIG. 10A along line C-C between neighboring trench gate structures.

FIG. 10D is a schematic vertical cross-sectional view of the semiconductor device portion of FIG. 10A along line D-D orthogonal to horizontal longitudinal axes of the trench gate structures.

FIG. 21A is a schematic plan view of the semiconductor substrate portion of FIG. 20A, after forming body implant zones below the second mask openings.

FIG. 21B is a schematic vertical cross-sectional view of the semiconductor substrate portion of FIG. 21A along line B-B.

FIG. 21C is a schematic vertical cross-sectional view of the semiconductor substrate portion of FIG. 21A along line C-C.

DETAILED DESCRIPTION

In the following detailed description, reference is made to the accompanying drawings, which form a part hereof and in which are shown by way of illustrations of specific embodiments in which the embodiments may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or heavily doped semiconductor material. The term "electrically coupled" includes that one or more intervening element(s) adapted for signal transmission may be between the electrically coupled elements, for example, elements that are controllable to temporarily provide a low-resistive connection in a first state and a high-resistive electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
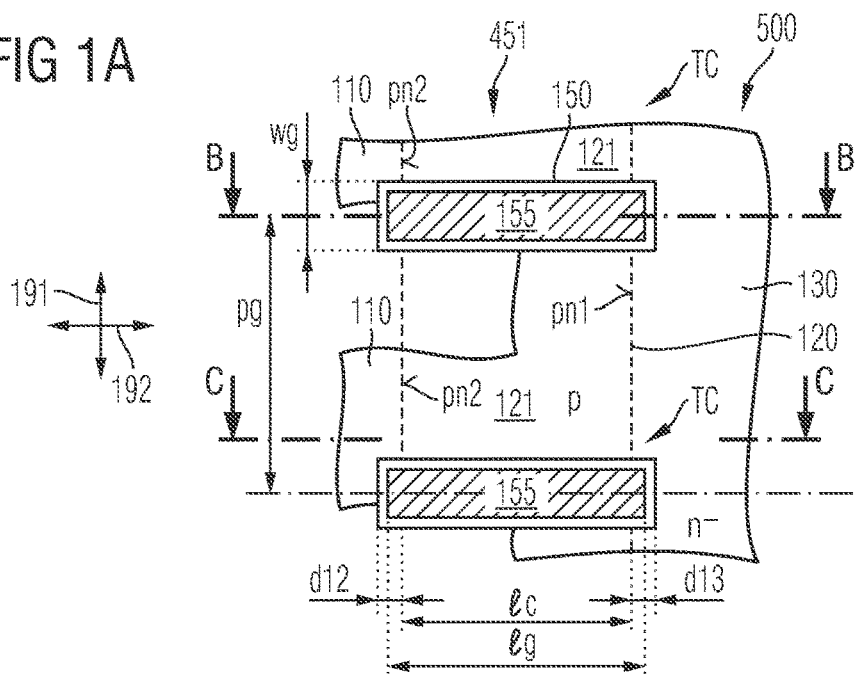
FIG. 1A is a schematic horizontal cross-sectional view of a portion of an SiC semiconductor device with trench gate structures, lateral channel, and a channel length shorter than a longitudinal extension of the trench gate structures parallel to the channel direction according to an embodiment.
Figure 1B:
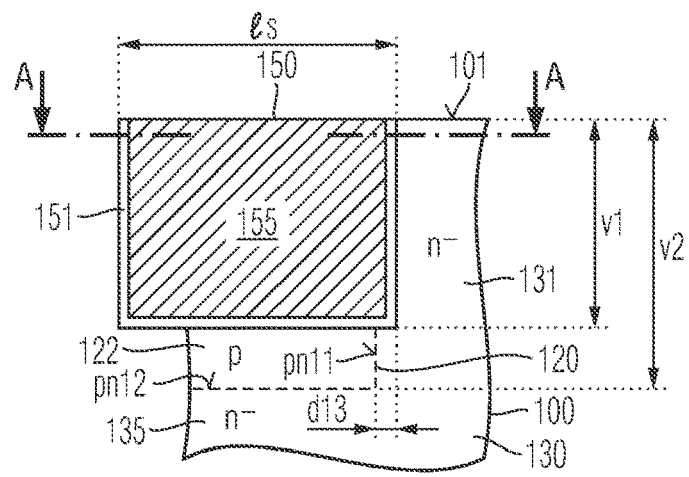
FIG. 1B is a vertical cross-sectional view of the SiC semiconductor device portion of FIG. 1A along line B-B and a horizontal longitudinal axis of a trench gate structure.
Figure 1C:
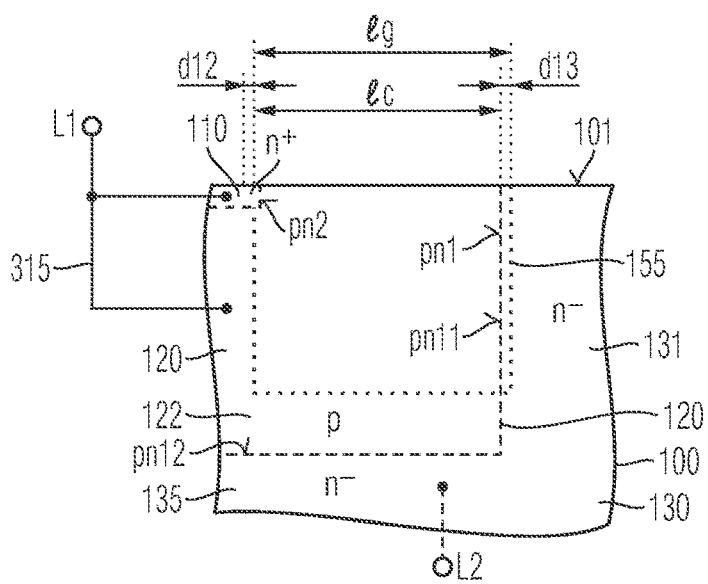
FIG. 1C is a vertical cross-sectional view of the SiC semiconductor device portion of FIG. 1A along line C-C parallel to the trench gate structure.
Figure 2A:
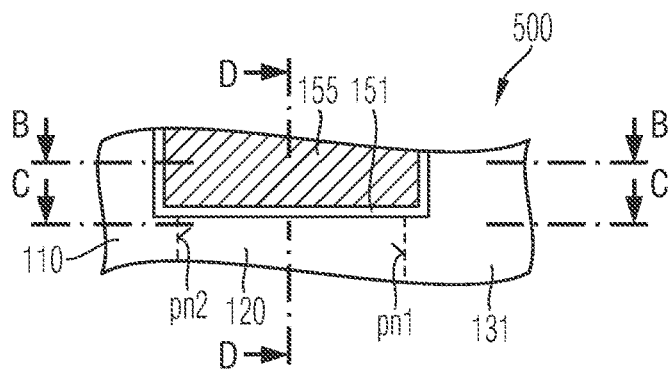
FIG. 2A is a schematic horizontal cross-sectional view of a portion of a semiconductor device with trench gate structures and lateral channel according to an embodiment related to a pinning region.
Figure 2B:
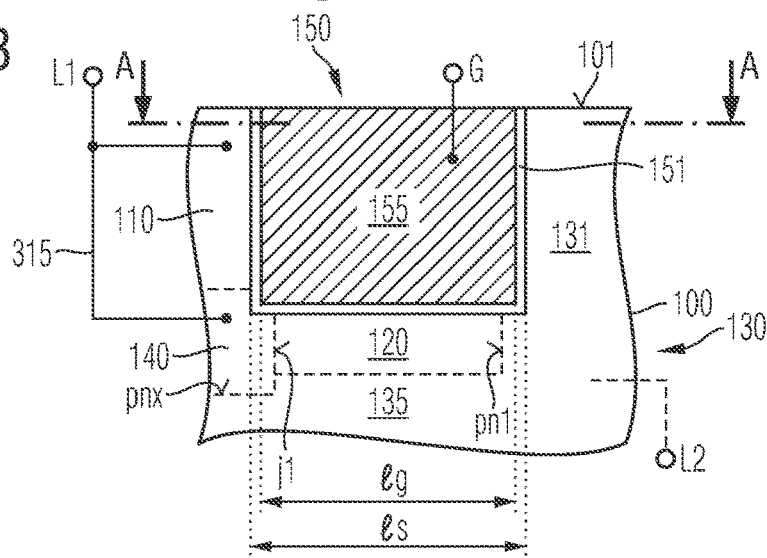
FIG. 2B is a vertical cross-sectional view of the semiconductor device portion of FIG. 2A along line B-B and a horizontal longitudinal axis of the trench gate structure.
Figure 2C:
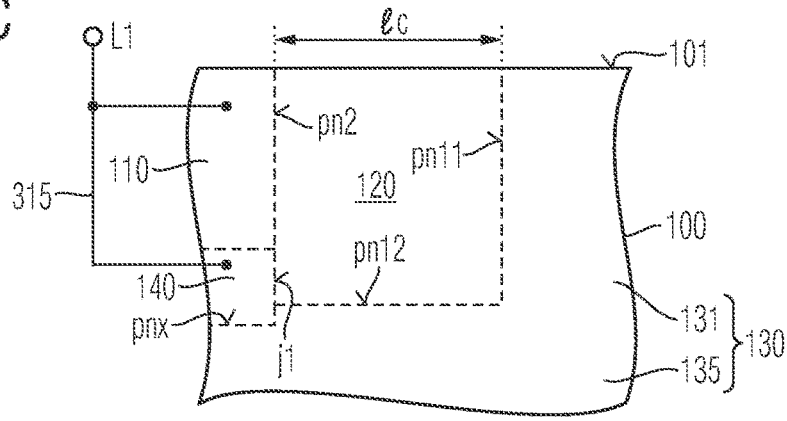
FIG. 2C is a vertical cross-sectional view of the semiconductor device portion of FIG. 2A along line C-C parallel to the trench gate structure.
Figure 2D:
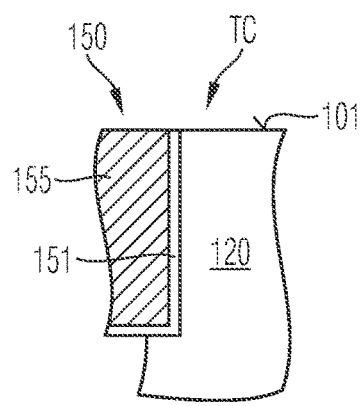
FIG. 2D is a vertical cross-sectional view of the semiconductor device portion of FIG. 2A along line D-D orthogonal to the horizontal longitudinal axis of the trench gate structure.

FIGS. 1A to 1C show a semiconductor device 500 including transistor cells TC. The semiconductor device 500 may be or may include an IGFET (insulated gate field effect transistor), for example, an MOSFET (metal oxide semiconductor FET) in the usual meaning including FETs with metal gates as well as FETs with gates from a semiconductor material, an IGBT (insulated gate bipolar transistor) or an MCD (MOS controlled diode), by way of example.

The transistor cells TC are formed along a first surface 101 at a front side of a semiconductor body 100 based on silicon carbide (SiC). A direction orthogonal to the first surface 101 defines a vertical direction. Directions parallel to the first surface 101 are horizontal directions and are also referred to as lateral directions in the following.

The semiconductor body 100 includes a drift structure 130, which is formed between the transistor cells TC and a second surface at a rear side of the semiconductor body 100, wherein the second surface is parallel to the first surface 101. The drift structure 130 may include a heavily doped base portion, which directly adjoins the second surface, as well as a lightly doped drift zone 135 between the transistor cells TC and the heavily doped base portion.

The drift structure 130 may further include a current spread region 131 of the same conductivity type as the drift zone 135, wherein the current spread region 131 is between the first surface 101 and the drift zone 135. The current spread region 131 may directly adjoin the first surface 101 and may also directly adjoin the drift zone 135. A mean net dopant concentration in the current spread region 131 may be greater than a mean net dopant concentration in the drift zone 135. According to an embodiment, the drift zone 135 and at least a portion of the current spread region 131 result from an epitaxy process.

Body regions 120 with longitudinal axes parallel to a first horizontal direction 191 are formed between the first surface 101 and the drift zone 135. A conductivity type of the body regions 120 is opposite to the conductivity type of the drift zone 135 and the body regions 120 form first pn junctions pn1 with the drift zone 135, wherein first sections pn11 of the first pn junctions pn1 between the body regions 120 and the current spread regions 131 are tilted to the first surface 101, e.g., vertical to the first surface 101 and second sections pn12 of the first pn junctions pn1 are parallel to the first horizontal direction 191.

A plurality of trench gate structures 150, which may have the same dimensions and the same material configuration, extend from the first surface 101 into the semiconductor body 100, wherein the trench gate structures 150 intersect the body region 120. The trench gate structures 150 may be arranged in gate rows 451, wherein each gate row includes a plurality of separated trench gate structures 150 arranged in a straight line that extends along the first horizontal direction 191. Horizontal longitudinal axes of the trench gate structures 150 run parallel to a second horizontal direction 192 orthogonal to the first horizontal direction 191.

Channel portions 121 of the body regions 120 extend between neighboring trench gate structures 150 of the same gate row 451. Each channel portion 121 directly adjoins at least a first sidewall of one of the neighboring trench gate structures 150 and may directly adjoin a second sidewall of a second one of the neighboring trench gate structures 150, wherein at least the first sidewall may be parallel to a main crystal plane.

A gate structure width wg of the trench gate structures 150 along the first horizontal direction 191 may be at most equal to a gate structure length ls of the gate structures 150 along the second horizontal direction 192, for example at most ls/2. A center-to-center distance pg between neighboring trench gate structures 150 of the same gate row 451 may be in a range from 500 nm to 5 µm, for example, from 1 µm to 5 µm. The gate structure length ls may be in a range from 500 nm to 10 µm, for example, in a range from 1 µm to 5 µm.

The trench gate structures 150 include a gate electrode 155 and a gate dielectric 151 that dielectrically insulates the gate electrode 155 from at least active portions of the body regions 120. According to an embodiment, the gate dielectric 151 may completely insulate the gate electrode 155 from the semiconductor body 100. According to other embodiments, the trench gate structure 150 may include one or more separation dielectrics with a layer configuration and/or layer thickness different from the gate dielectric 151, wherein the one or more separation dielectrics may insulate the gate electrode 155 from at least one of the source region 110, the current spread region 131, and an inactive portion of the body regions 120, e.g., at the bottom of the trench gate structure 150 or along an inactive sidewall. The gate electrode 155 may be electrically connected to a gate terminal G.

The gate electrode 155 includes at least one conductive material, e.g., a metal, a metal compound and/or doped polycrystalline silicon. The gate dielectric 151 may include at least one dielectric material, e.g., a silicon oxide, silicon nitride, siliconoxinitride and/or a high-k material with a relative permittivity greater 3.9. High-k materials show reduced electrical field stress and may relax requirements for structures aiming at locally reducing an electric field across the gate dielectric 151.

A vertical extension v2 of the body regions 120 is greater than a vertical extension v1 of the trench gate structures 150 such that bottom portions 122 of the body regions 120 are formed between the trench gate structures 150 and the second surface 102. The vertical extension v1 of the trench gate structures 150 defines a channel width that can be increased without increasing the horizontal foot print.

The body regions 120 laterally separate the current spread regions 131 from source regions 110, wherein the source regions 110 have the conductivity type of the current spread regions 131. The source regions 110 may extend from the first surface 101 into the semiconductor body 100. The source regions 110 are in low-resistive contact with a source contact structure 315, which is electrically connected to the body regions 120 and to a first load terminal L1.

The first load terminal L1 may be the anode terminal of an MCD, the source terminal of an IGFET or the emitter terminal of an IGBT. The drift structure 130 is electrically connected or coupled to a second load terminal L2, which may be the cathode terminal of an MCD, the drain terminal of an IGFET or the collector terminal of an IGBT.

The body regions 120 form first pn junctions pn1 with the drift structure 130 and second pn junctions pn2 with the source regions 110. The first pn junctions pn1 include first sections pn11 that are tilted to the first surface 101 by a tilt angle of about 90° and that are parallel to the first horizontal direction 191. For example, the first sections p11 of the first pn junctions pn1 adjoin the current spread regions 131 and run vertical or almost vertical to the first surface 101. The first pn junctions pn1 may also include horizontal second sections p12 between the body regions 120 and the drift zone 135, wherein the second sections pn12 may run parallel to the first surface 101. A distance between the first sections pn11 of the first pn junctions pn1 and the second pn junctions pn2 defines the channel length lc of the transistor cell TC and is smaller than the gate structure length ls, wherein the trench gate structures 150 laterally protrude into at least one of the current spread region 131 and the source regions 110. For example, the channel length lc is smaller than a gate length lg of the gate electrode 155 along the second horizontal direction 192, wherein the gate electrode 155 laterally overlaps with at least one of the current spread region 131 and the source regions 110.

A first lateral overlap d13 between the trench gate structure 150 and the drift structure 130 may be at least 10 nm, for example at least 50 nm. A second lateral overlap d12 between the trench gate structure 150 and the source regions 110 may be at least 10 nm, for example at least 50 nm.

According to an embodiment at least one of the first and second lateral overlaps d13, d12 is greater than a thickness of the gate dielectric 151 such that the gate electrode 155 laterally overlaps with at least one of the drift structure 130 and the source regions 110.

A sufficient first overlap d13 and a sufficient second overlap d12 ensure a reliable and robust low ohmic connection of sidewall channels, which are inversion channels formed in lateral sidewall regions of the body regions 120 along the trench gate structures 150.

An aspect ratio between the vertical extension v1 of the trench gate structures 150 and the gate width wg of the trench gate structures 150 along the first horizontal direction 191 is greater than 1, for example, greater than 2 or greater than 5 to achieve a high area efficiency, i.e. a large channel width per horizontal area.

The embodiment of FIGS. 2A to 2D relates to the pinning of the avalanche breakdown at the source side of trench gate structures 150 that overlap with at least one of the source regions 110 and the current spread regions 131 such that a channel length lc between the first sections pn11 of the first pn junctions pn1 and the second pn junctions pn2 is smaller than a gate structure length ls along the second horizontal direction 192. According to the illustrated embodiment the channel length lc is smaller than a gate length lg of the gate electrode 155 along the second horizontal direction 192.

For example, a pinning region 140 of the conductivity type of the body regions 120 may form an auxiliary pn junction pnx with the drift zone 135. The pinning region 140 is electrically connected to the source contact structure 315 through a direct, low-resistive path and pins a voltage breakdown between the drift structure 130 and the source contact structure 315 at the auxiliary pn junction pnx and at a side of the transistor cells TC oriented to the source region 110. The auxiliary pn junction pnx may be directly below the source contact structure 315, i.e., may partly or completely laterally overlap with a vertical projection of the source contact structure 315.

According to an embodiment, the pinning region 140 may contain a higher mean net dopant concentration than the body regions 120. For example, a mean net dopant concentration in the pinning region 140 may be at least 120% or at least 200% of the mean net dopant concentration in the body regions 120. According to an embodiment, the mean net dopant concentration in the pinning region 140 is at least twice, ten times or fifty times the mean net dopant concentration in the body regions 120.

Alternatively or in addition, a distance between the pinning region 140 and a second surface on the back of the semiconductor body 100 may be smaller than a distance between the body regions 120 and the second surface. In addition or in the alternative, a dopant concentration in a portion of the drift zone 135, which forms the auxiliary pn junction pnx, may be locally increased along the auxiliary pn junction pnx.

The pinning region 140 is in low-resistive contact with the source contact structure 315. For example, the source contact structure 315 may include a metal portion and the pinning region 140 directly adjoins the metal portion and forms an ohmic contact with the metal portion.

The pinning region 140 may be part of a structure vertically separating the source region 110 from the drift zone 135, wherein the pinning region 140 may form a n/n+ or p/p+ junction j1 with the adjoining body region 120.

The pinning region 140 may be directly connected to the source contact structure 315 along a shortest line connecting the auxiliary pn junction pnx with the source contact structure 315, wherein the shortest line may be mainly or exclusively vertical with respect to the first surface 101. In the avalanche case a voltage drop between the auxiliary pn junction pnx and the source contact structure 315 remains sufficiently low to prevent a parasitic bipolar junction transistor structure formed by the source region 110, the body region 120 and the drift zone 135 from turning on, wherein a possible turn on of the parasitic bipolar junction transistor structure could increase leakage current and/or could adversely affect avalanche ruggedness.

The transistor cells TC may be n-channel transistor cells of the enhancement type with p-doped body region 120, n-doped source region 110 and n-doped drift zone 135 or may be p-channel transistor cells of the enhancement type with n-doped body region 120, p-doped source region 110 and p-doped drift zone 135. The following description refers to semiconductor devices 500 with n-channel transistor cells TC. Similar considerations apply to semiconductor devices with p-channel transistor cells TC.

A voltage at the gate terminal G above a threshold voltage turns the transistor cells TC on. By field effect accumulated minority charge carriers form inversion channels in the body regions 120 along the gate dielectric 151. The inversion channels connect the source regions 110 with the drift structure 130 such that a load current flows between the first and the second load terminals L1, L2 through the body regions 120.

When a voltage at the gate terminal G falls below the threshold voltage, the transistor cells TC turn off. In the off-state the first pn junction pn1 remains reverse biased and the vertical extension of the drift zone 135 as well as the dopant concentration in the drift zone 135 between the first pn junction pn1 and the heavily doped base portion determines the voltage blocking capability of the semiconductor device 500.

A bottom portion of the body regions 120 between the lower edge of the trench gate structure 150 and the drift zone 135 shields the gate dielectric 151 against the potential applied to the second load electrode L2. On the other hand an avalanche breakdown occurring at the bottom portion of the body region 120 may result in turning on the parasitic bipolar transistor structure.

The pinning region 140 clamps the avalanche breakdown at the auxiliary pn junction pnx that has a direct, low-resistive connection to the source contact structure 315 such that the pinning region 140 drains off the avalanche current to the source contact structure 315 and the first load terminal L1 along a low-resistive path.

In comparative devices without pinning region 140 the avalanche current may flow along a comparatively long path, partly through the comparatively low-doped body region 120, and may generate a sufficiently high voltage drop to turn on the intrinsic parasitic bipolar npn transistor formed by the source region 110, the body region 120 and the current spread region 131. Turning on the parasitic bipolar npn transistor increases a leakage current and may be destructive.

By contrast, the semiconductor device 500 of FIGS. 2A to 2D directly drains off the avalanche current along a short and low-resistive path to the source contact structure 315. Even a high avalanche current generates only a low voltage drop such that the pinning region 140 significantly improves avalanche ruggedness of the semiconductor device 500.

Figure 3A:
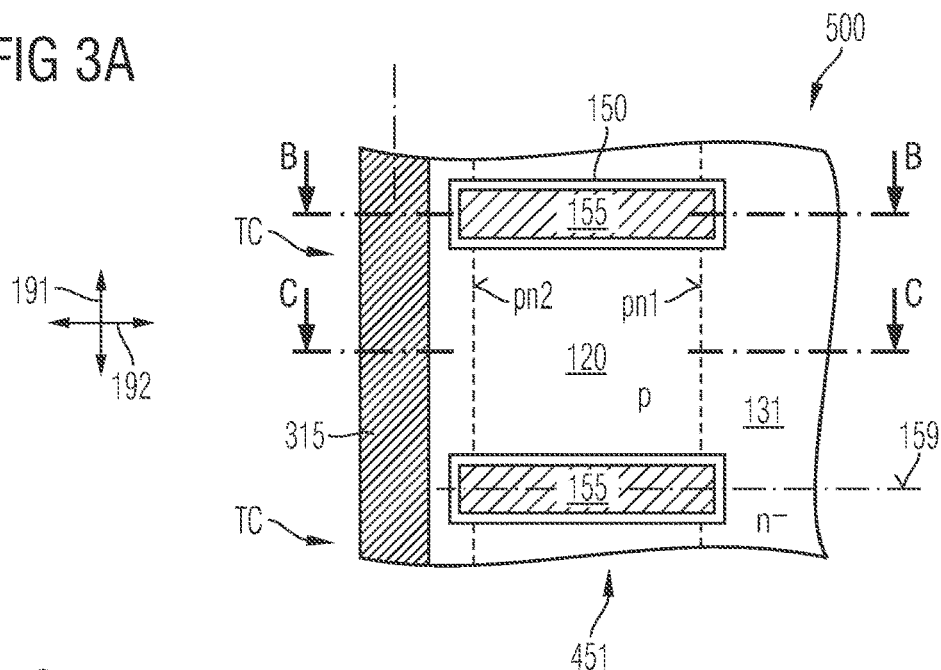
FIG. 3A is a schematic horizontal cross-sectional view of a portion of a semiconductor device with trench gate structure and lateral channel according to an embodiment combining a shallow source region with a planar source contact structure.
Figure 3B:
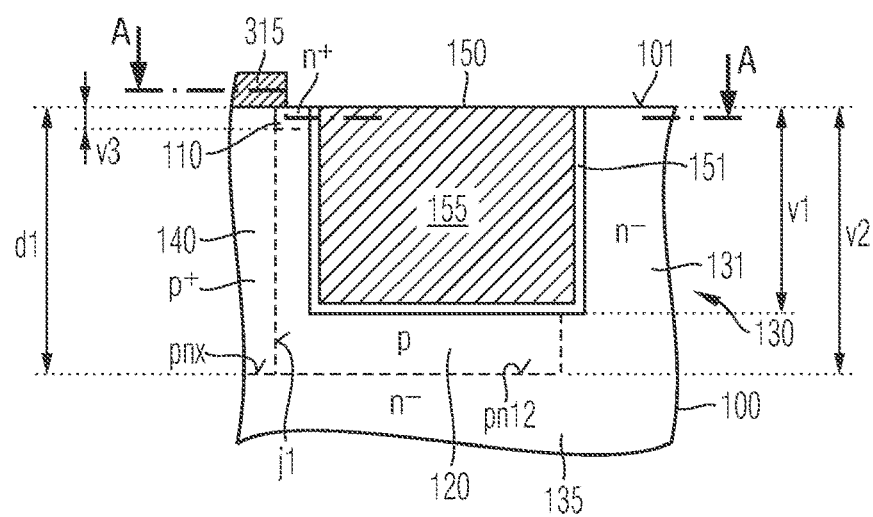
FIG. 3B is a schematic vertical cross-sectional view of the semiconductor device portion of FIG. 3A along line B-B and along a horizontal longitudinal axis of a trench gate structure.
Figure 3C:
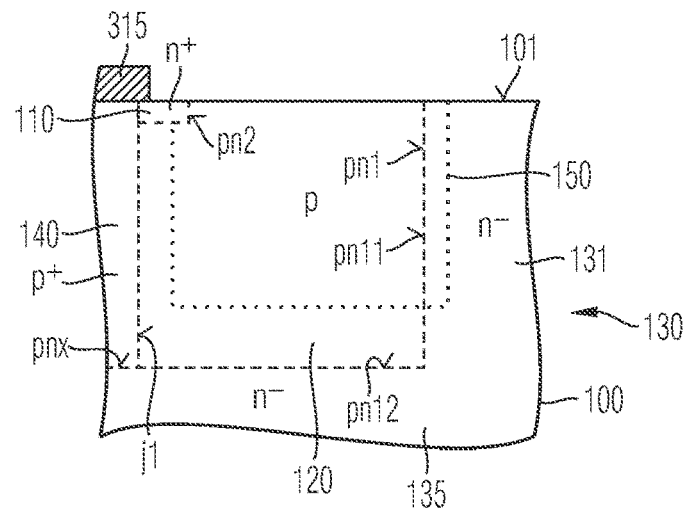
FIG. 3C is a schematic vertical cross-sectional view of the semiconductor device portion of FIG. 3A along line C-C and parallel to the trench gate structure.

The semiconductor device 500 of FIGS. 3A to 3C includes a planar source contact structure 315 formed on the first surface 101 of the semiconductor body 100.

FIG. 3A shows a plurality of trench gate structures 150, which may have the same dimensions and the same material configuration. The trench gate structures 150 may be regularly spaced from one another and may be arranged in gate rows 451, wherein the gate rows 451 extend along a first horizontal direction 191. Horizontal longitudinal axes of the trench gate structures 150 run parallel to a second horizontal direction 192 orthogonal to the first horizontal direction 191.

Transistor cells TC of the same gate row 451 may share a common stripe-shaped current spread region 131 with a longitudinal axis parallel to the first horizontal direction 191. Similarly, the transistor cells TC assigned to the same gate row 451 may share a common stripe-shaped source contact structure 315 with a longitudinal horizontal axis parallel to the first horizontal direction 191.

The source regions 110 may be shallow doped regions between the first surface 101 and the adjoining body region 120, wherein a vertical extension v3 of the source regions 110 is at most 10% or at most 20% of a vertical extension v1 of the trench gate structures 150.

The source regions 110 of neighboring transistor cells TC may directly adjoin to each other to form continuous source stripes along each gate row 451. According to other embodiments, a plurality of separated source regions 110 each assigned to only one of the trench gate structures 150 may be formed along the first horizontal direction 191.

A vertical extension v2 of the body regions 120 is greater than a vertical extension v1 of the trench gate structures 150 such that bottom portions of the body regions 120 shield the gate dielectric 151 against the potential of the drift structure 130.

A pinning region 140 forms an auxiliary pn junction pnx with the drift zone 135. A planar source contact structure 315 is formed in a vertical projection of the auxiliary pn junction pnx.

The pinning region 140 may form a vertical column that laterally directly adjoins the body regions 120, wherein the body regions 120 and the pinning regions 140 form vertical p/p$^+$junctions j1. The pinning regions 140 may be laterally spaced from the trench gate structures 150.

The pinning region 140 may contain a higher net dopant concentration than the body regions 120 to ensure that an avalanche breakdown is pinned at the auxiliary pn junction pnx. A distance d1 between the first surface 101 and the auxiliary pn junction j1 may be equal to or greater than the vertical extension v2 of the body regions 120. A direct connection line between the source contact structure 315 and the auxiliary pn junction pnx is vertical. The pinning region 140 forms also a low-resistive connection between the adjoining body region 120 and the source contact structure 315 in a vertical projection of the auxiliary pn junction pnx.

Figure 4A:
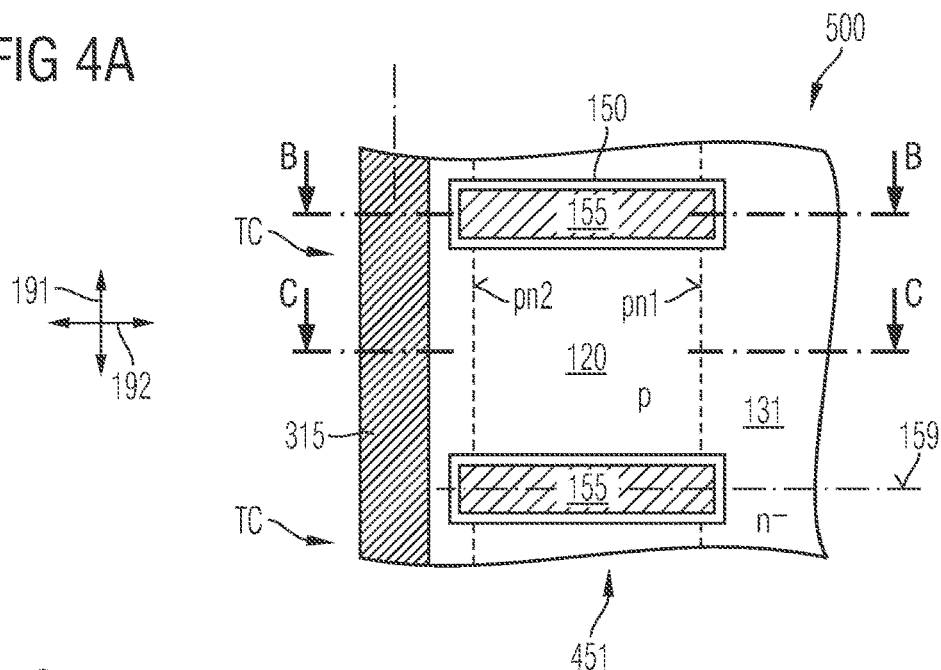
FIG. 4A is a schematic horizontal cross-sectional view of a portion of a SiC semiconductor device with trench gate structure and lateral channel according to an embodiment combining a deep source region with a planar source contact structure.
Figure 4B:
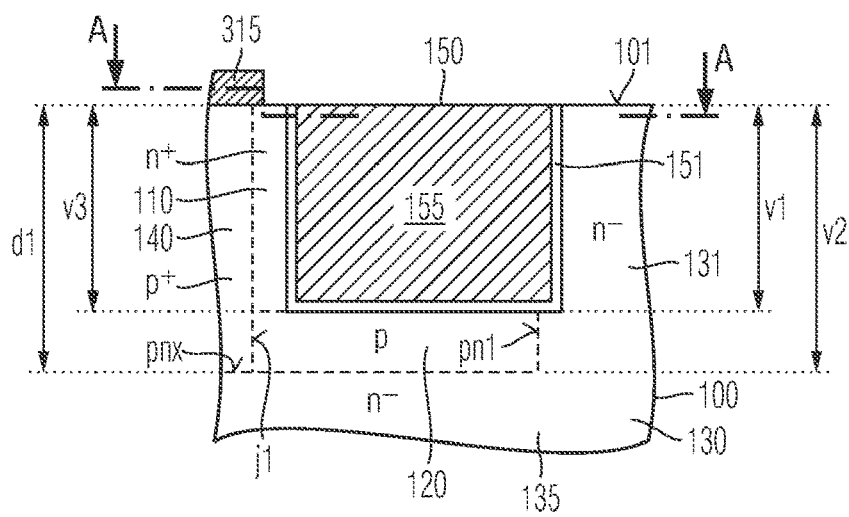
FIG. 4B is a schematic vertical cross-sectional view of the semiconductor device portion of FIG. 4A along line B-B and along a horizontal longitudinal axis of a trench gate structure.
Figure 4C:
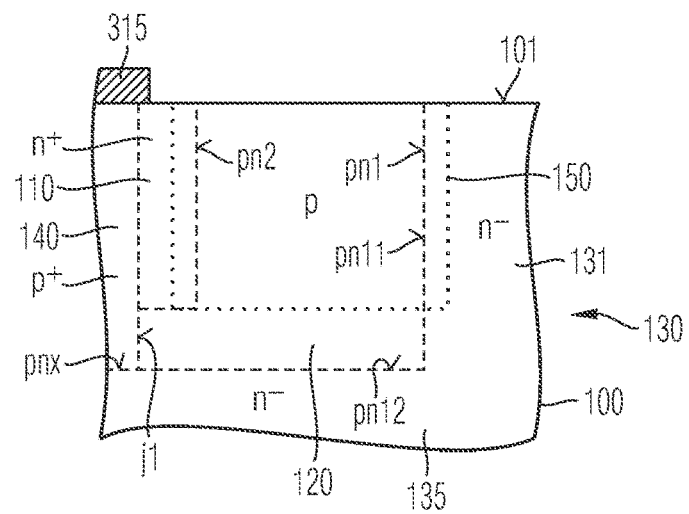
FIG. 4C is a schematic vertical cross-sectional view of the semiconductor device portion of FIG. 4A along line C-C and parallel to the trench gate structure.

FIGS. 4A to 4C combine planar source contact structures 315 with deep source regions 110, wherein a vertical extension v3 of the source regions 110 may be approximately the same as or less than a vertical extension v1 of the trench gate structures 150. The deep source regions 110 enlarge a connection area of the inversion channels with the source regions 110. The deep source regions 110 may be combined with a channel blocking structure that blocks a current flow in bottom channels along a bottom surface of the trench gate structures 150, wherein the channel blocking structure may include, for example, a thick bottom dielectric or a heavily doped portion of the body regions 120 below the trench gate structures 150.

Figure 5A:
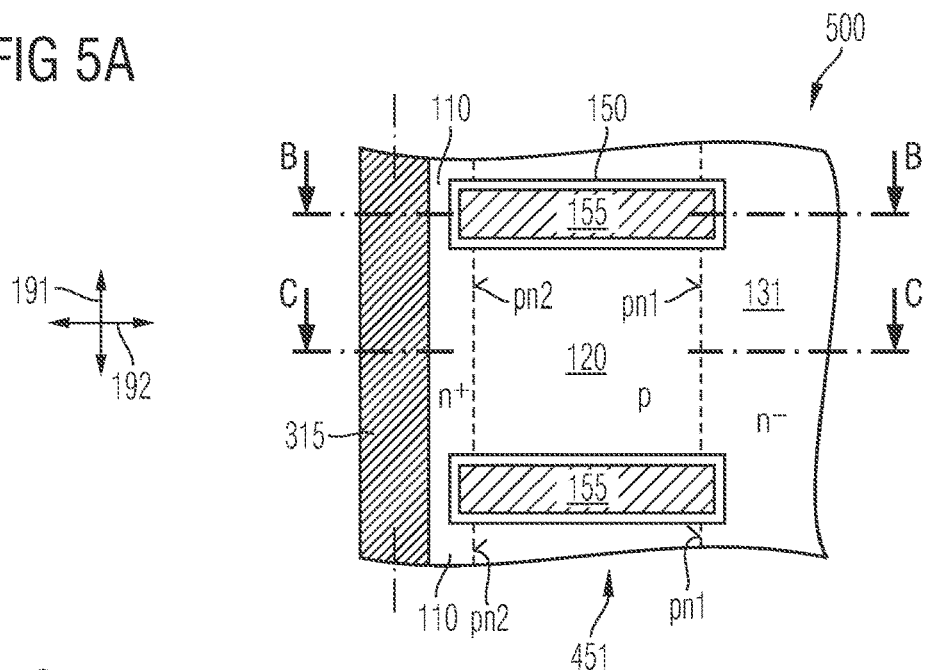
FIG. 5A is a schematic horizontal cross-sectional view of a portion of a semiconductor device with trench gate structure and lateral channel according to an embodiment combining a deep pinning region with a source contact structure extending into the semiconductor body.
Figure 5B:
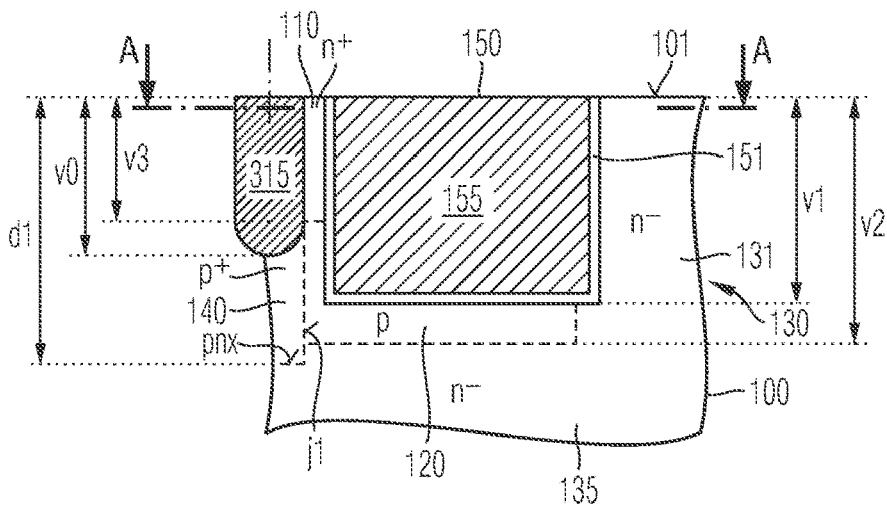
FIG. 5B is a schematic vertical cross-sectional view of the semiconductor device portion of FIG. 5A along line B-B and a horizontal longitudinal axis of a trench gate structure.
Figure 5C:
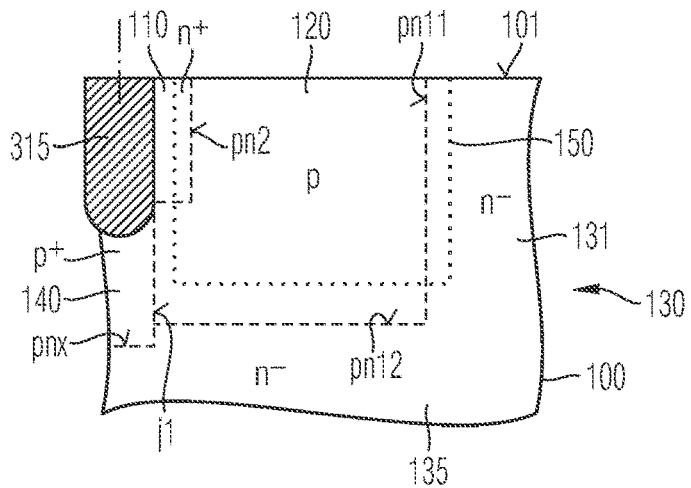
FIG. 5C is a schematic vertical cross-sectional view of the semiconductor device portion of FIG. 5A along line C-C and parallel to the trench gate structure.

In FIGS. 5A to 5C formation of at least one of the pinning regions 140 and the source regions 110 may include a doping, e.g., an implant through a source contact trench temporarily extending into the semiconductor body 100 and later filled with conductive material to form a source contact structure 315 extending into the semiconductor body 100. A vertical extension v0 of the source contact structure 315 and a vertical extension v3 of the source region 110 may be at least 50% but less than 90% of a vertical extension v1 of the trench gate structure 150 to suppress formation of the bottom channels. A distance d1 between the first surface 101 and the auxiliary pn junction pnx may be greater than the vertical extension v2 of the body regions 120.

The source contact structure 315 in combination with the deep source region 110 may increase an effective channel width.

With a vertical extension v3 of the source region 110 less than 90% of the vertical extension v1 of the trench gate structure 150 no bottom channels are formed along the bottom surface of the trench gate structures 150 even in the absence of a heavily doped bottom portion of the body regions 120 below the trench gate structures 150 and in the absence of a thick bottom dielectric.

Figure 6A:
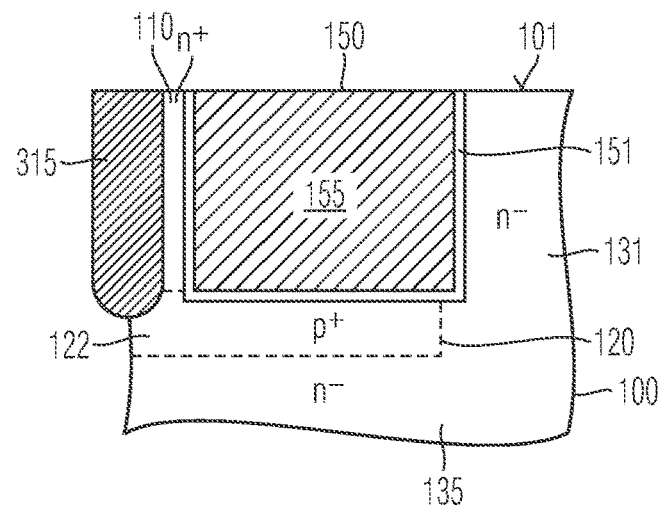
FIG. 6A is a schematic vertical cross-sectional view of a portion of a semiconductor device with trench gate structures, lateral channel and disabled bottom channel according to an embodiment with increased dopant concentration in a bottom portion of the body regions.
Figure 6B:
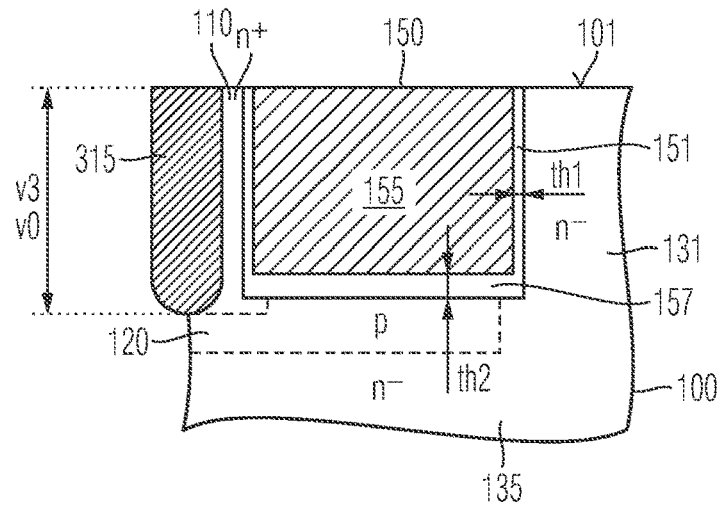
FIG. 6B is a schematic vertical cross-sectional view of a portion of a semiconductor device with trench gate structures, lateral channel and disabled bottom channel according to an embodiment with a thick bottom dielectric.

FIGS. 6A to 6B refer to semiconductor devices 500 with deep source contact structures 315, deep source regions 110 with a vertical extension v3 in the range of the vertical extension v1 of the trench gate structures 150 and disabled bottom channels.

In FIG. 6A the body region 120 includes a heavily doped bottom portion 122 extending along a bottom of the trench gate structures 150. The dopant concentration in the bottom portion 122 is selected such that at least for gate voltages within the nominal operating range of the semiconductor device 500 no inversion channel forms along the bottom surface of the trench gate structures 150. For example, a mean dopant concentration in the bottom portion 122 of the body regions 120 is at least twice as high as in a channel portion of the body region 120 between neighboring trench gate structures 150. Since the bottom channels form in another crystal plane than the sidewall channels, the bottom channels show other charge carrier mobility and/or interface state density such that bottom channels and sidewall channels have different characteristics, e.g., different gate threshold voltages. Suppressing the bottom channels result in more uniform device characteristics and a steeper output/input characteristic.

In FIG. 6B the trench gate structures 150 include a bottom dielectric 157 which is thicker than the gate dielectric 151. A thickness th2 of the bottom dielectric 157 is selected such that for gate voltages within the nominal maximum ratings of the semiconductor device 500, no inversion channel is formed along the bottom surface of the trench gate structures 150. For example, a thickness th2 of the bottom dielectric 157 is at least twice the thickness th1 of the gate dielectric 151.

Figure 6C:
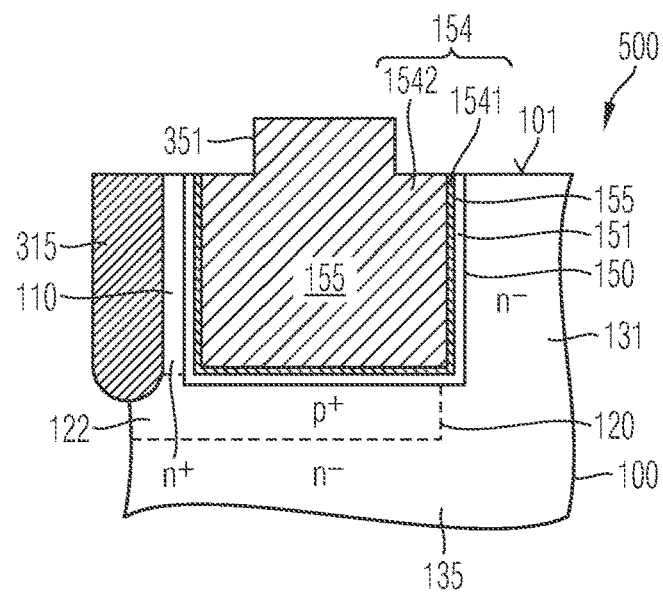
FIGS. 6C-6E are schematic vertical cross-sectional views of trench gate structures and gate connection lines including a metal portion.
Figure 6D:
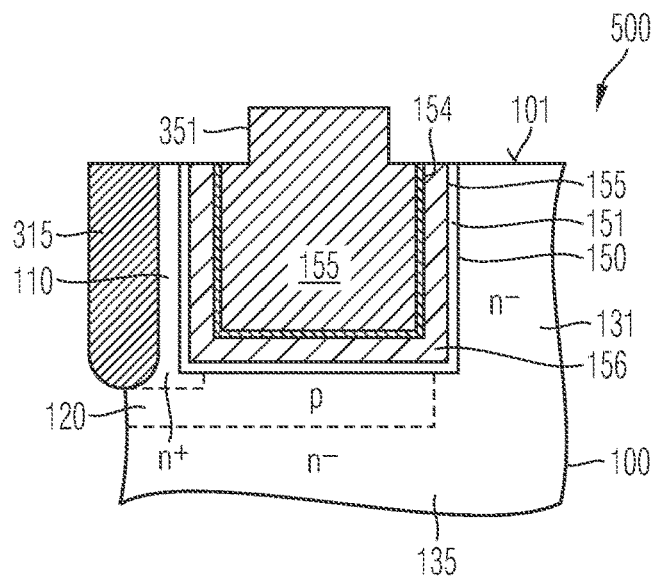
Figure 6E:
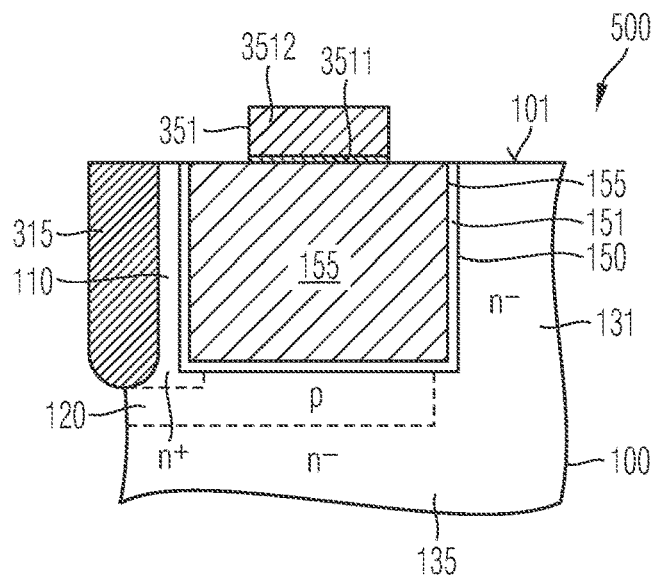

FIGS. 6C to 6E refer to semiconductor devices 500 with conductive gate electrodes 155 and a gate connection line 351. The gate connection line 351 may be formed above a plane spanned by the first surface 101. Each gate connection line 351 may connect portions of the gate electrode 155 in trench gate structures 150 that are formed along the first horizontal direction 191 as indicated in FIG. 1A.

The gate connection line 351 may be formed from the same material(s) and may have the same material configuration as the gate electrode 155 in the trench gate structures 150. Alternatively, the gate connection line 351 may include other materials as the gate electrode 155. For example, the gate connection line 351 may include doped polycrystalline silicon, a metal, a metal compound, and/or a metal alloy.

FIG. 6C shows a trench gate structure 150 with a gate electrode 155 that includes a metal structure 154. The metal structure 154 may be a structure from a single metal, metal compound or metal alloy or may include at least two portions from different materials. For example, the metal structure 154 may include a first metal portion 1541 and a second metal portion 1542, wherein the first metal portion 1541 may be between the gate dielectric 151 and the second metal portion 1542 and wherein the first metal portion 1541 may be in contact with the gate dielectric 151. For example, the first metal portion 1541 may separate the second metal portion 1542 from the gate dielectric 151. The gate connection line 351 and the second metal portion 1542 may include the same material(s).

Thermal expansion coefficients of the metal portion 154 may deviate from the thermal expansion coefficient of the semiconductor body 100 by at most 20% such that the thermomechanical stress induced by the metal portion 154 does not adversely impact the integrity of the semiconductor body 100 or layers formed above the first surface 101.

The first metal portion 1541 may include a first transition metal, i.e., a chemical element with an atomic number in a range from 21 to 30, from 39 to 48, from 57 to 80 or from 89 to 112. For example, the first metal portion 1541 may include molybdenum, titanium and/or tantalum. In addition to the first transition metal, the first metal portion 1541 may include nitrogen.

The second metal portion 1542 may include a second transition metal. The second metal portion 1542 may differ from the first metal portion 1541 in at least one main constituent. For example, the second transition metal may be tungsten.

Metal may reduce the line resistance of the gate connection line 351. The metal may also improve uniformity of the switching behavior of the semiconductor device 500 along the gate connection line 351 and may contribute to a more uniform distribution of an on-state current across a lateral extension of the semiconductor device 500.

In FIG. 6D the gate electrode 155 includes a metal structure 154 and a semiconductor layer 156, wherein the semiconductor layer 156 is between the metal structure 154 and the gate dielectric 151. The semiconductor layer 156 may include doped, e.g., n doped polycrystalline silicon, by way of example.

The metal structure 154 may have any of the configurations as described with reference to FIG. 6C. For example, a first metal portion 1541 may include a transition metal that may form bonds with the semiconductor layer 156, wherein the bonds connect the metal structure 154 with the semiconductor layer 156. According to an embodiment the first metal portion 1541 includes at least one of Ti, TiN, Mo, MoN and TaN or a metal silicide.

The semiconductor layer 156 may separate the metal structure 154 from the gate dielectric 151 such that a threshold voltage of the semiconductor device 500 can be decoupled from the work function of the metal structure 154. The semiconductor layer 156 may further cover and protect the gate dielectric 151 during forming the metal structure 154 such that formation of the metal structure 154 may include the application of aggressive, e.g. chlorine-based, precursors.

In FIG. 6E the gate connection line 351 may include a first layer portion 3511 and a second layer portion 3512, wherein the first layer portion 3511 may include a first transition metal and the second layer portion 3512 may include the same or another transition metal. The material of the second layer portion 3512 may differ from the material of the first layer portion 3511 in at least one main constituent. For example, the first layer portion 3511 may include at least one of Ti, TiN, Mo, MoN and TaN or a metal silicide and the second layer portion 3512 may include tungsten.

Figure 7:
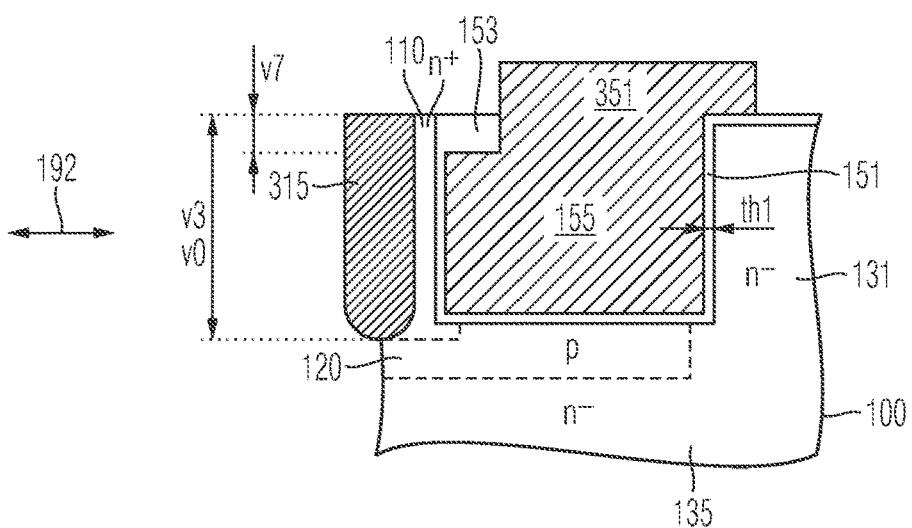
FIG. 7 is a schematic vertical cross-sectional view of a portion of a semiconductor device with trench gate structures, lateral channel and disabled top channel according to an embodiment with the trench gate structures including a dielectric collar.

FIG. 7 refers to embodiments with disabled top channels, which may be formed along the first surface 101 between neighboring trench gate structures 150 below a gate connection line 351 in case a width of the gate connection line 351 parallel to the second horizontal direction 192 is almost the same as the gate length.

The trench gate structure 150 of FIG. 7 shows a dielectric collar 153 at the source side. The dielectric collar 153 extends from a plane coplanar with the first surface 101 into the trench gate structure 150. A vertical extension v7 of the dielectric collar 153 may be at least twice or at least five times the thickness th1 of the gate dielectric 151. An intermediate dielectric, which is thicker than the gate dielectric 151 may be formed on portions of the first surface 101 on top of the body regions 120 such that under operation conditions within the absolute maximum ratings no inversion channel forms along the top surface of the body regions 120.

Figure 8A:
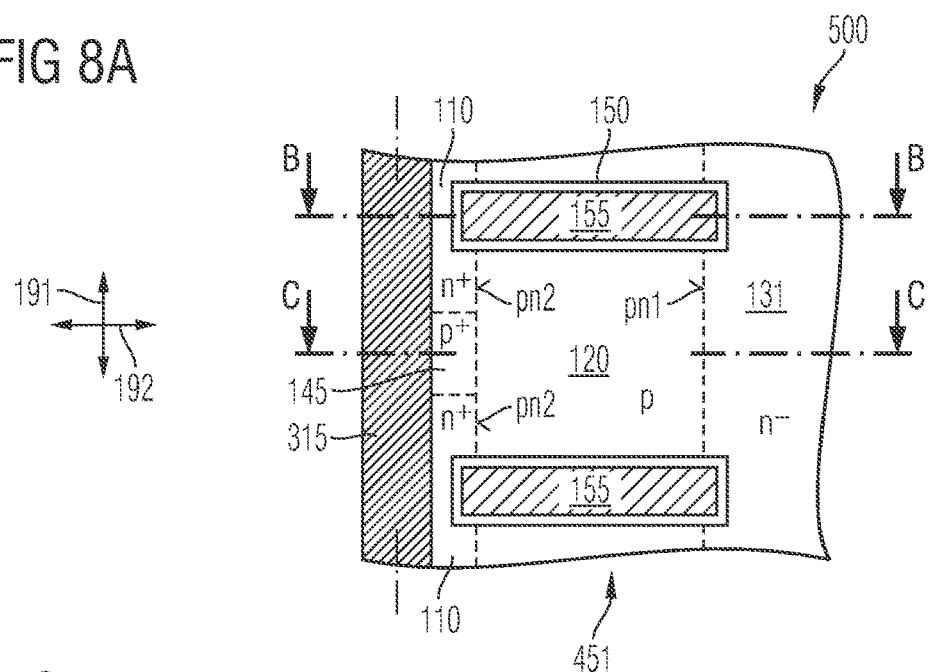
FIG. 8A is a schematic horizontal cross-sectional view of a portion of a semiconductor device with trench gate structure and lateral channel according to an embodiment combining a deep source contact structure with a deep pinning region and lateral body contact zones.
Figure 8B:
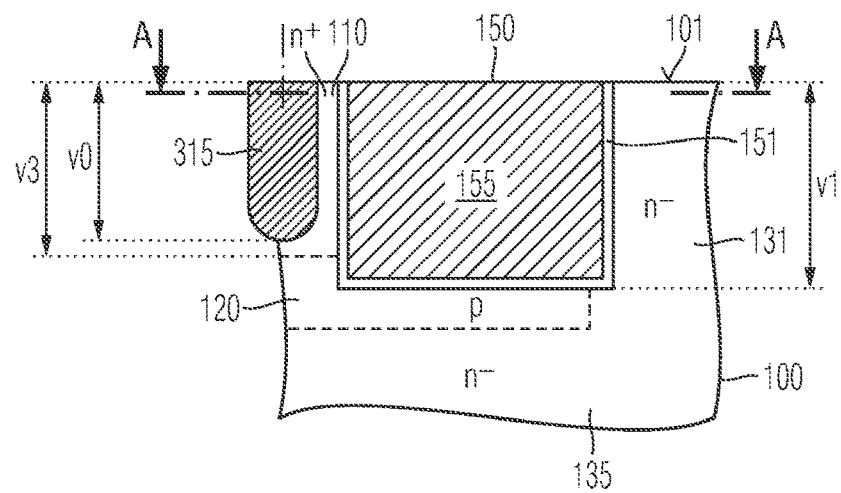
FIG. 8B is a schematic vertical cross-sectional view of the semiconductor device portion of FIG. 8A along line B-B and a horizontal longitudinal axis of a trench gate structure.
Figure 8C:
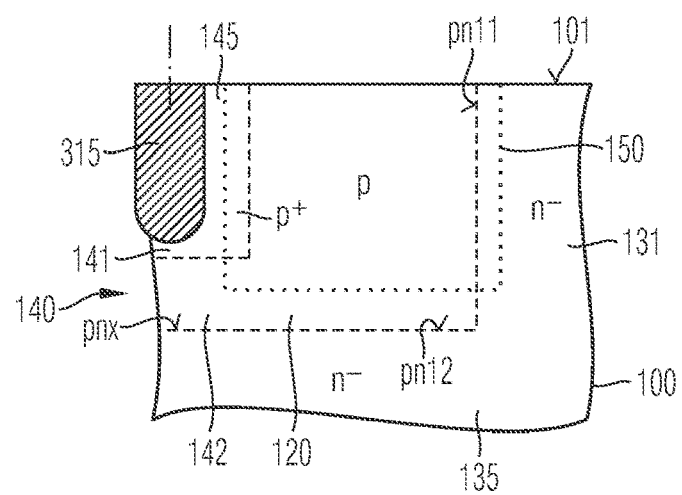
FIG. 8C is a schematic vertical cross-sectional view of the semiconductor device portion of FIG. 8A along line C-C parallel to the trench gate structure.

The semiconductor device 500 of FIGS. 8A to 8C includes a plurality of separated source regions 110 spaced from one another along the first horizontal direction 191, wherein each source region 110 adjoins one of the trench gate structures 150. Heavily doped body contact zones 145 laterally extend from the source contact structure 315 to the body regions 120 along the second horizontal direction 192 and laterally separate neighboring source regions 110 along the first horizontal direction 191.

A main pinning portion 141 directly adjoining the bottom of the source contact structure 315 may have the same mean net dopant concentration and may result from the same doping or epitaxy process as the body contact zones 145. The main pinning portions 141 and the body contact zones 145 form different portions of vertical pinning regions 140.

The main pinning portion 141 may form the auxiliary pn junction pnx. According to the illustrated embodiment the pinning regions 140 further include low-doped portions 142 that may have the same mean net dopant concentration as the body regions 120 and that may result from the same doping or epitaxy process as the body regions 120, wherein the low-doped portions 142 are directly between the main pinning portions 141 and the auxiliary pn junctions pnx. A vertical extension of the low-doped portions 142 and the dopant concentrations in the low-doped portion 142 and the main pinning portions 141 are selected such that the avalanche is pinned directly below the main pinning portions 141.

The pinning region 140 may form a continuous structure extending along the longitudinal extension of the source contact structure 315. According to the illustrated embodiment a plurality of separated pinning regions 140 is connected to each source contact structure 315, wherein an extension of the pinning region 140 along the first horizontal direction 191 corresponds to the extension of the body contact zones 145 along the same direction.

Figure 9A:
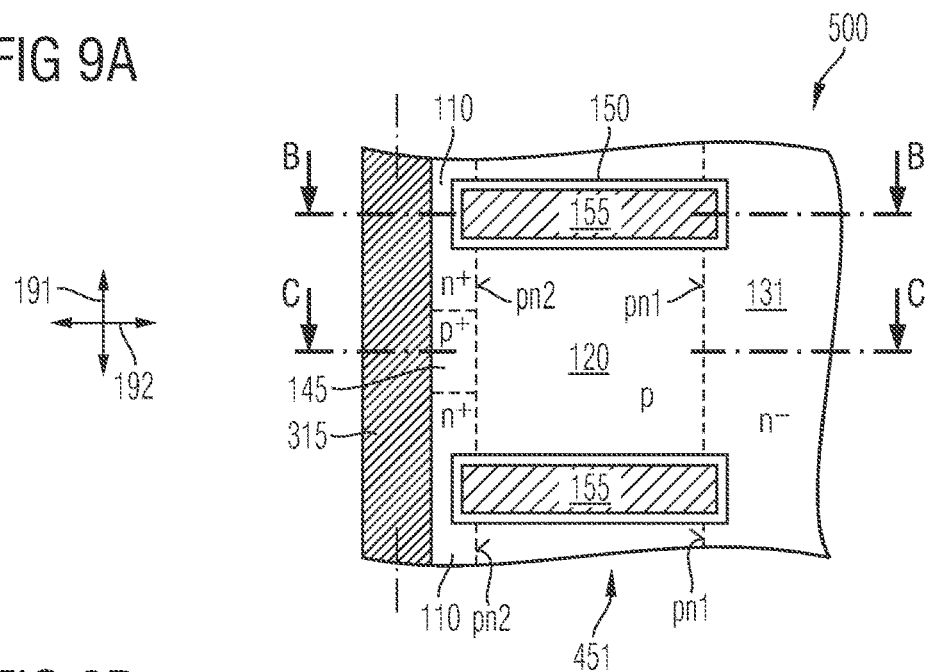
FIG. 9A is a schematic horizontal cross-sectional view of a portion of a semiconductor device with trench gate structure and lateral channel according to a further embodiment combining a deep source contact structure with lateral body contact zones.
Figure 9B:
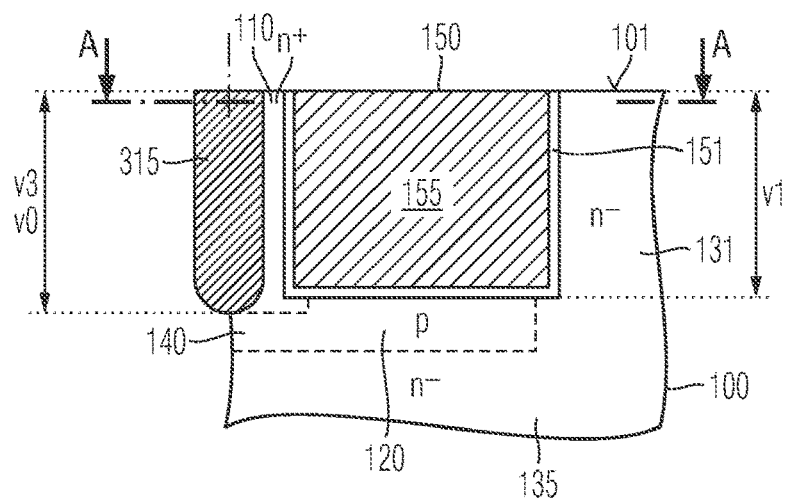
FIG. 9B is a schematic vertical cross-sectional view of the semiconductor device portion of FIG. 9A along line B-B and a horizontal longitudinal axis of a trench gate structure.
Figure 9C:
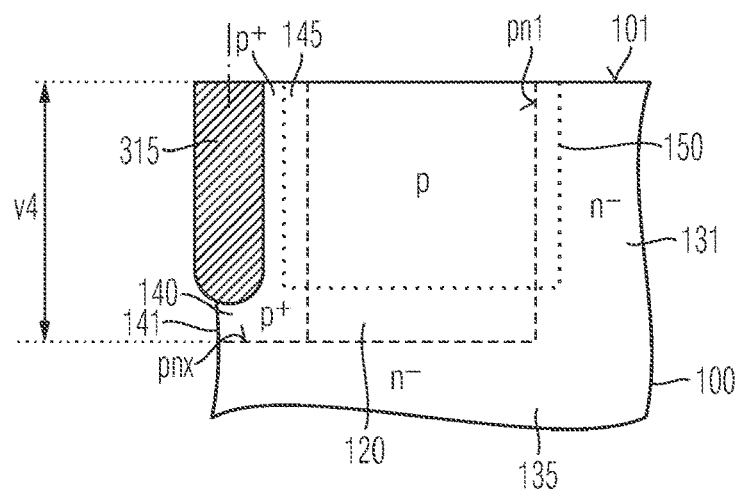
FIG. 9C is a schematic vertical cross-sectional view of the semiconductor device portion of FIG. 9A along line C-C and parallel to the trench gate structure.

In FIGS. 9A to 9C the vertical extension v0 of the source contact structure 315 and the vertical extension v3 of the source regions 110 are greater than a vertical extension v1 of the trench gate structure 150 for exploiting the full height of the sidewall channels for the effective channel width. The pinning regions 140 may be doped slices alternating with the source regions 110 along the first horizontal direction 191, wherein portions of the pinning region 140 laterally extending from the source contact structure 315 to the body regions 120 form body contact zones 145. A vertical extension v4 of the pinning region 140 may be equal to or greater than a vertical extension v3 of the source regions 110.

According to other embodiments, the main pinning region 141 and the body contact zones 145 may be formed independently from each other such that the main pinning region 141 may extend along the complete longitudinal extension of the source contact structure 315 along the first horizontal direction 191.

FIGS. 10A to 10D show a semiconductor device 500 that includes a semiconductor body 100 from a wide-bandgap semiconductor material with a hexagonal crystal lattice, for example, 2H-SiC (SiC of the 2H polytype), 6H-SiC or 15R-SiC. According to an embodiment the semiconductor material is silicon carbide of the 4H polytype (4H-SiC).

The first surface 101 at a front side of the semiconductor body 100 may be tilted to a main crystal plane by an off-axis angle α, which absolute value may be at least 2° and at most 12°, e.g., about 4°, wherein the first surface 101 may be planar or may include parallel first surface sections shifted to each other and tilted to a horizontal mean plane by the off-axis angle α as well as second surface sections tilted to the first surface sections and connecting the first surface sections such that a cross-sectional line of the first surface 101 approximates a saw-tooth line. A normal 104 to a planar first surface 101 or to a mean plane of a serrated first surface 101 defines a vertical direction.

The semiconductor device 500 includes transistor cells TC arranged along transistor rows 401, wherein two transistor rows 401 formed on opposite sides of an intermediate shared current spread region 131 form row pairs 411 of transistor rows 401 and wherein neighboring row pairs 411 of transistor rows 401 are formed on opposite sides of an intermediate source contact structure 315 shared by the two neighboring transistor rows 401.

Figure 10A:
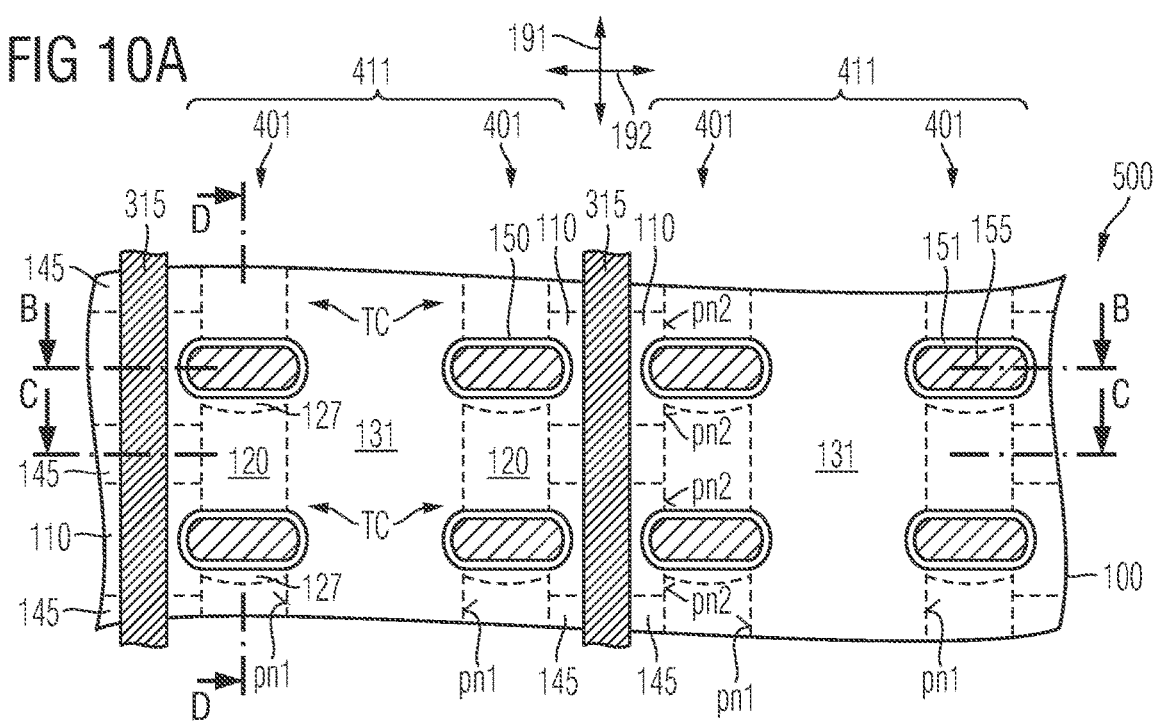
FIG. 10A is a schematic horizontal cross-sectional view of a portion of a semiconductor device according to an embodiment related to a layout with pairs of transistor cells arranged mirror-inverted with respect to a horizontal center axis of a shared current spread region.

FIG. 10A shows four transistor rows 401, wherein two transistor rows 401 on opposite sides of a shared current spread region 131 form a row pair 411. The transistor rows 401 of each row pair 411 may be formed mirror-inverted with respect to a horizontal longitudinal axis of the shared current spread region 131 along the first horizontal direction 191. According to other embodiments, the transistor rows 401 of a row pair 411 may be shifted to each other along the first horizontal direction 191 and/or the row pairs 411 may be shifted to each other along the first horizontal direction 191.

The source contact structure 315, the source region 110 and the pinning region 140 may have any of the configurations as discussed with respect to the previous Figures.

Figure 10B:
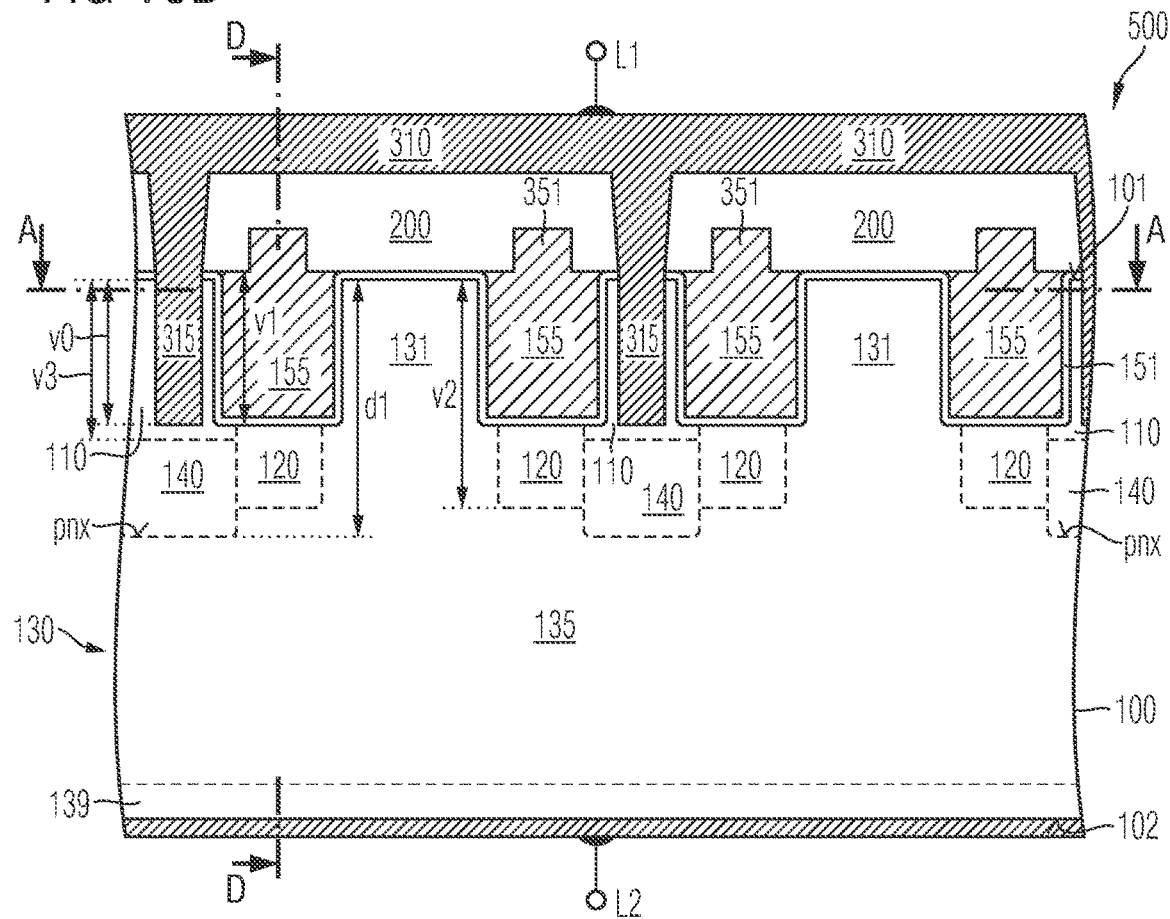
FIG. 10B is a schematic vertical cross-sectional view of the semiconductor device portion of FIG. 10A along line B-B and a horizontal longitudinal axis of pairs of trench gate structures.

As illustrated in FIG. 10B a distance d1 between the auxiliary pn junction pnx and the first surface 101 may be greater than a vertical extension v2 of the body regions 120. Two transistor rows 401 of neighboring row pairs 411 share a common continuous pinning region 140, which longitudinal axis extends along the first horizontal direction 191.

In a vertical projection of the pinning region 140 slice-shaped body contact zones 145 alternate with slice-shaped source regions 110 along the first horizontal direction 191. A vertical extension v0 of a part of the source contact structure 315 extending into the semiconductor body 100 and a vertical extension v3 of the source region 110 may be approximately equal to a vertical extension v1 of the trench gate structures 150.

Gate connection lines 351 formed above the first surface 101 may connect portions of the gate electrode 155 in trench gate structures 150 assigned to the same transistor row 401. The gate connection lines 351 may be formed from the same material(s) and may have the same material configuration as the gate electrode 155 in the trench gate structures 150.

An interlayer dielectric 200 separates a first load electrode 310 from the first surface 101 and from the gate connection lines 351. The source contact structures 315 extend from the first load electrode 310 through openings in the interlayer dielectric 200 into the semiconductor body 100. The first load electrode 310 forms or may be electrically connected to a first load electrode L1 of the semiconductor device 500.

A heavily doped base portion 139 is formed along the second surface 102 of the semiconductor body 100 at a side opposite to the first surface 101. The base portion 139 may have the same conductivity type as the drift zone 135, the opposite conductivity type, or may include doped zones of both conductivity types, wherein each doped zone may extend between the second surface 102 and the drift zone 135. The base portion 139 is low-resistively connected a second load electrode 320 formed directly on the second surface 102 and is electrically connected or coupled to a second load terminal L2.

The trench gate structures 150 may be equally spaced, may have equal width and a regular center-to-center distance along the first horizontal direction 191. The center-to-center distance of the trench gate structures 150 along the transistor row 401 may be in a range from 0.5 μm to 10 μm, e.g., from 1 μm to 5 μm. The vertical extension v1 of the trench gate structures 150 may be in a range from 0.3 μm to 5 μm, e.g., in a range from 0.5 μm to 2 μm.

Sidewalls at the long sides of the trench gate structures 150 may be vertical to the first surface 101, slanted to a normal 104 onto the first surface 101 or may taper with increasing distance to the first surface 101.

FIG. 10C shows the load current $I_L$ through the semiconductor device 500. A potential applied to the gate electrodes 155 of the trench gate structures 150 controls a lateral charge carrier flow from the source regions 110 shown in FIG. 10A through the body regions 120 to the current spread regions 131. In the current spread regions 131 the charge carriers are diverted and pass the drift zone 135 mainly in the vertical direction.

According to FIG. 10D the <0001> crystal axis is tilted to the normal 104 by an off-axis angle α>0, the <11-20> crystal axis is tilted with respect to the horizontal plane by the off-axis angle α, and the <1-100> crystal axis runs orthogonal to the cross-sectional plane of FIG. 10D.

The sidewalls along the long sides of the trench gate structures 150 taper with increasing distance to the first surface 101. A taper angle β of the trench gate structures 150 with respect to the normal 104 may be equal to the off-angle α or may deviate from the off-axis angle α by not more than ±1° such that a first sidewall of the trench gate structure 150 is parallel to the {11-20} main crystal plane, in which charge carrier mobility is high.

A second sidewall opposite to the first sidewall may be tilted to a main crystal plane by twice the off-angle α, e.g., by 4° or more, for example by about 8°. In a 4H-SiC semiconductor body 100 with a crystal orientation as illustrated in FIGS. 10D, the first sidewall on the left-hand side may exhibit significant higher charge carrier mobility than the second sidewall on the right-hand side.

For nominal operating conditions, formation of inversion channels in portions of the body regions 120 along the second sidewalls may be suppressed in order to achieve a uniform threshold voltage, at least in case where the longitudinal axes of the trench gate structures 150 are perpendicular to the off-orientation direction of the first surface 101. For example, the source regions 110 may be spaced from the second sidewall or a separation dielectric thicker than the gate dielectric 151 may be formed along the second sidewall.

According to the illustrated embodiment the body regions 120 include passivation zones 127 formed along at least a portion of the second sidewalls. A dopant concentration in the passivation zone 127 is sufficiently high to suppress the formation of an inversion channel for gate voltages within the nominal operating range of the semiconductor device 500. For example, a mean dopant concentration in the passivation zone 127 may be at least twice, at least ten times or at least fifty times as high as in the portion of the body region 120 outside the passivation zone 127.

Figure 11A:
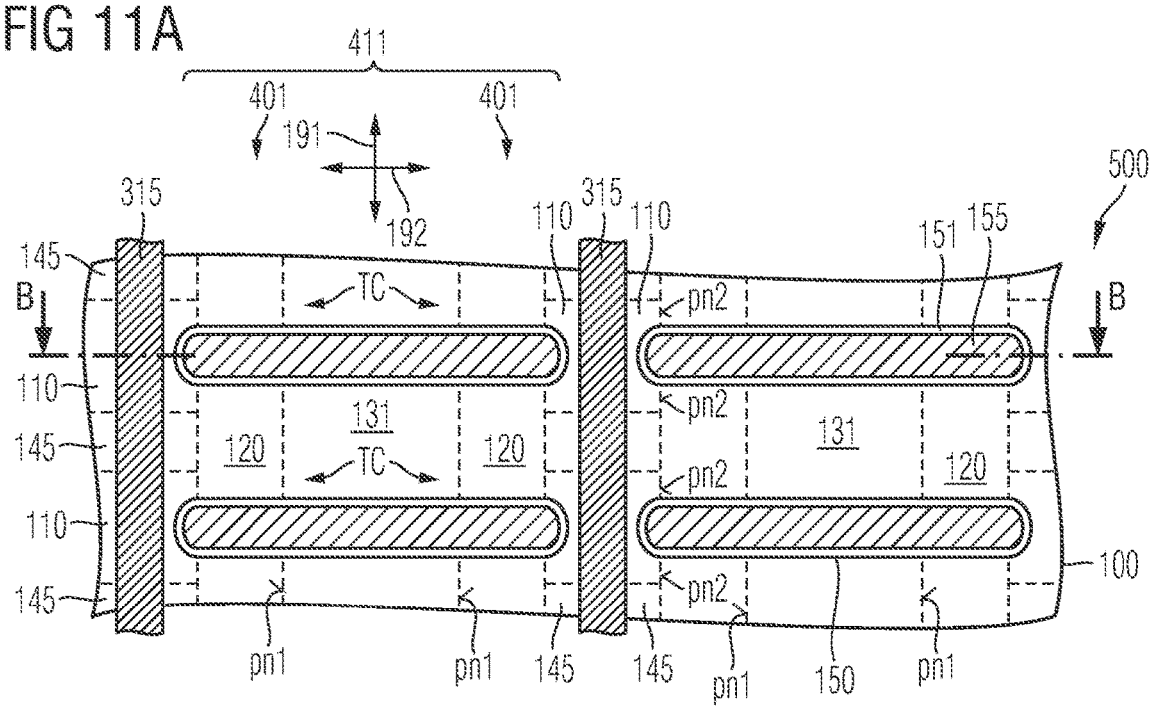
FIG. 11A is a schematic horizontal cross-sectional view of a portion of a semiconductor device according to an embodiment related to a layout with a single trench gate structure for a pair of mirror-inverted transistor cells.
Figure 11B:
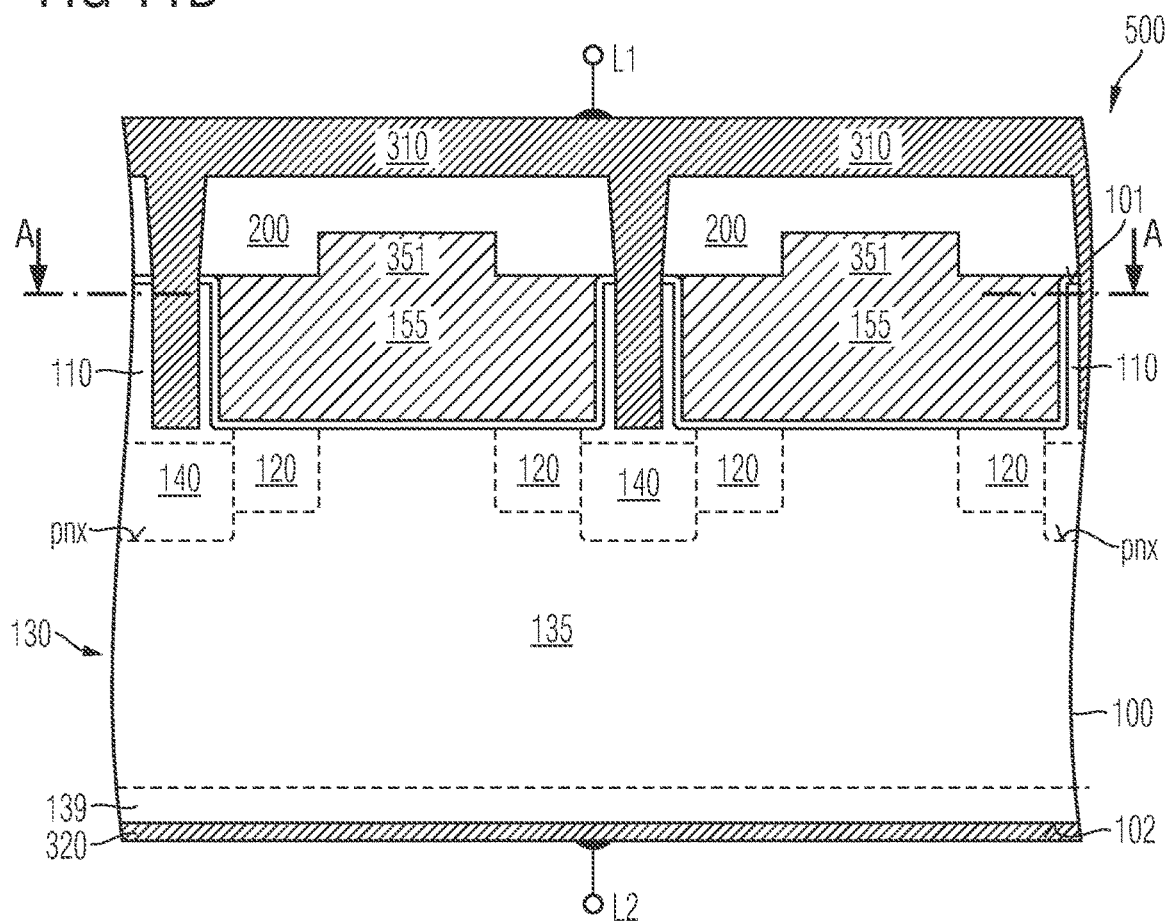
FIG. 11B is a schematic vertical cross-sectional view of the semiconductor device portion of FIG. 11A along line B-B and along a horizontal longitudinal axis of trench gate structures.

In FIGS. 11A to 11B the trench gate structures 150 of two neighboring transistor cells TC of two transistor rows 401 of the same row pair 411 form a combined trench gate structure 150 extending along the second horizontal direction 192 through the intermediate current spread region 131, which is shared by the transistor cells TC of the two transistor rows 401.

Figure 12A:
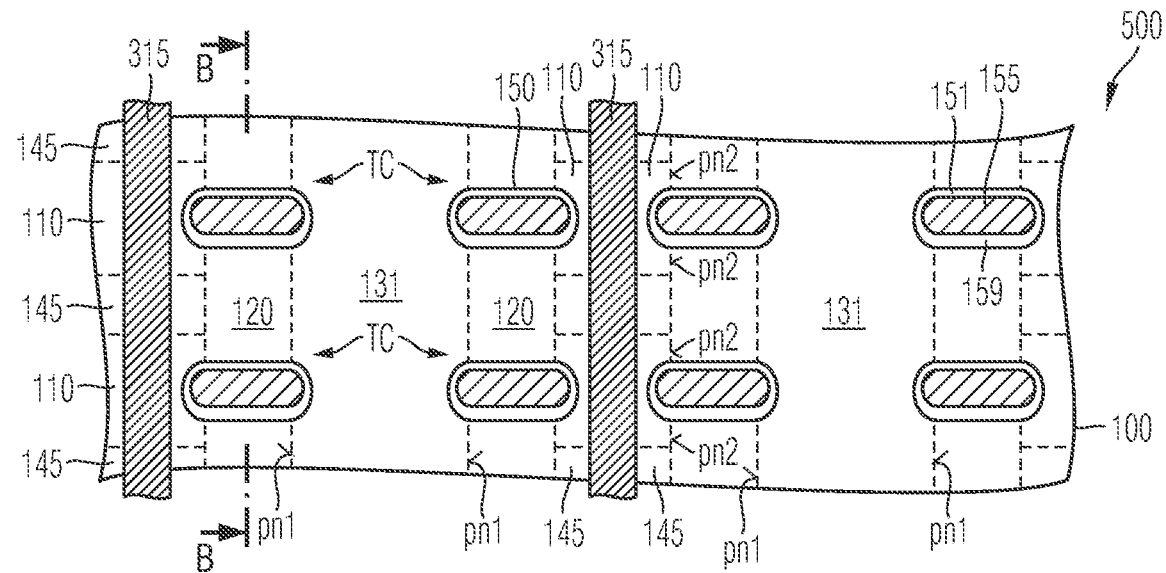
FIG. 12A is a schematic horizontal cross-sectional view of a portion of a semiconductor device according to an embodiment related to trench gate structures with one-sided gate dielectric.
Figure 12B:
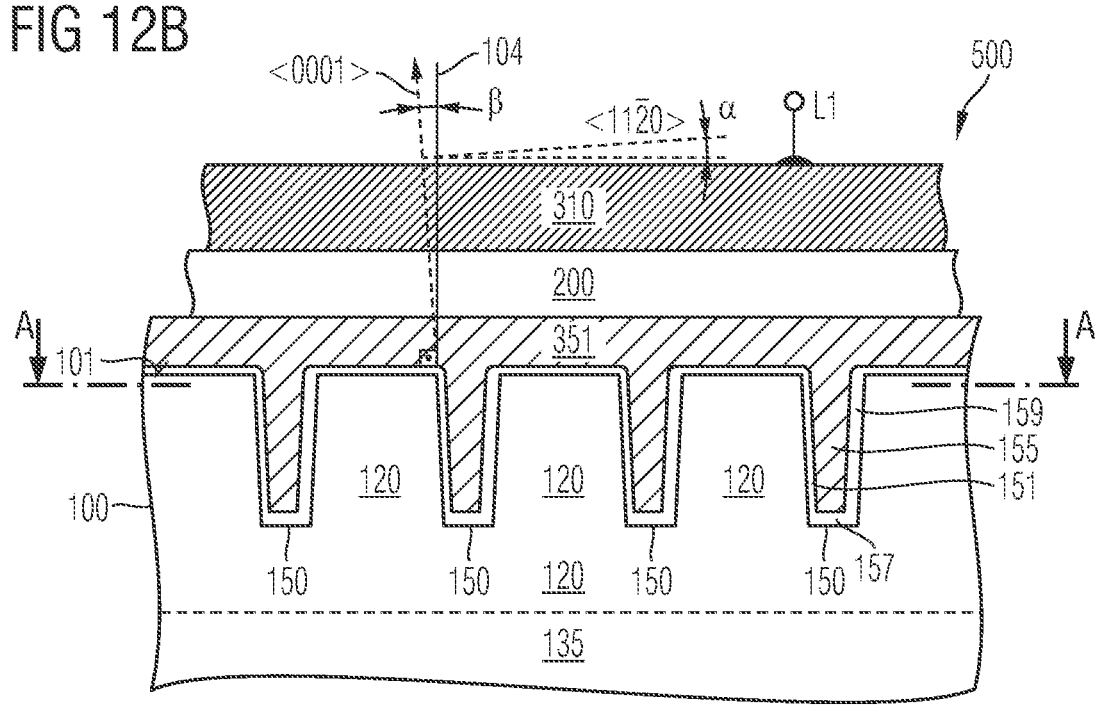
FIG. 12B is a schematic vertical cross-sectional view of the semiconductor device portion of FIG. 12A along line B-B orthogonal to a horizontal longitudinal axis of the trench gate structures.

FIGS. 12A and 12B show a separation dielectric 159 selectively formed along the second sidewalls. In addition, a bottom dielectric 157 may be formed at the bottom of the trench gate structure 150. The separation dielectric 159 and/or the bottom dielectric 157 may reduce a capacitive coupling between gate electrode 155 and neighboring portions of the body regions 120 such that at least under nominal operating conditions no inversion channels are formed along the second sidewalls and/or along the bottom. For example, the separation dielectric 159 and the bottom dielectric 157 may be from the same material as the gate dielectric 151 and a thickness of the bottom dielectric 157 and the separation dielectric 159 is at least 120%, for example, at least twice or five times the thickness of the gate dielectric 151.

Figure 13A:
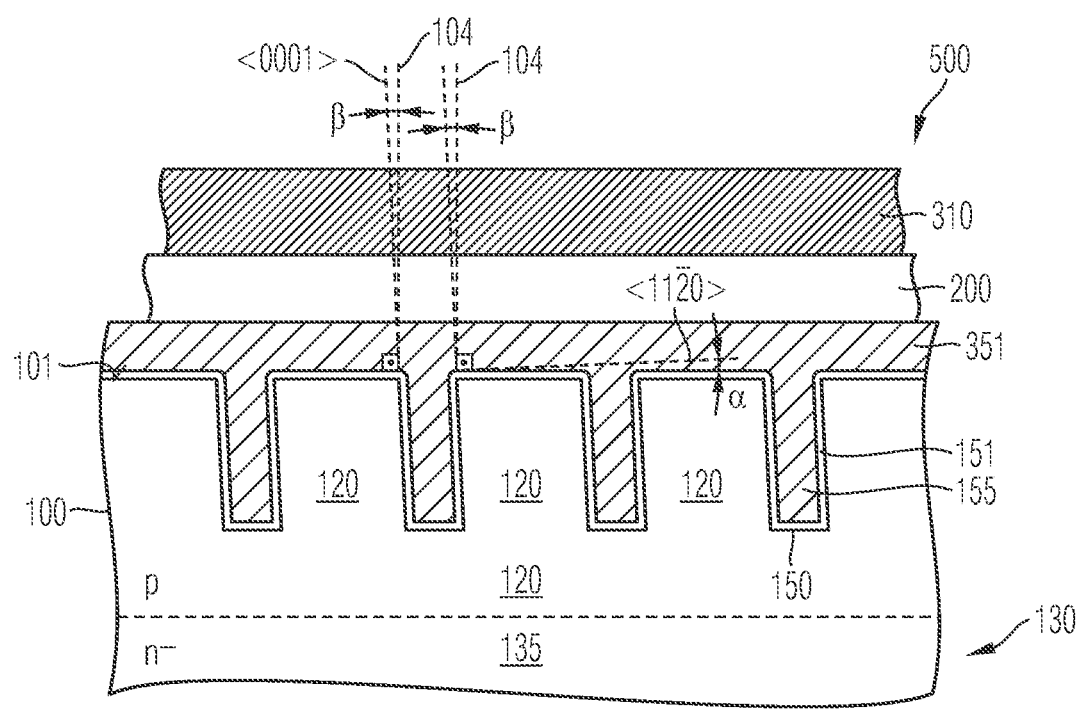
FIG. 13A is a schematic vertical cross-sectional view of a portion of a semiconductor device according to an embodiment related to trench gate structures with parallel trench sidewalls tilted to a first surface of a semiconductor body.

In FIG. 13A the <0001> crystal axis is tilted to the normal 104 by an off-axis angle α>0, the <11-20> crystal axis is tilted with respect to the horizontal plane by the off-axis angle α, and the <1-100> crystal axis runs orthogonal to the cross-sectional plane of FIG. 13A. The first and second sidewalls of the trench gate structures 150 are parallel to each other and both sidewalls are tilted to the normal 104 by a sidewall angle β equal to or approximate the off-axis angle α such that the charge carrier mobility is approximately equal in both sidewall channels. The trench gate structures 150 may be formed by using directed ion beam etching, wherein the directed ion beam impinges at an angle tilted to the normal 104 by the off-axis angle α.

Figure 13B:
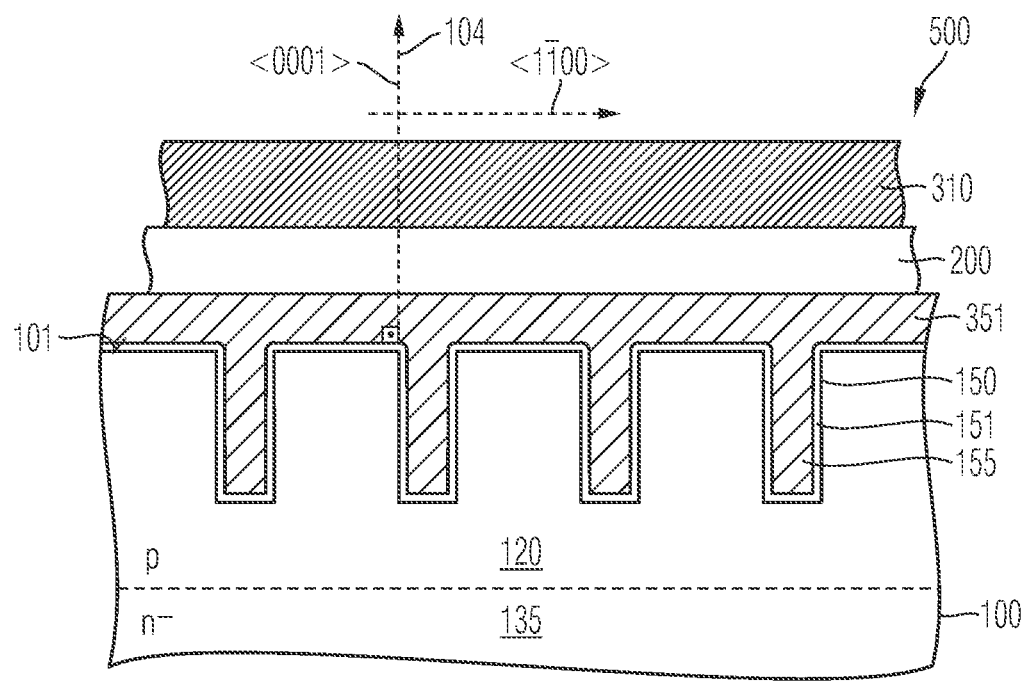
FIG. 13B is a schematic vertical cross-sectional view of a portion of a semiconductor device according to an embodiment related to trench gate structures with parallel trench sidewalls orthogonal to a first surface of a semiconductor body.

In FIG. 13B the <0001> main crystal axis is tilted to the cross-sectional plane by the off-axis angle. The <1-100> crystal axis is parallel to the first surface 101 and the vertical sidewalls of the trench gate structure 150 are parallel to (−1100) and (1-100) crystal planes. The charge carrier mobility in both crystal planes is approximately equal such that use of both the first and the second sidewalls overcompensates for the lower charge carrier mobility with respect to the (11-20) crystal plane.

Figure 13C:
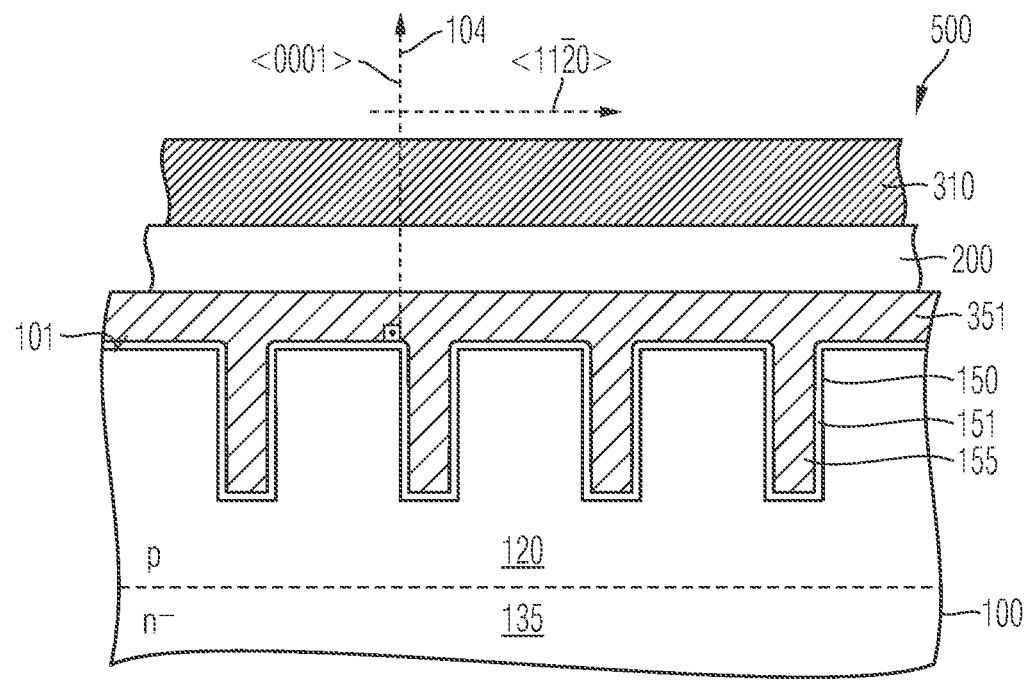
FIG. 13C is a schematic vertical cross-sectional view of a portion of a semiconductor device according to another embodiment related to trench gate structures with parallel trench sidewalls orthogonal to a first surface of a semiconductor body.

In FIG. 13C the <0001> main crystal axis is tilted to the cross-sectional plane by the off-axis angle. The <11-20> crystal axis is parallel to the first surface 101 and vertical sidewalls of the trench gate structure 150 are (11-20) and (−1-120) crystal planes with approximately the same charge carrier mobility.

Figure 13D:
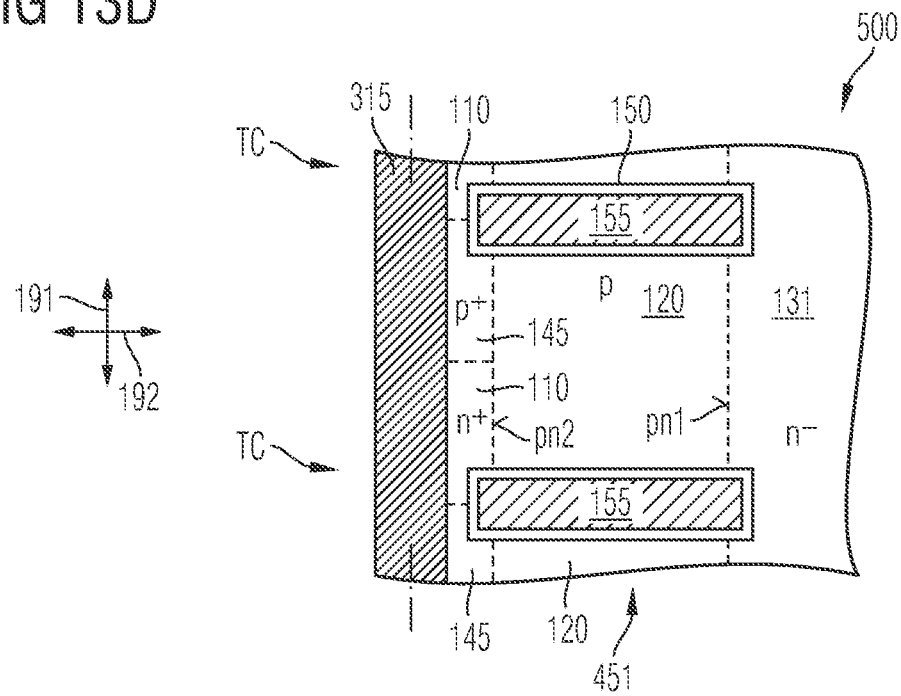
FIG. 13D is a schematic horizontal cross-sectional view of a portion of a semiconductor device according to a further embodiment with one-sided channel.

In the semiconductor device 500 of FIG. 13D a lateral body contact 145 directly adjoins to a second side of the trench gate structures 150 and disables the sidewall channel at the side with lower carrier mobility, for example, in a semiconductor device 500 with the crystal orientation as described in FIGS. 12A and 12B.

Figure 13E:
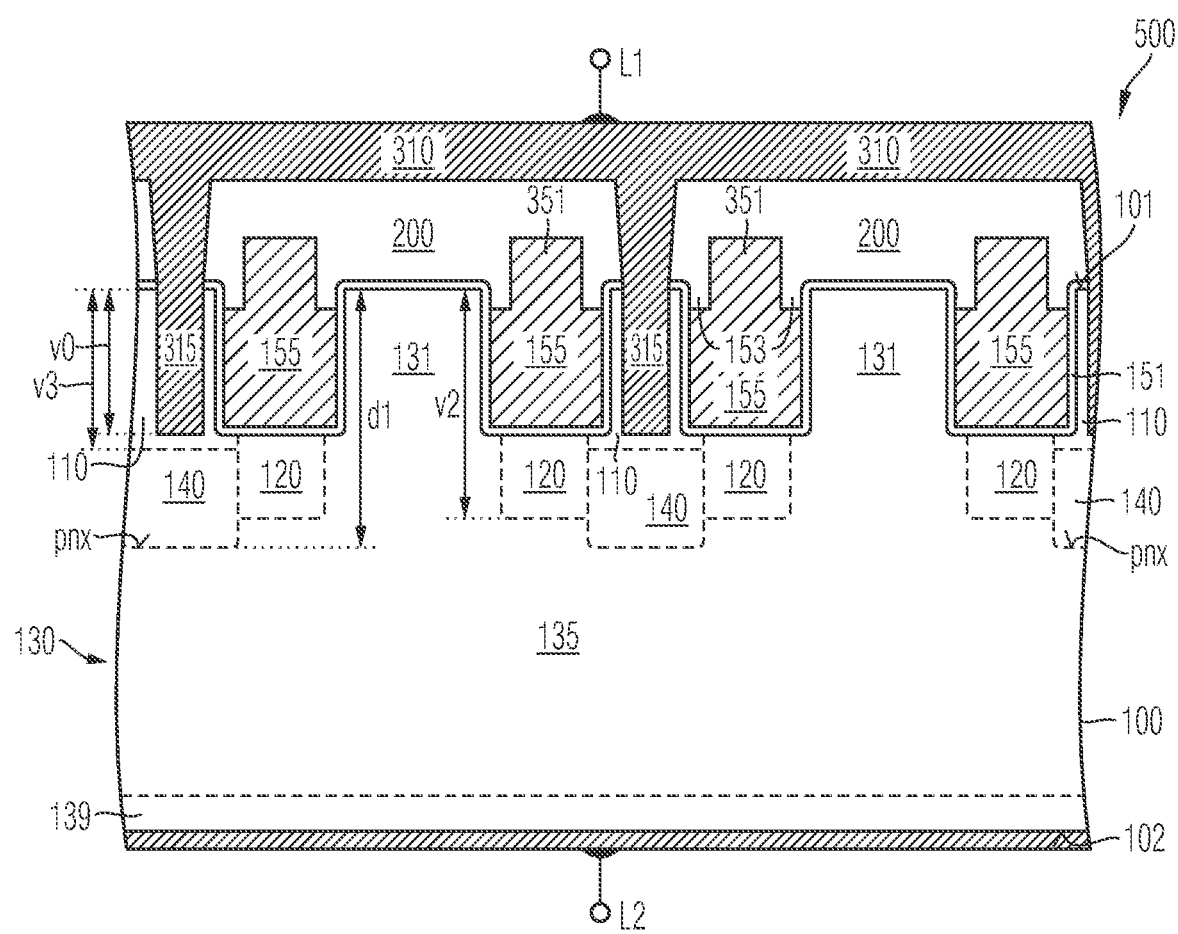
FIG. 13E is a schematic vertical cross-sectional view of a portion of a semiconductor device according to an embodiment related to trench gate structures with two-sided dielectric collar.

In FIG. 13E the trench gate structures 150 include two-sided dielectric collars 153 at the top along a plane coplanar with the first surface 101. An outer edge of a first portion of the dielectric collar 153 adjoins the source region 110. An outer edge of a second portion of the dielectric collar 153 adjoins the current spread region 131. Inner edges of the first and second portions may be flush with the edges of the gate connection lines 351. A vertical extension of the dielectric collar 153 may be in the range of some few nanometers. The dielectric collar 153 may prevent the formation of inversion channels along the top of the body regions 120.

Figure 14A:
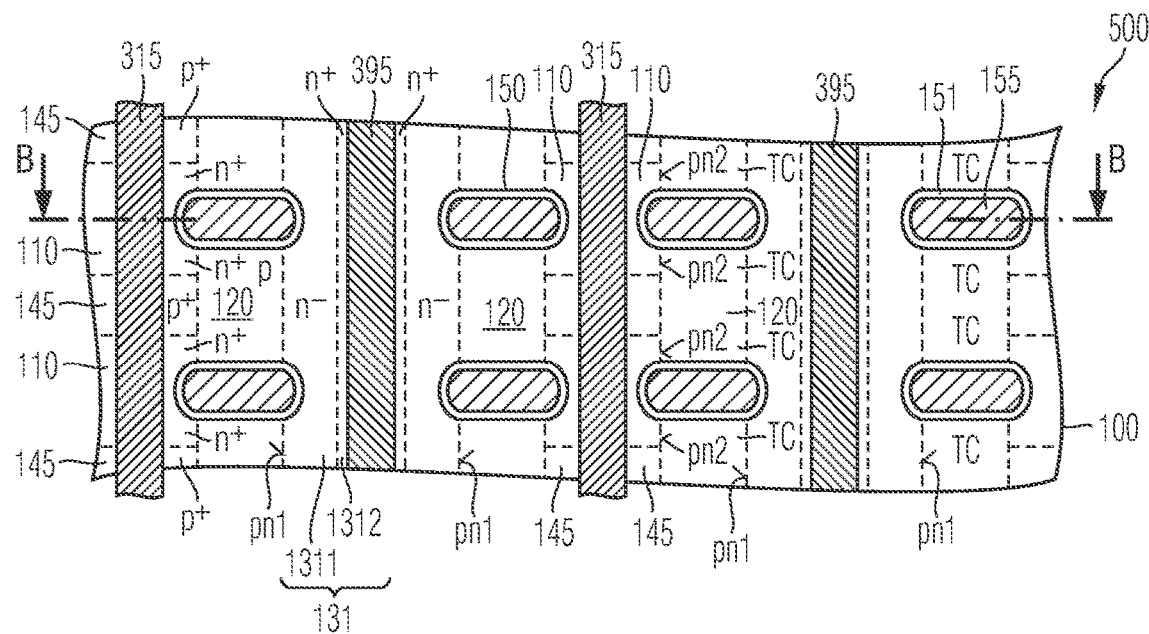
FIG. 14A is a schematic horizontal cross-sectional view of a portion of a semiconductor device according to an embodiment related to an auxiliary structure in the current spread region.
Figure 14B:
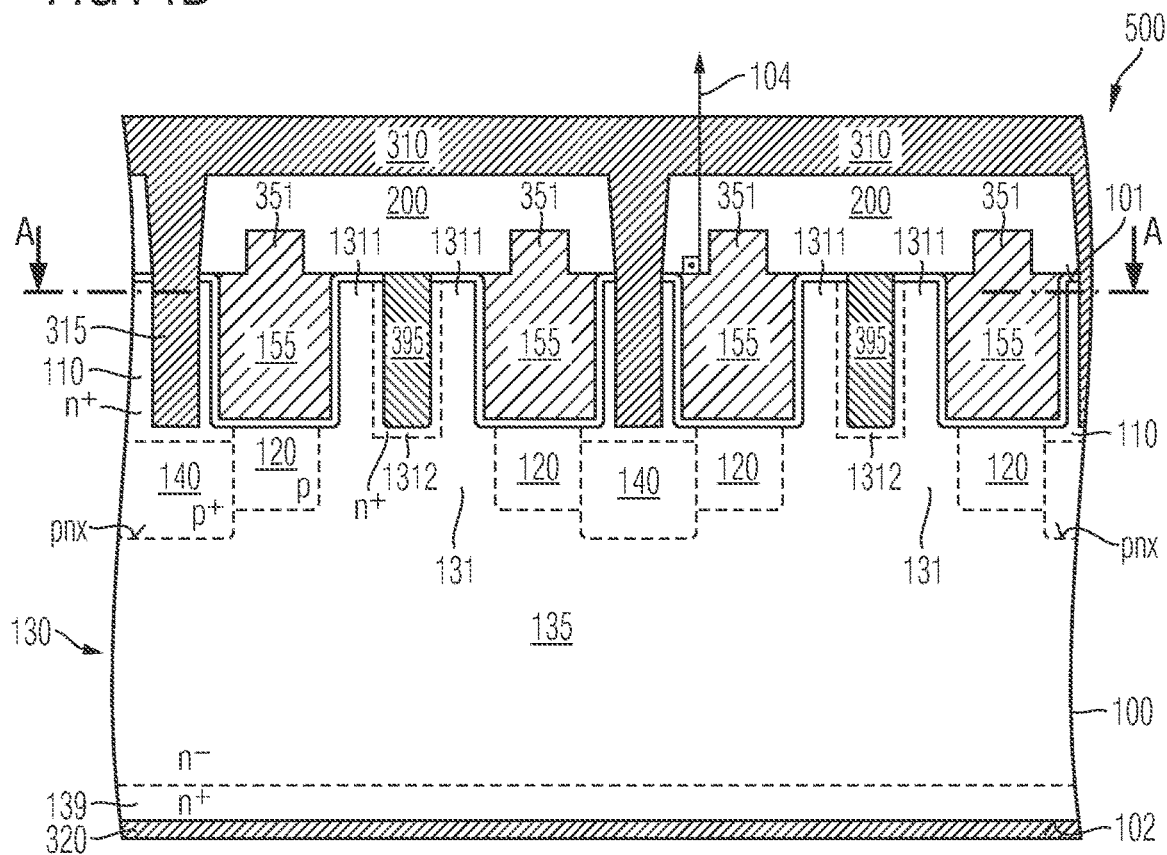
FIG. 14B is a schematic vertical cross-sectional view of the semiconductor device portion of FIG. 14A along line B-B.

The semiconductor device 500 of FIGS. 14A and 14B may be an n-channel field effect transistor with p-doped body regions 120. The crystal orientation may be one of those described with reference to FIGS. 13B and 13C. For example, the <0001> main crystal axis is tilted to the normal 104 by an off-axis angle α into direction of the (11-20) main crystal plane. Horizontal longitudinal axes of the trench gate structures 150 are in a plane of the <11-20> crystal axis and vertical first and second sidewalls of the trench gate structures 150 are (−1100) and (1-100) crystal planes. The charge carrier mobility in both crystal planes is approximately equal such that use of both the first and second sidewalls overcompensates for the lower charge carrier mobility compared with (11-20) crystal planes.

FIGS. 14A and 14B show highly-conductive auxiliary structures 395 embedded in the current spread regions 131. The auxiliary structures 395 form a low-resistive interface to the drift zone 135 and redirect the lateral current through the transistor cells TC to a vertical current through a JFET (junction field effect transistor) structure formed below the auxiliary structures 395 by the body regions 120 and the intermediate portion of the current spread region 131. The highly-conductive auxiliary structure 395 may include one or more metal-containing layers and may extend from the first surface 101 into the current spread region 131. A vertical extension of the auxiliary structure 395 may be approximately the same as a vertical extension of the source contact structures 315 or a vertical extension of the trench gate structures 150.

The current spread region 131 may include a heavily doped portion 1312 directly adjoining the auxiliary structure 395. A more lightly doped portion 1311 of the current spread region 131 may be formed between the body region 120 and the heavily doped portion 1312. For example, the lightly doped portion 1311 may separate the heavily doped portion 1312 and the body region 120.

Figure 15A:
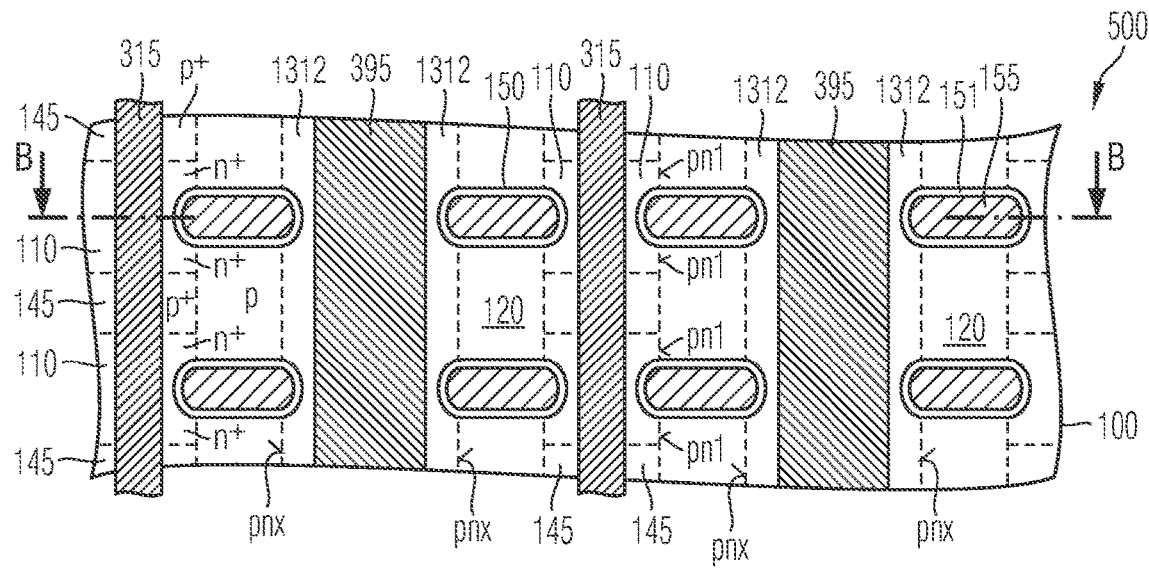
FIG. 15A is a schematic horizontal cross-sectional view of a portion of a semiconductor device according to an embodiment combining an auxiliary structure in the current spread region with a heavily-doped connection to the body regions.
Figure 15B:
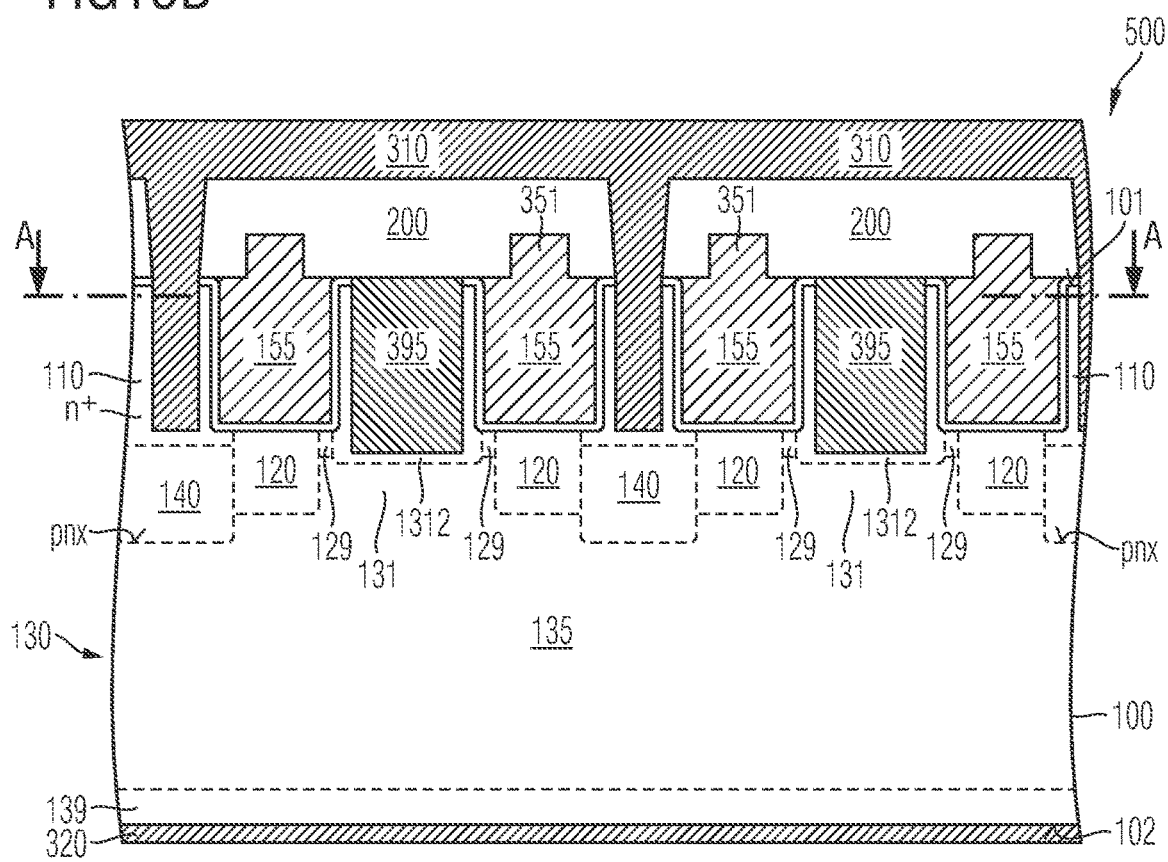
FIG. 15B is a schematic vertical cross-sectional view of the semiconductor device portion of FIG. 15A along line B-B.

In FIGS. 15A to 15B the heavily doped portion 1312 of the current spread region 131 directly adjoins the body region 120 and forms vertical first sections of the first pn junctions pn1.

Below the trench gate structures 150 the body regions 120 may include lateral body extensions 129 for further improving the characteristics of the JFET structure formed by a lower portion of the current spread region 131 between the auxiliary structures 395 and the drift zone 135. The lateral body extensions 129 may be formed by an implant through a temporarily empty gate trench.

According to an embodiment a semiconductor device includes a drift structure that includes at least (i) a drift zone at a distance to a first surface of a SiC semiconductor body and (ii) a current spread region between the first surface and the drift zone. Along a horizontal direction parallel to the first surface, a body region is formed between the current spread region and a source region. A trench gate structure extends into the semiconductor body. A pinning region between a source contact structure and the drift zone is electrically connected to the source contact structure. The pinning region is configured to pin an avalanche breakdown between the drift structure and the source contact structure at an auxiliary pn junction formed between the pinning region and the drift zone.

A dopant concentration in the pinning region may be higher than in the body region. The pinning region may form a $p/p^+$ or $n/n^+$ junction with the body region. A distance between the auxiliary pn junction and the first surface may be greater than a vertical extension of the body region. The pinning region may extend along a vertical direction orthogonal to the first surface from the source contact structure to the auxiliary pn junction. The source contact structure may extend from the first surface into the semiconductor body.

Figure 15C:
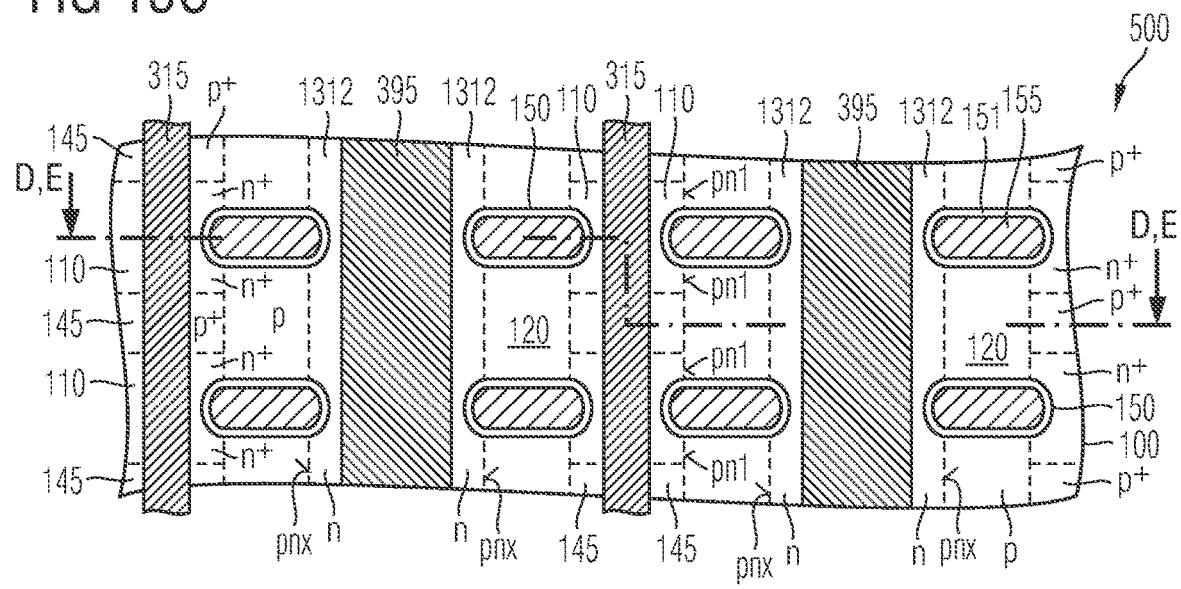
FIGS. 15C-15E are schematic horizontal and vertical cross-sectional views showing superjunction structures.
Figure 15D:
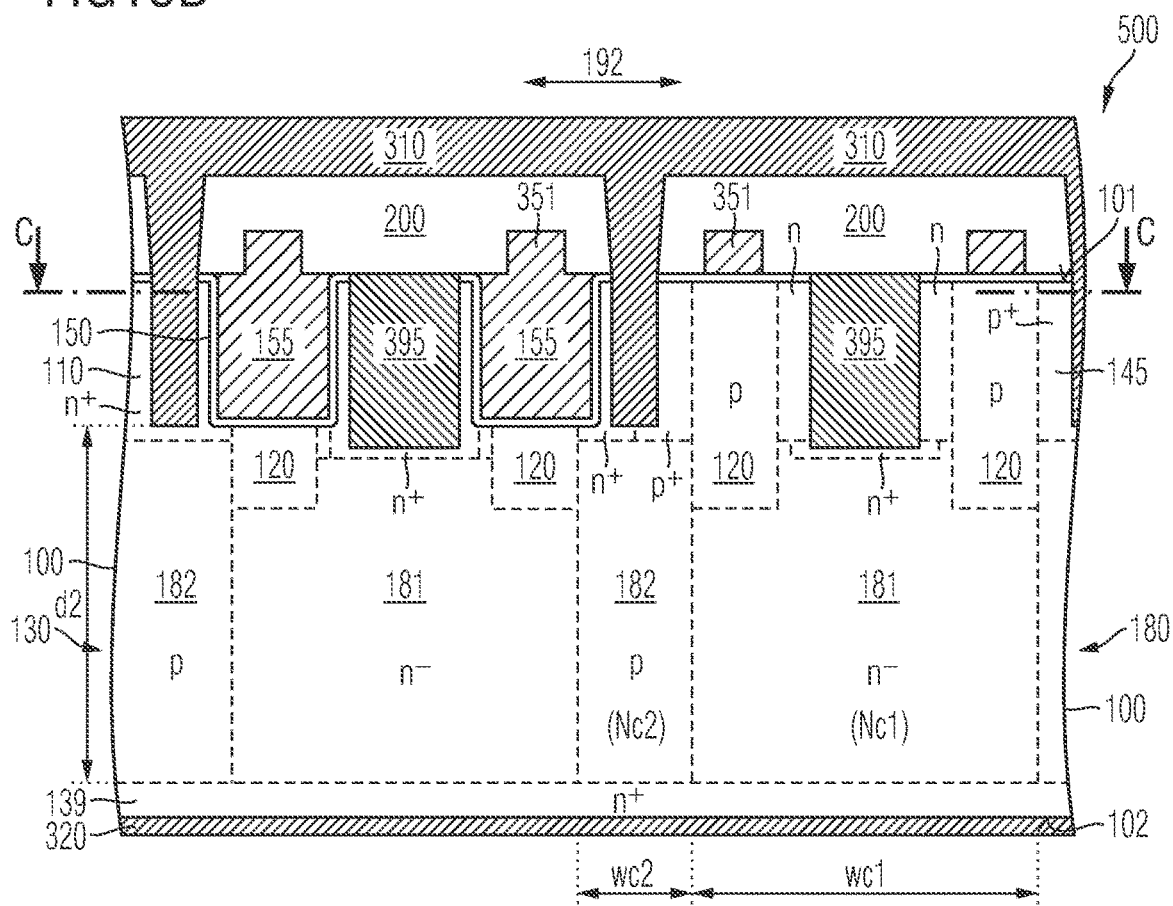
Figure 15E:
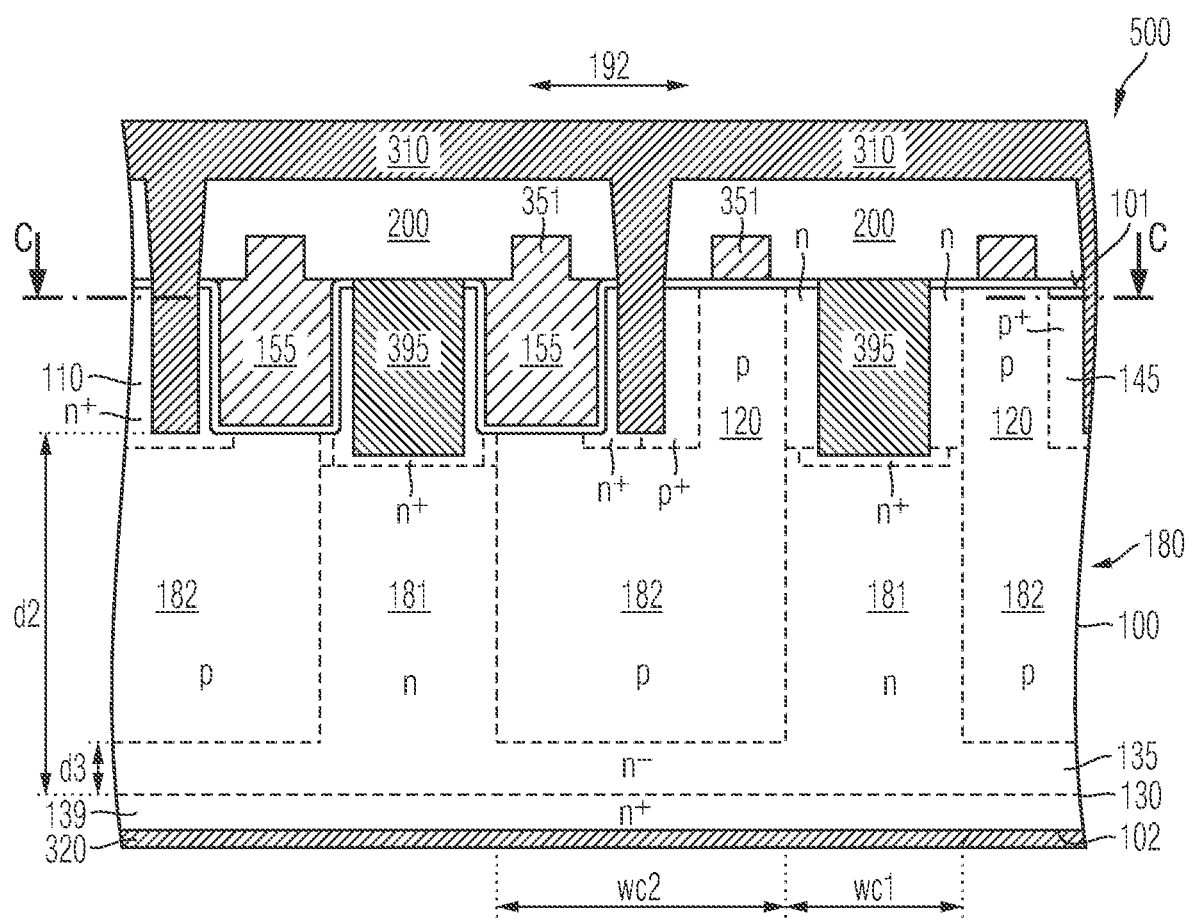

FIGS. 15C to 15E show semiconductor devices 500 with drift structures 130 including a superjunction structure 180. The superjunction structure 180 includes first columns 181 of the conductivity type of the source regions 110 and second columns 182 of the conductivity type of the body regions 120. The first columns 181 and second columns 182 alternate along at least one horizontal direction, wherein first columns 181 may laterally separate neighboring second columns 182 from each other and second columns 182 may laterally separate neighboring first columns 181 from each other. A horizontal width wc1 of the first columns 181, a net dopant concentration Nc1 in the first columns 181, a horizontal width wc2 of the second columns 182, and a net dopant concentration Nc2 in the second columns 182 may be selected such that with increasing blocking voltage the first and second columns 181, 182 get fully depleted before the intrinsic breakdown voltage of the semiconductor body 100 is reached.

The first and second columns 181, 182 may be stripe-shaped, wherein a horizontal length is greater than a horizontal width. A vertical distance between the second columns 182 and the base portion 139 may be at most 50%, e.g., at most 20% of a vertical distance d2 between the base portion 139 and the trench gate structures 150.

Horizontal longitudinal axes of the first and second columns 181, 182 may run parallel or tilted to horizontal longitudinal axes of the body regions 120. For example, the horizontal longitudinal axes of the first and second columns 181, 182 may run orthogonal to the horizontal longitudinal axes of the body regions 120, wherein a center-to-center distance between neighboring first columns 181 may be decoupled from a center-to-center distance between neighboring body regions 120.

In FIGS. 15D and 15E, the horizontal longitudinal axes of the first and second columns 181, 182 run parallel to the horizontal longitudinal axes of the body regions 120. A center-to-center distance between neighboring second columns 182 may be decoupled from or tied to a center-to-center distance between neighboring body regions 120.

According to the example illustrated in FIG. 15D, formation of the second columns 182 may be combined with the formation of the body contact zones 145, wherein along the second horizontal direction 192 the center-to-center distance between neighboring second columns 182 may correspond to a center-to-center distance between neighboring body contact zones 145. The lateral extension wc2 of the second columns 182 may correspond to a lateral extension of the body contact zones 145 along the second horizontal direction 192. The second columns 182 may be in contact with the base portion 139. The second columns 182 may substitute or may be combined with the pinning regions 140 of FIGS. 15A-15B.

In FIG. 15E the formation of the second columns 182 may be combined with the formation of the body regions 120, wherein along the second horizontal direction 192 the center-to-center distance between neighboring second columns 182 may correspond to a center-to-center distance between neighboring body regions 120. The horizontal width wc2 of the second columns 182 may correspond to a lateral extension of the body regions 120 along the second horizontal direction 192. The vertical distance d3 between the second columns 182 and the base portion 139 may be at most 50%, e.g., at most 20% of the vertical distance d2 between the base portion 139 and the trench gate structures 150. The second columns 182 may substitute or may be combined with the pinning regions 140 of FIGS. 15A-15B.

The semiconductor devices 500 as described above may include an integrated Schottky diode, wherein the first load electrode 310 may be effective as Schottky diode anode and the drift structure 130 may be effective as Schottky diode cathode. The Schottky diode may be formed in a portion of the semiconductor body 100 laterally adjoining a transistor cell region that includes the trench gate structures 150.

FIGS. 15F-15I relate to a semiconductor device 500 with a Schottky diode including a plurality of Schottky contacts SC spatially separated from each other, electrically arranged in parallel, and integrated into a transistor cell region, wherein the Schottky contacts SC are formed between trench gate structures 150.

Figure 15F:
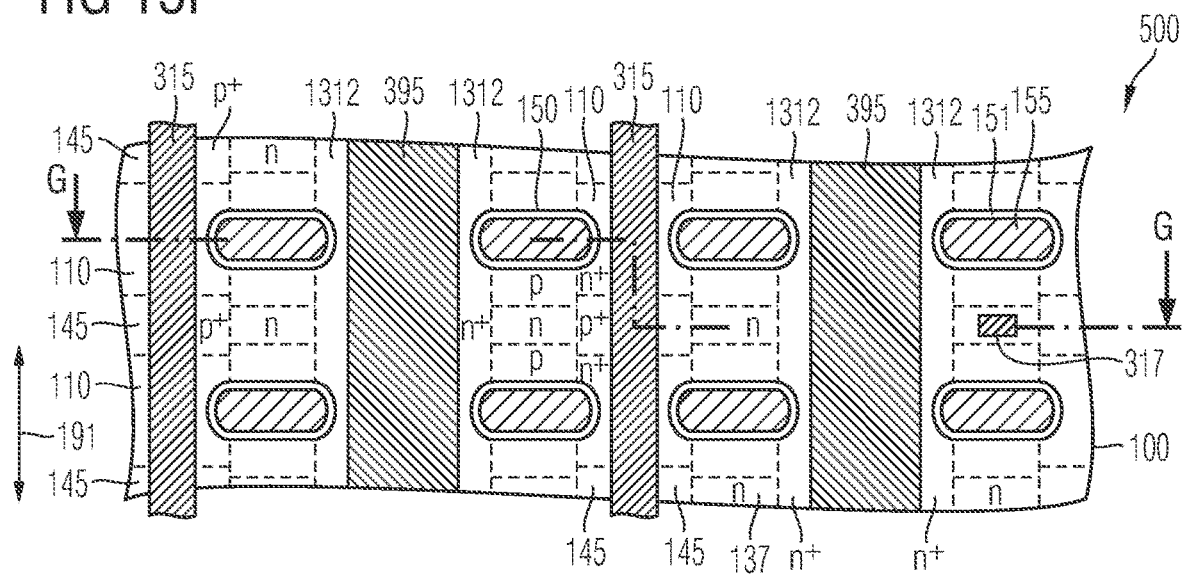
FIGS. 15F-15I are schematic horizontal and vertical cross-sectional views showing Schottky contacts.
Figure 15G:
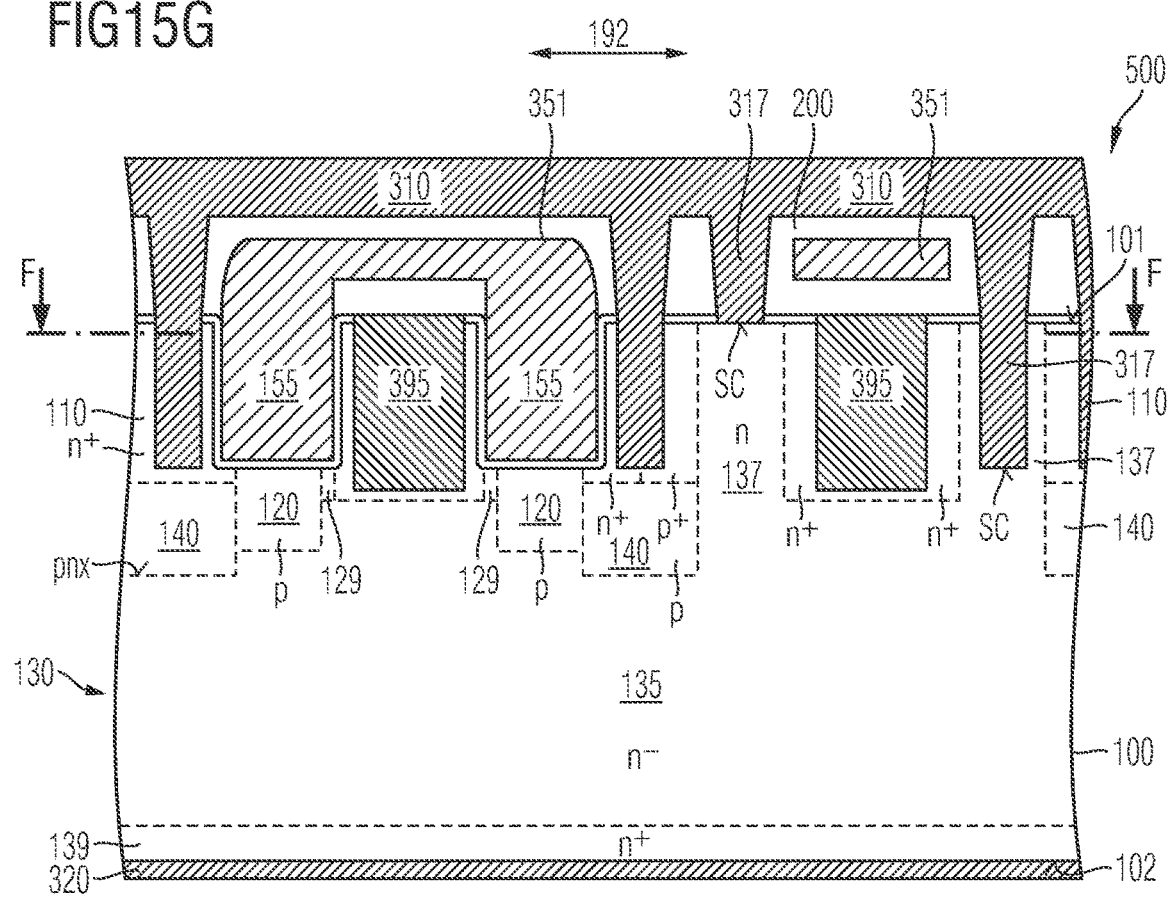

According to FIG. 15F-15G the Schottky contacts SC may be alternate with trench gate structures 150 along the first horizontal direction 191. The drift structure 130 may include lightly doped Schottky regions 137 that may extend from the first surface 101 to the drift zone 135 and that may alternate with portions of the body region 120 along the first horizontal direction 191. A dopant concentration in the Schottky regions 137 is sufficiently low not to form ohmic contacts. Along the first horizontal direction 191 a width of the Schottky regions 137 may be smaller than a width of the body contact zones 145 such that each body contact zone 145 is in contact with at least one portion of the body region 120.

Schottky contact structures 317 may extend from the first load electrode 310 through the interlayer dielectric 200 and through openings or lateral indentations of the gate connection lines 351. The Schottky contact structures 317 may extend to the semiconductor body 100 (left Schottky contact structure 317 of FIG. 15G) and/or into the semiconductor body 100 (right Schottky contact structure 317 of FIG. 15G). Each Schottky contact structures 317 is in direct contact with a Schottky region 137.

Figure 15H:
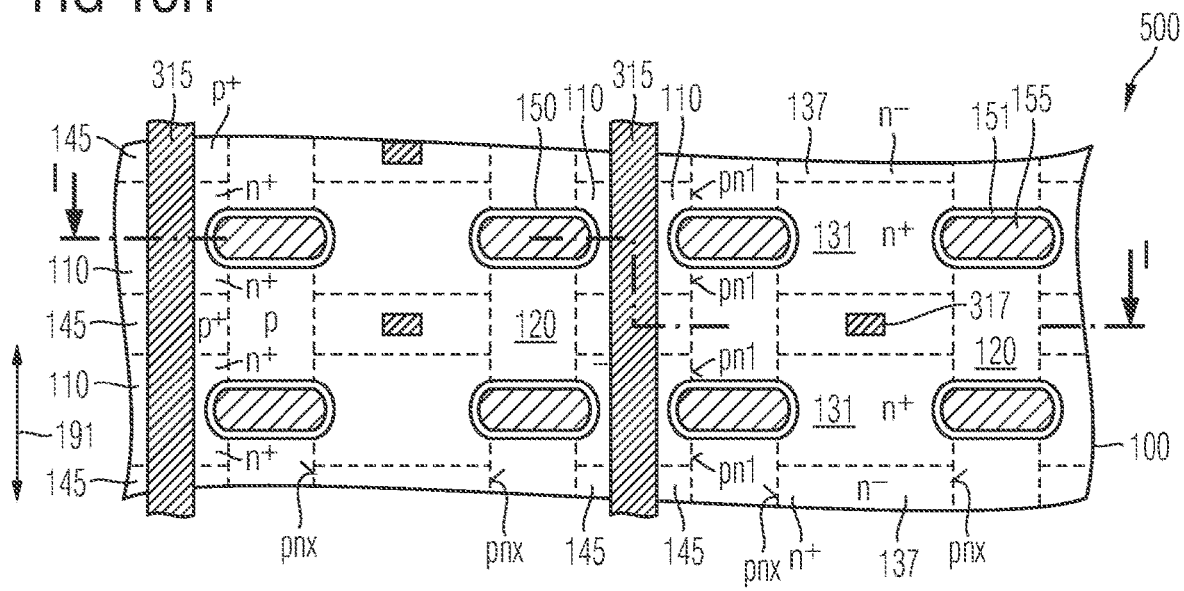
Figure 15I:
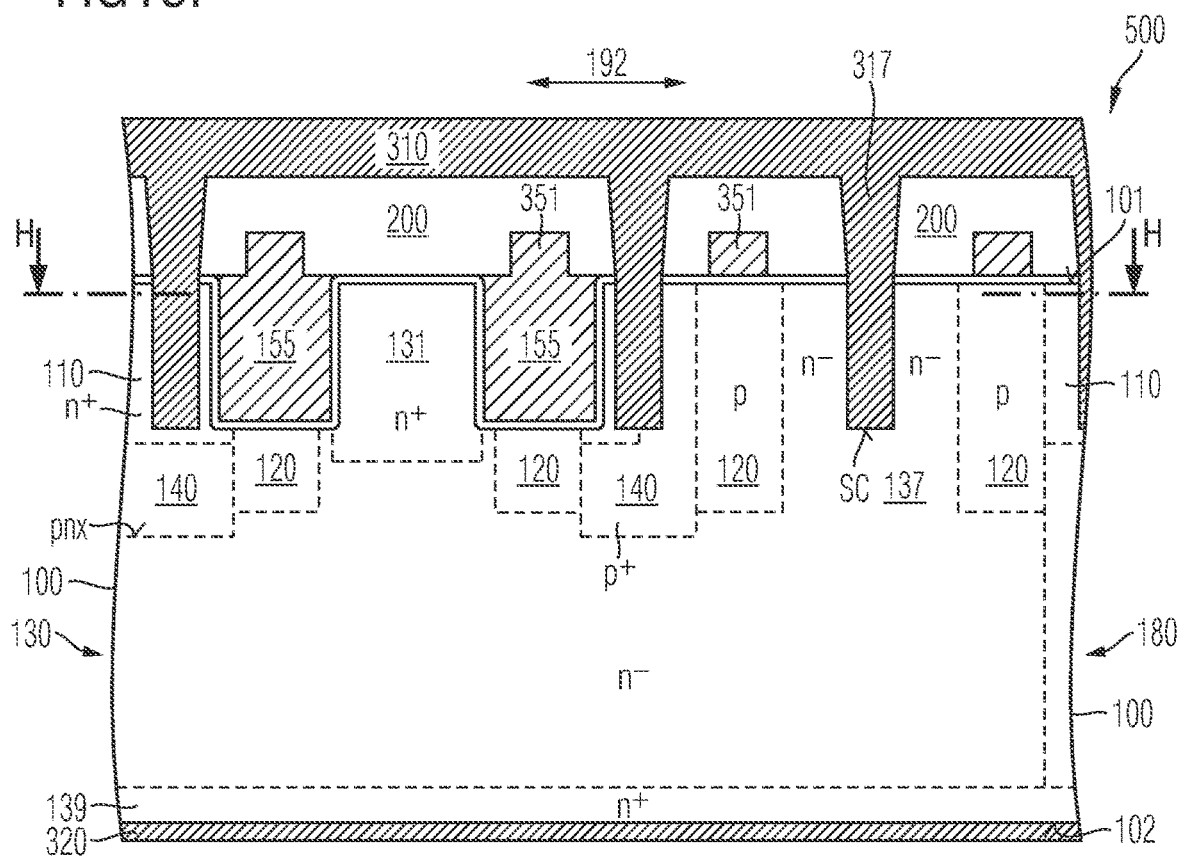

According to FIGS. 15H-15I the drift structure 130 may include lightly doped Schottky regions 137 that alternate with more heavily doped current spread regions 131 along the first horizontal direction 191. The Schottky contact structures 317 may extend to the semiconductor body 100 and/or into the semiconductor body 100. According to another embodiment a continuous Schottky region 137 may extend along the first horizontal direction 191 and two more heavily doped current spread regions 131 may separate the continuous Schottky region 137 from the two adjoining body regions 120.

Figure 16:
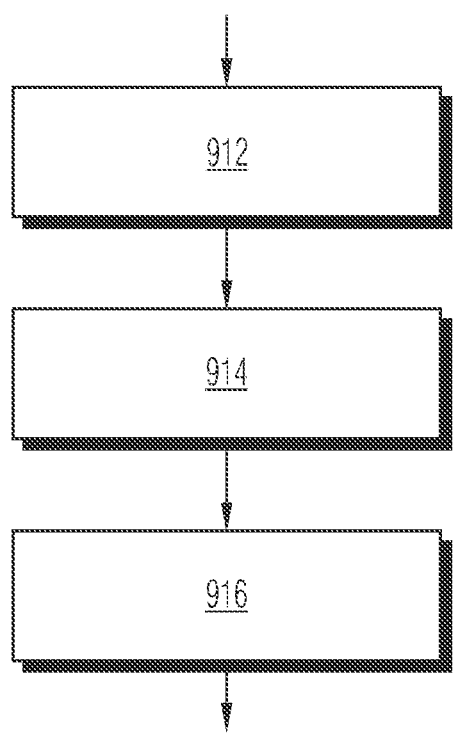
FIG. 16 is a simplified flowchart of a method of manufacturing semiconductor devices with source and pinning regions formed self-aligned to body regions according to an embodiment.

FIG. 16 refers to a method of manufacturing a semiconductor device including pinning and source regions, self-aligned to a body region. The term "self-aligned" points to that the body regions and the source regions are defined by the same single photolithographic process and the position of the body regions with respect to the source regions is not subjected to any misalignment between two photolithographic exposures.

Dopants of a first conductivity type are selectively introduced through first segments of first mask openings in a first dopant mask to form source implant zones in a semiconductor substrate of silicon carbide (912). A longitudinal axis of the first mask openings extends into a first horizontal direction. A first selection mask may selectively cover second segments of the first mask openings, wherein first and second segments alternate along the first horizontal direction.

Dopants of a second conductivity type are introduced into the semiconductor substrate through the second segments of the first mask openings to form pinning implant zones in the semiconductor substrate (914), wherein a second selection mask may selectively cover the first segments.

Further dopants of the second conductivity type are selectively introduced through second mask openings in a second dopant mask to form body implant zones in the semiconductor substrate (916), wherein a width of the second mask openings along a second horizontal direction orthogonal to the first horizontal direction is greater than a width of the first mask openings. The source and pinning implant zones may be formed prior to or after the body implant zones. The second dopant mask is obtained by modifying the first dopant mask. Alternatively, the first dopant mask is obtained by modifying the second dopant mask.

FIGS. 17A to 26C refer to a method of manufacturing silicon carbide power semiconductor devices on the basis of a semiconductor substrate 700 of silicon carbide. The semiconductor substrate 700 may be of 4H-SiC or 6H-SiC and may include a heavily doped base substrate 705, which may be a silicon carbide slice obtained from a silicon carbide ingot by sawing, by way of example. The base substrate 705 may be heavily doped and may be n-doped.

A drift layer 730, which may have the same conductivity type as the base substrate 705, may be formed on a process surface of the base substrate 705, e.g., by epitaxy. A first dopant mask 810 for defining pinning and source regions is formed on an exposed main surface 701 of the drift layer 730. Stripe-shaped first mask openings 815 extending along a first horizontal direction 191 are formed in the first dopant mask 810 both in device regions and in a grid-like kerf region separating neighboring device regions. An auxiliary mask, which may be, e.g., from a photoresist material, may be formed by photolithography. The auxiliary mask covers the device regions and includes auxiliary mask openings in the kerf region. An etch process may recess portions of the drift layer 730 exposed by the stripe-shaped auxiliary mask openings in the kerf region to form alignment trenches. The auxiliary mask is removed.

A resist layer may be deposited and patterned by photolithography to form a first selection mask 831 that covers second segments 8152 of the first mask openings 815 and that includes first selection openings 835 that expose first segments 8151 of the first mask openings 815 in the device regions, wherein the first and second segments 8151, 8152 may alternate, e.g., directly alternate along the first horizontal direction 191.

Using the first dopant mask 810 and the first selection mask 831 as a combined implant mask, dopants of a first conductivity type are implanted through the first segments 8151 of the first mask openings 815, e.g., by a high energy implant using an energy filter for distributing the dopants uniformly along the vertical direction.

Figure 17A:
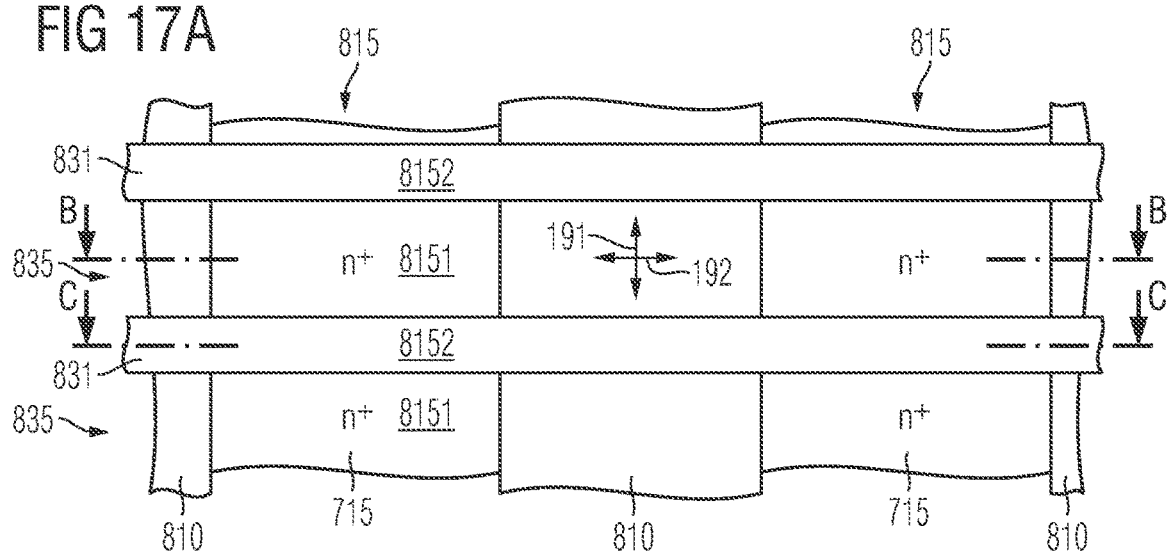
FIG. 17A is a schematic plan view of a portion of a semiconductor substrate for illustrating a method of manufacturing semiconductor devices with source and pinning regions formed self-aligned to body regions according to an embodiment using a lateral mask recess, after forming source implant zones selectively below first segments of first mask openings defining the source regions.

FIG. 17A shows the stripe-shaped first mask openings 815 of the first dopant mask 810. Longitudinal axes of the first mask openings 815 run parallel to the first horizontal direction 191. The first selection mask 831 covers second segments 8152 of the first mask openings 815. First selection openings 835 of the first selection mask 831, which run along the second horizontal direction 192, selectively expose first segments 8151 of the first mask openings 815.

Figure 17B:
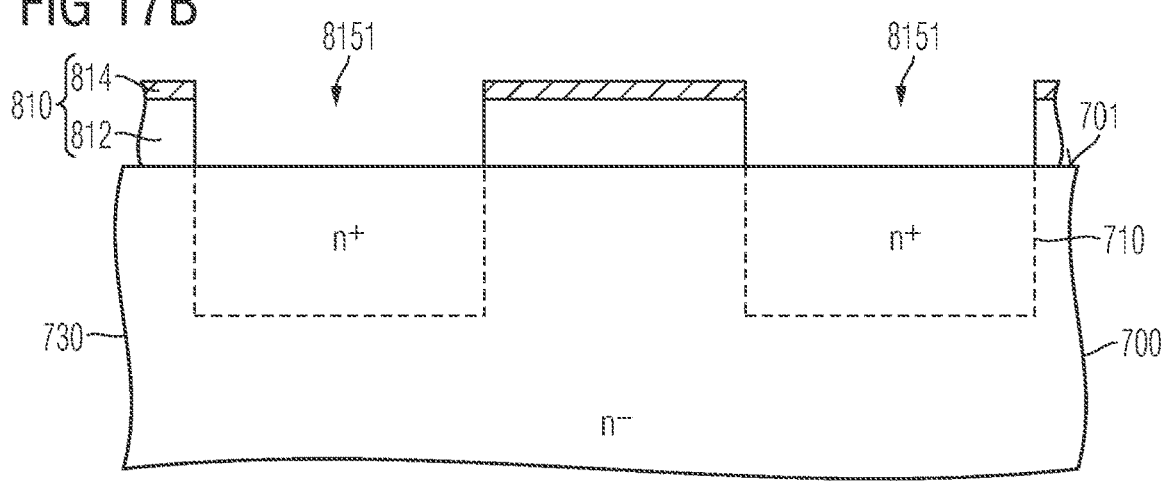
FIG. 17B is a schematic vertical cross-sectional view of the semiconductor substrate portion of FIG. 17A along line B-B.
Figure 17C:
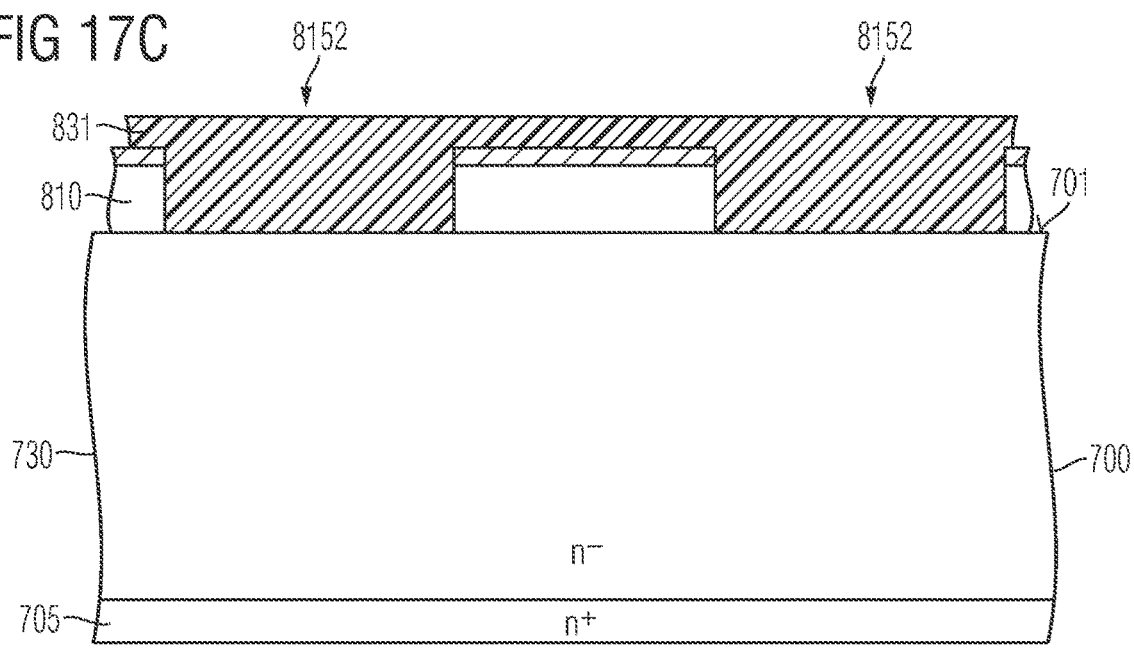
FIG. 17C is a schematic vertical cross-sectional view of the semiconductor substrate portion of FIG. 17A along line C-C.

According to FIGS. 17B and 17C the first dopant mask 810 may have a multi-layered structure with a mask base layer 812 and a mask top layer 814, wherein the materials for the mask base layer 812 and the mask top layer 814 show different etch properties. According to an embodiment the mask base layer 812 may be from a silicon oxide or silicate glass, e.g., a silicon oxide based on the deposition of TEOS (tetraethylorthosilane). The mask top layer 814 may be from polycrystalline silicon, amorphous silicon, or carbon, by way of example. Directly below, in other words, in the vertical projection of the first segments 8151 of the first mask openings 815, n-type source implant zones 710 are formed that extend from the main surface 701 into the semiconductor substrate 700. The first selection mask 831 is removed.

A further resist layer is deposited and patterned by photolithography to form a second selection mask 832 with second selection openings 836. The second selection mask 832 covers the first segments 8151 of the first mask openings 815 and the second selection openings 836 expose the second segments 8152 of the first mask openings 815. Using the second selection mask 832 and the first dopant mask 810 as combined implant mask, dopants of the second conductivity type are introduced through the second segments 8152 of the first mask openings 815, e.g., by a high energy implant using an energy filter for homogenously distributing the dopants along the vertical direction.

Figure 18A:
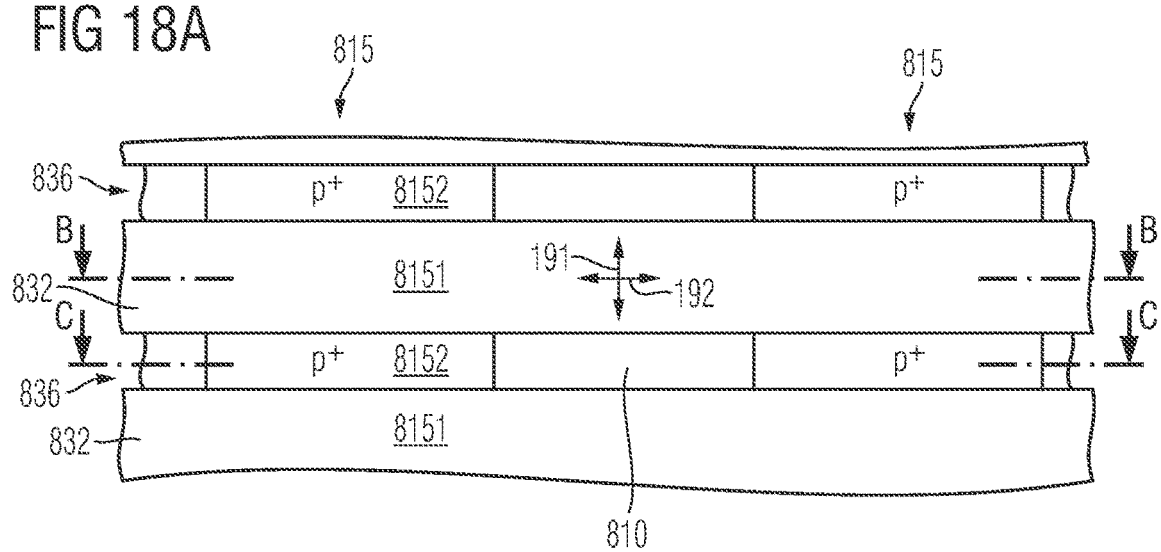
FIG. 18A is a schematic plan view of the semiconductor substrate portion of FIG. 17A, after forming pinning implant zones below second segments of the first mask openings.

FIG. 18A shows the second selection mask 832 covering the first segments 8151 of the first mask openings 815 and including stripe-shaped second selection openings 836, which selectively expose the second segments 8152 of the first mask openings 815.

Figure 18B:
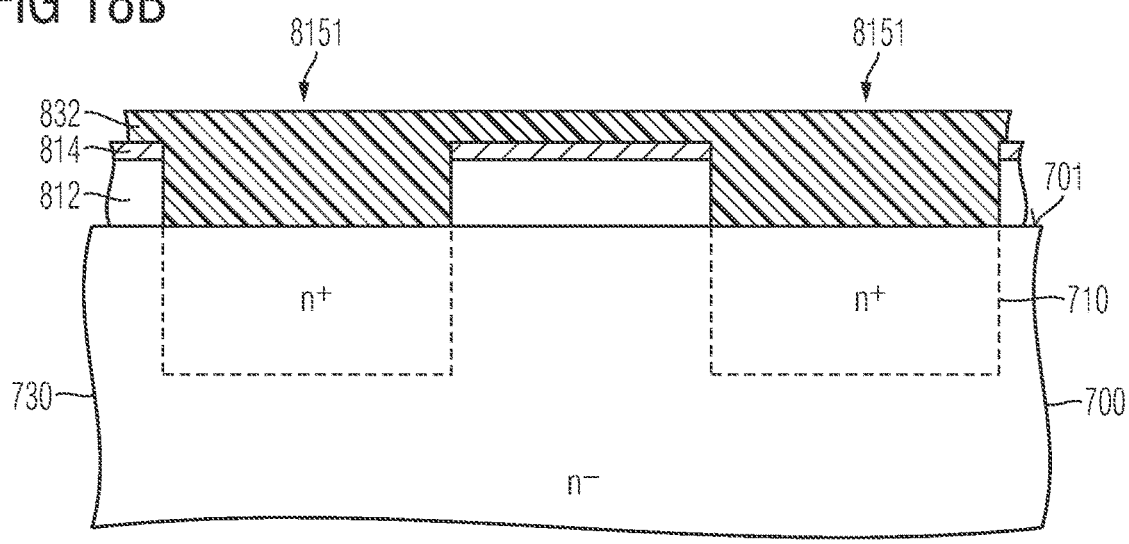
FIG. 18B is a schematic vertical cross-sectional view of the semiconductor substrate portion of FIG. 18A along line B-B.

According to FIG. 18B the second selection mask 832 covers the source implant zones 710 formed in the vertical projection of the first segments 8151 of the first mask openings 815.

Figure 18C:
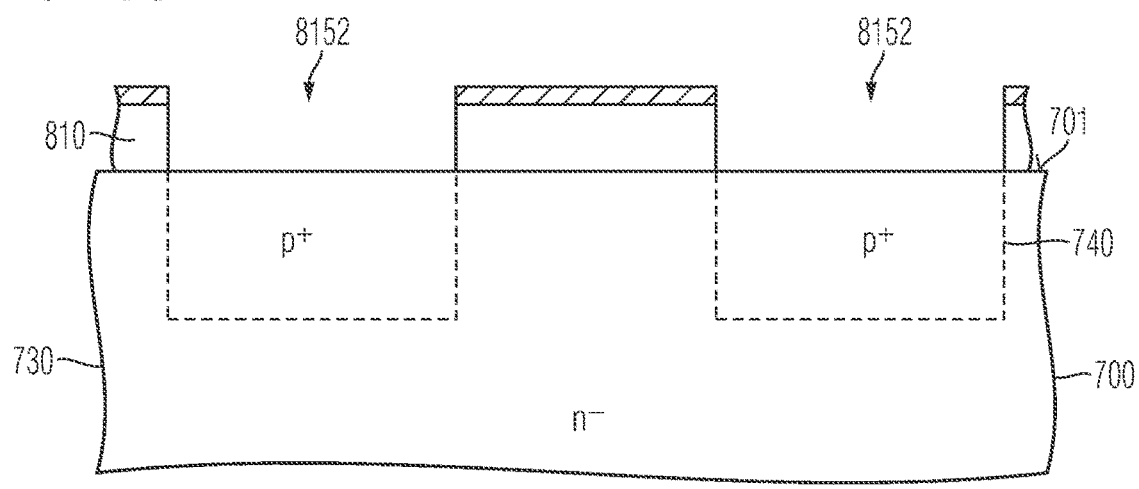
FIG. 18C is a schematic vertical cross-sectional view of the semiconductor substrate portion of FIG. 18A along line C-C.

FIG. 18C shows pinning implant zones 740 selectively formed in the vertical projection of the second segments 8152 of the first mask openings 815. Along the second horizontal direction 192 the pinning implant zones 740 may have the same lateral dimension as the source implant zones 710 as they are defined by the same stripe-shaped first mask openings 815. A vertical extension of the pinning implant zones 740 may be equal to or greater than a vertical extension of the source implant zones 710. The second selection mask 832 may be removed. The pinning implant zones 740 may be formed after or prior to the source implant zones 710.

The first dopant mask 810 may be modified to form a second dopant mask. The modification includes a widening of the first mask openings 815 along the second horizontal direction 192. The widening may include an isotropic recess of at least one of the layers of the first dopant mask 810.

Figure 19A:
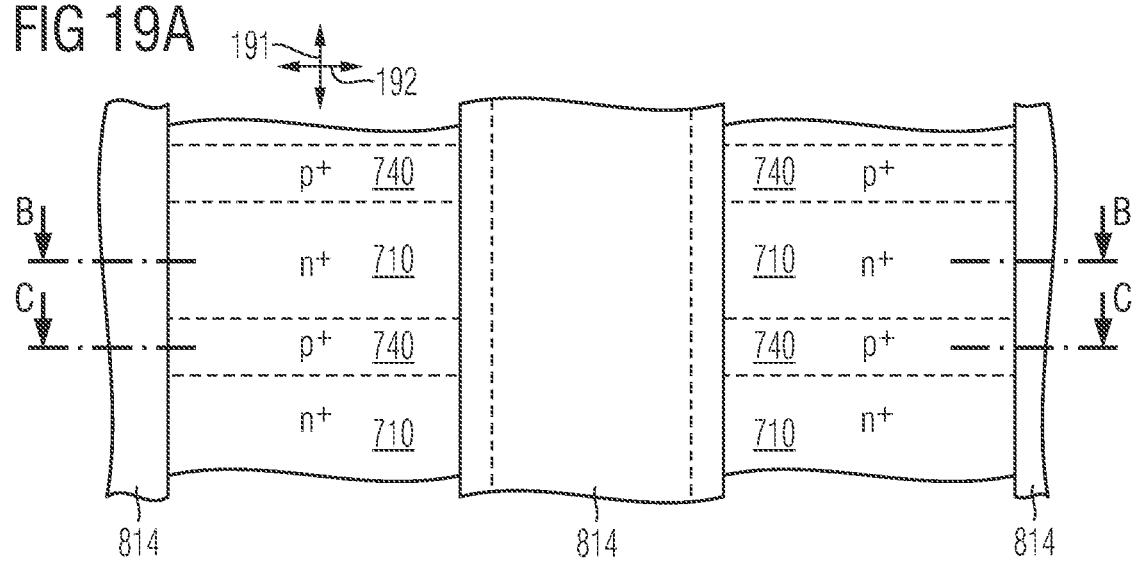
FIG. 19A is a schematic plan view of the semiconductor substrate portion of FIG. 18A, after laterally recessing a mask base layer.
Figure 19B:
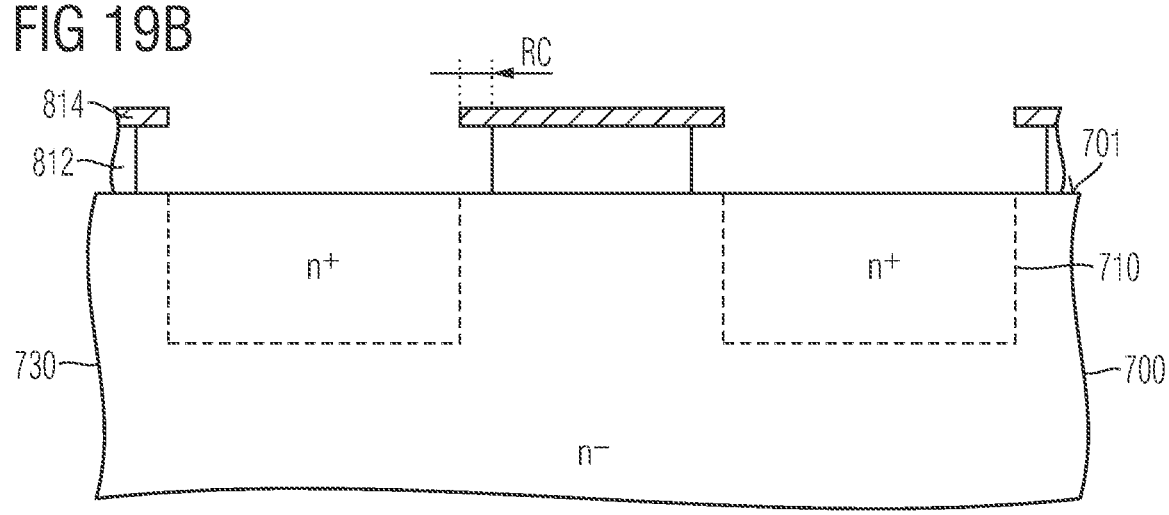
FIG. 19B is a schematic vertical cross-sectional view of the semiconductor substrate portion of FIG. 19A along line B-B.
Figure 19C:
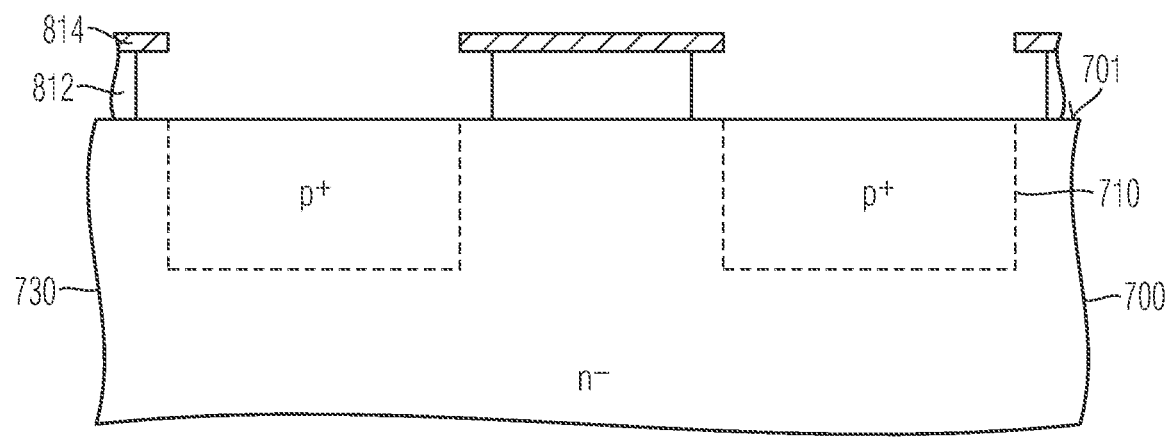
FIG. 19C is a schematic vertical cross-sectional view of the semiconductor substrate portion of FIG. 19A along line C-C.

According to the embodiment illustrated in FIGS. 19A to 19C a first isotropic etch laterally recesses the mask base layer 812 selectively. The first isotropic etch may be a wet etch with high selectivity with respect to the mask top layer 814.

FIGS. 19A to 19C show the laterally recessed mask base layer 812, wherein the recess undercuts the mask top layer 814 by a well-defined recess width RC, which may be obtained with high uniformity across the complete semiconductor substrate 700.

FIG. 19A shows the source implant zones 710 and the pinning implant zones 740 directly alternating along the first horizontal direction 191.

FIGS. 19B and 19C show the laterally recessed mask base layer 812 and the undercut mask top layer 814. The isotropic wet etch defines the recess width RC. The mask top layer 814 may be removed selectively with respect to the recessed mask base layer 812.

Figure 20A:
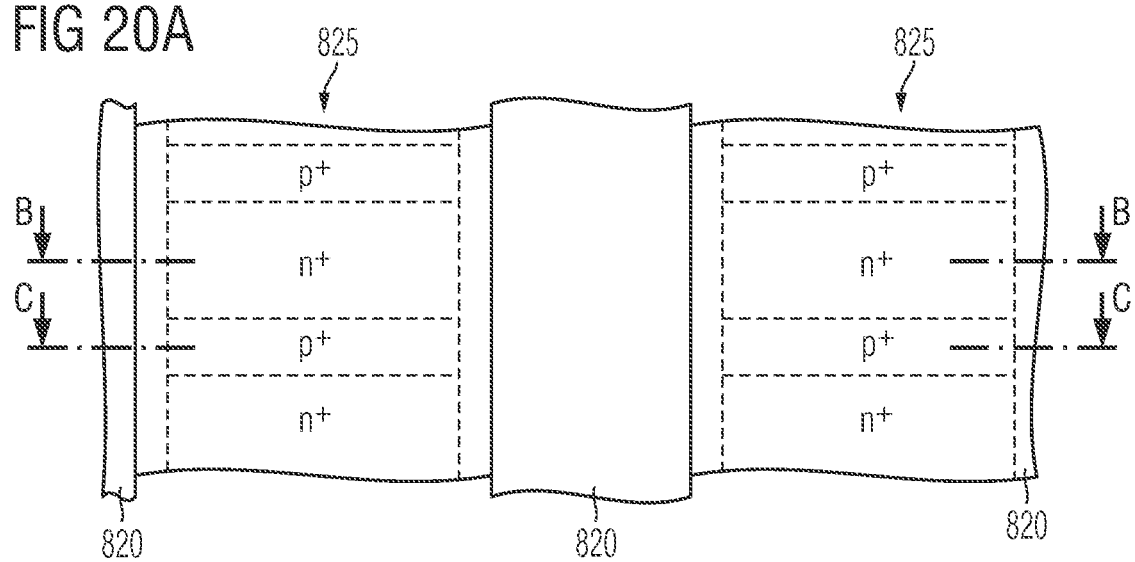
FIG. 20A is a schematic plan view of the semiconductor substrate portion of FIG. 19A, after forming second mask openings defining the body regions.
Figure 20B:
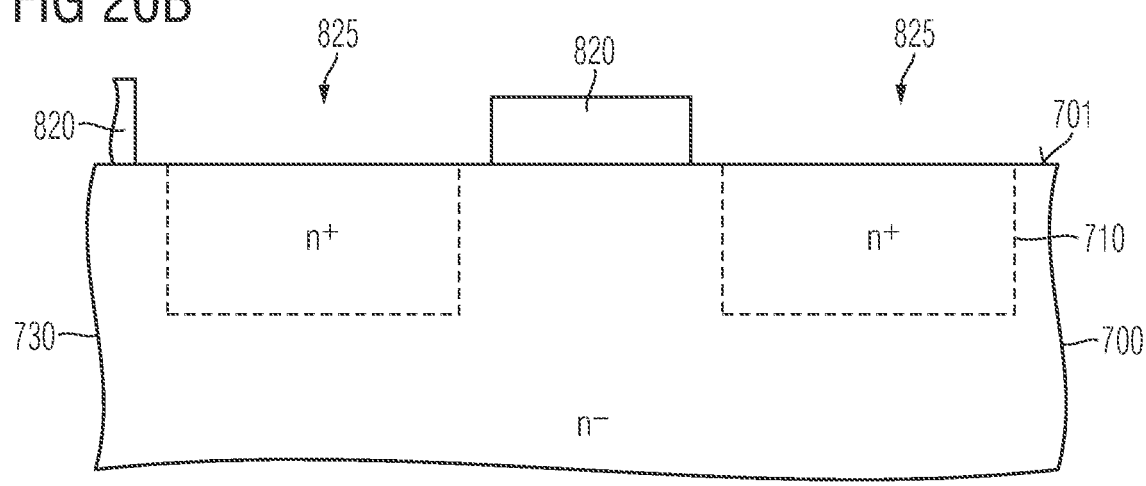
FIG. 20B is a schematic vertical cross-sectional view of the semiconductor substrate portion of FIG. 20A along line B-B.
Figure 20C:
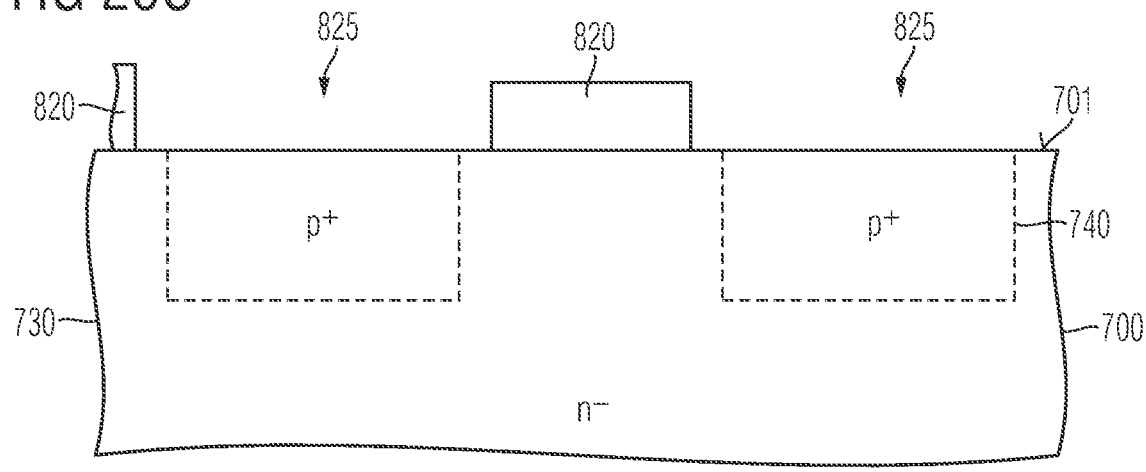
FIG. 20C is a schematic vertical cross-sectional view of the semiconductor substrate portion of FIG. 20A along line C-C.

FIGS. 20A to 20C show a second dopant mask 820 obtained by removing the top mask layer 814 of FIGS. 19B and 19C. The second dopant mask 820 includes the recessed portion of the mask base layer 812 of the first dopant mask 810 of FIGS. 19A to 19C.

Second mask openings 825 of the second dopant mask 820 are wider than the first mask openings 815 of the first dopant mask 810 illustrated in FIGS. 18A to 18C by twice the lateral recess width RC. A longitudinal center axis of a second mask opening 825 coincides with the longitudinal center axis of the corresponding first mask opening 815 as illustrated in FIG. 14A.

Dopants of the second conductivity type are implanted through the second mask openings 825 into the semiconductor substrate 700 to form body implant zones 720. The implant overlaps with the previously formed source implant zones 710 and pinning implant zones 740, wherein the implant increases the net dopant concentration in the pinning implant zones 740 and decreases to some degree the net dopant concentration in the source implant zones 710.

FIGS. 21B and 21C show body implant zones 720 that embed a plurality of source implant zones 710 and pinning implant zones 740 that alternate along the first horizontal direction 191. A vertical extension of the body implant zones 720 is greater than a vertical extension of the source implant zones 710 and may be equal to, greater than or smaller than a vertical extension of the pinning implant zones 740.

The second dopant mask 820 is removed. A heat treatment may activate the implanted dopants. An etch mask layer or layer stack may be deposited and patterned by photolithography to form a gate trench etch mask 850 on the main surface 701.

Figure 22A:
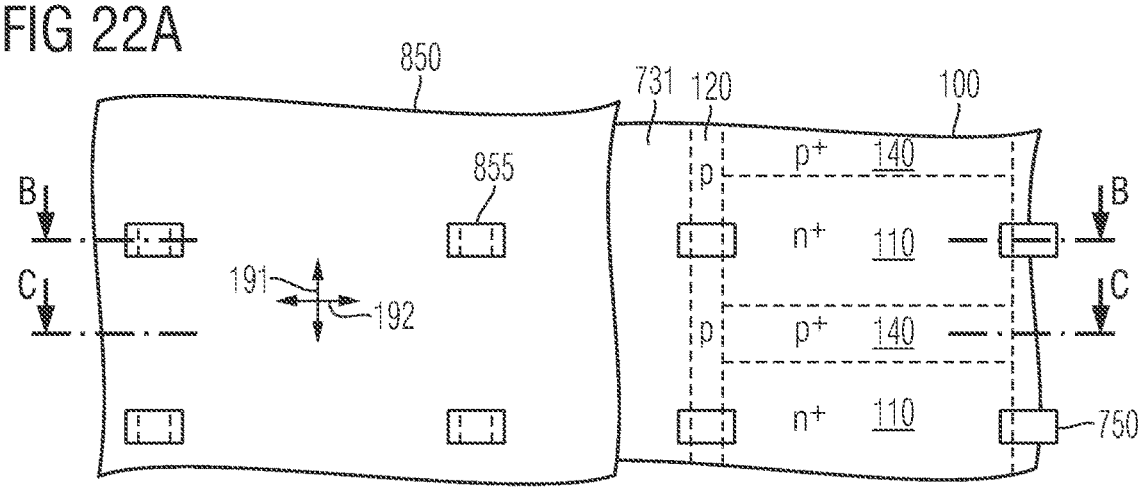
FIG. 22A is a schematic plan view of the semiconductor substrate portion of FIG. 21A, after forming gate trenches.
Figure 22B:
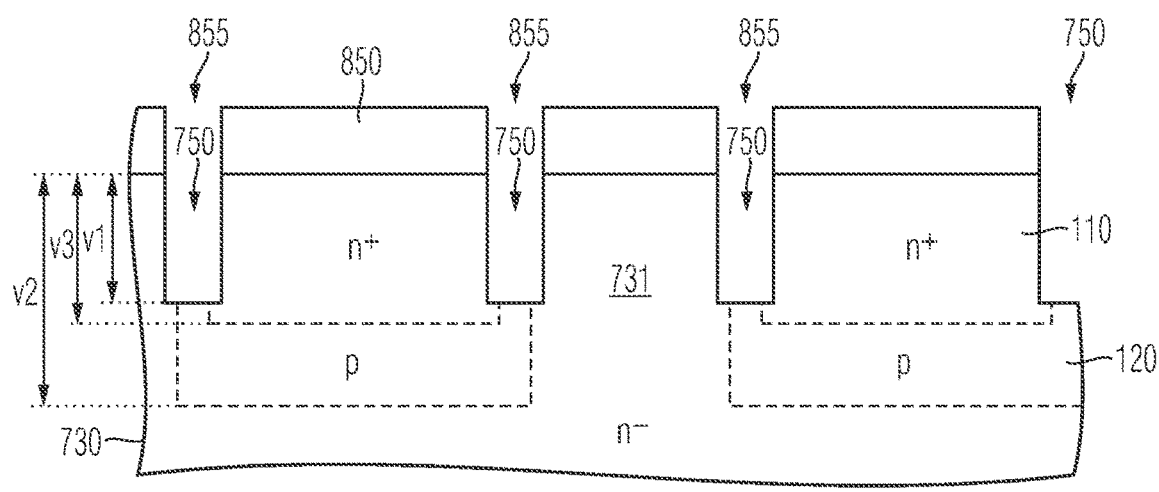
FIG. 22B is a schematic vertical cross-sectional view of the semiconductor substrate portion of FIG. 22A along line B-B.
Figure 22C:
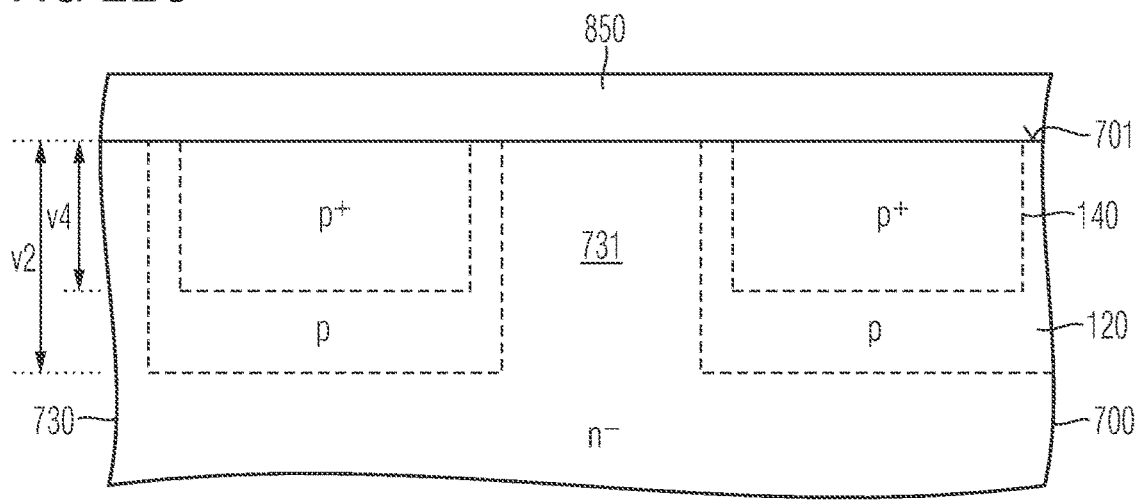
FIG. 22C is a schematic vertical cross-sectional view of the semiconductor substrate portion of FIG. 22A along line C-C.

FIGS. 22A to 22C show source regions 110 obtained from the source implant zones 710, body regions 120 obtained from the body implant zones 720, and pinning regions 140 obtained from the pinning implant zones 740 of FIGS. 21A to 21C by the heat treatment. Due to the low effective diffusion coefficients for dopants in silicon carbide, the heat treatment does not result in significant interdiffusion along the pn junctions between the source regions 110 and the body regions 120.

FIG. 22A shows the gate trench etch mask 850 with trench mask openings 855 arranged in lines along the second horizontal direction 192 and in columns along the first horizontal direction 191.

FIG. 22B shows gate trenches 750 extending in the vertical projection of the trench mask openings 855 in the gate trench etch mask 850 into the semiconductor substrate 700. The gate trenches 750 laterally extend from a column portion 731 of the drift layer 730 between neighboring body regions 120 into the neighboring source region 110.

A vertical extension v2 of the body regions 120 is greater than a vertical extension v3 of the source regions 110 and may be equal to, greater than or smaller than a vertical extension v4 of the pinning regions 140.

The gate trench etch mask 850 may be removed. A gate dielectric liner 751 may be formed, for example by low-pressure chemical vapor deposition of TEOS and a heat treatment in an atmosphere containing at least one of nitrogen and oxygen. Gate electrode material, for example, polycrystalline silicon may be deposited to fill the gate trenches 750. Portions of the gate electrode material deposited outside the gate trenches 750 may be removed. Removal of the gate electrode material may include a dry etch process, a chemical mechanical polishing, or a combination of both.

According to another embodiment portions of the gate electrode material deposited outside the semiconductor substrate 700 may be patterned by photolithography to form gate connection lines that connect portions of the gate electrode 155 in trench gate structures 150 arranged along the first horizontal direction 191.

A dopant concentration in the current spread regions 131 may be equal to that in the drift layer zone 135 or higher. For example, the current spread region 131 and the drift zone 135 may result from different epitaxy processes or a further high-energy implant prior to the heating treatment for dopant activation may increase the dopant concentration in the current spread regions 131.

Figure 23A:
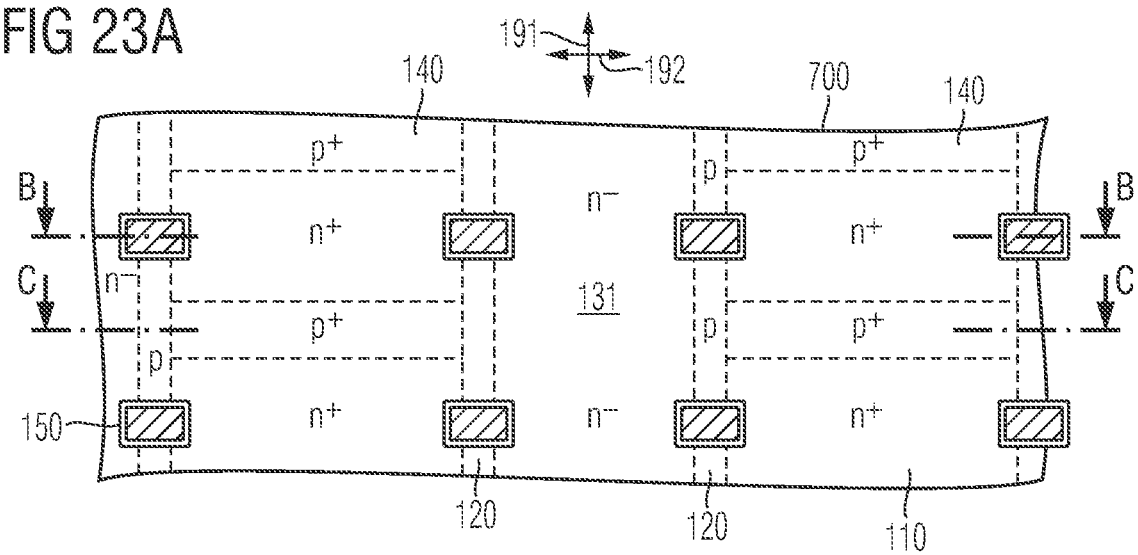
FIG. 23A is a schematic plan view of the semiconductor substrate portion of FIG. 22A, after forming a gate electrode in the gate trenches.
Figure 23B:
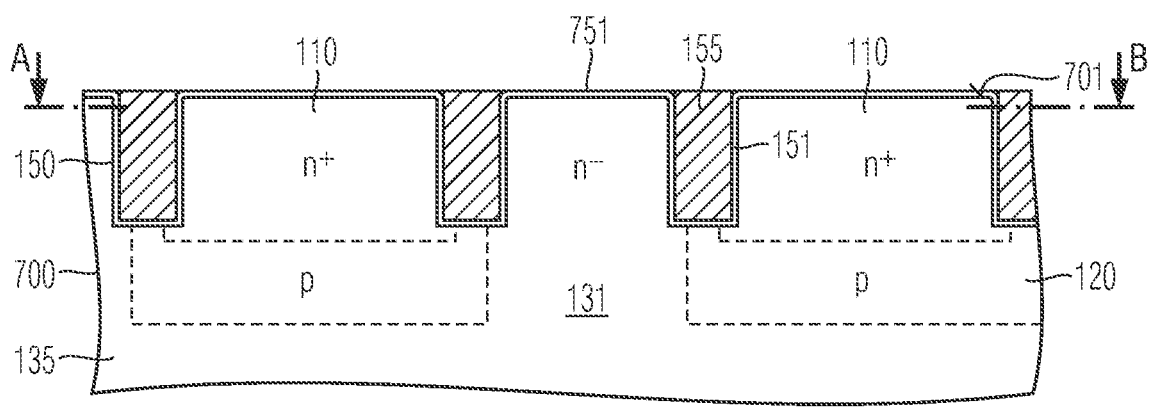
FIG. 23B is a schematic vertical cross-sectional view of the semiconductor substrate portion of FIG. 23A along line B-B.
Figure 23C:
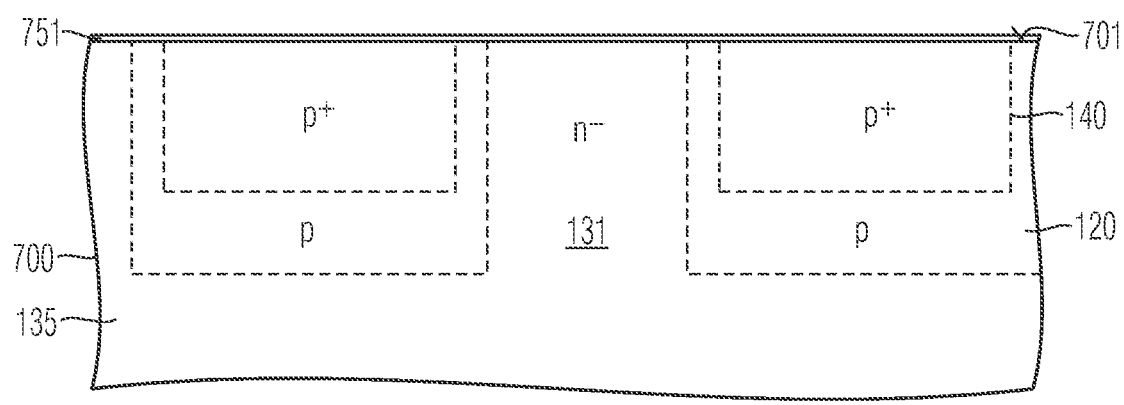
FIG. 23C is a schematic vertical cross-sectional view of the semiconductor substrate portion of FIG. 23A along line C-C.

FIGS. 23A to 23C show the gate dielectric liner 751 covering the main surface 701 and lining sidewalls of the gate trenches 750. Portions of the gate dielectric liner 751 lining the gate trenches 750 form a gate dielectric 151. Gate electrode material in the gate trenches 750 forms a gate electrode 155. Column portions of the drift layer 730 between neighboring body regions 120 form current spread regions 131. A remaining portion of the drift layer 730 of FIGS. 18A to 18C forms a drift zone 135 below the body regions 120.

As outlined above, the distance between the current spread regions 131 and the source regions 110 defines a channel length. Since the channel length is defined by one single photolithographic process, the method results in a highly uniform distribution of channel length and uniform transistor characteristics across a plurality of semiconductor substrates 700.

One or more dielectric and auxiliary materials may be deposited on the gate dielectric liner 751 to form a layer stack. A photoresist layer may be deposited on the layer stack and may be patterned by photolithography to form a source contact mask 860.

Figure 24A:
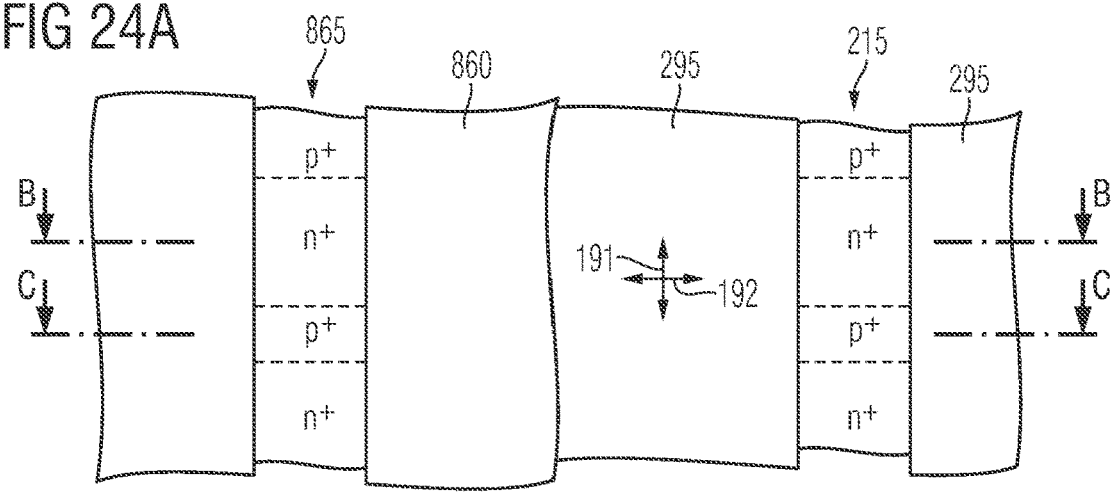
FIG. 24A is a schematic plan view of the semiconductor substrate portion of FIG. 23A, after forming openings in an interlayer dielectric.

FIG. 24A shows stripe-shaped contact mask openings 865 in the source contact mask 860, wherein longitudinal axes of the contact mask openings 865 extend along the first horizontal direction 191. Contact openings 215 in the layer stack above the main surface 701 are formed in the vertical projection of the contact mask openings 865 in the source contact mask 860. The contact openings 215 in the layer stack alternatingly expose portions of the source regions 110 and the pinning regions 140 along the first horizontal direction 191.

Figure 24B:
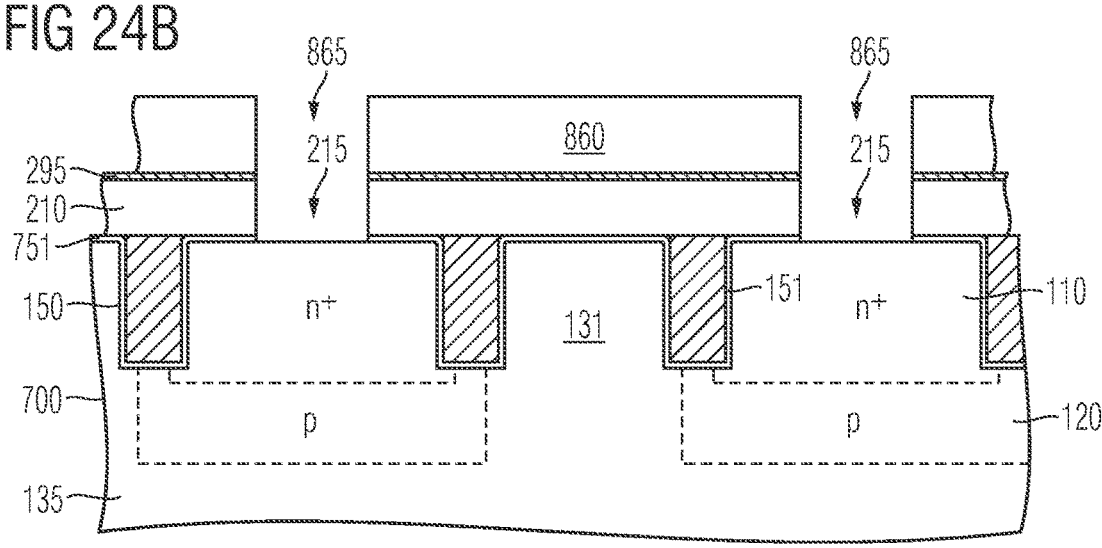
FIG. 24B is a schematic vertical cross-sectional view of the semiconductor substrate portion of FIG. 24A along line B-B.
Figure 24C:
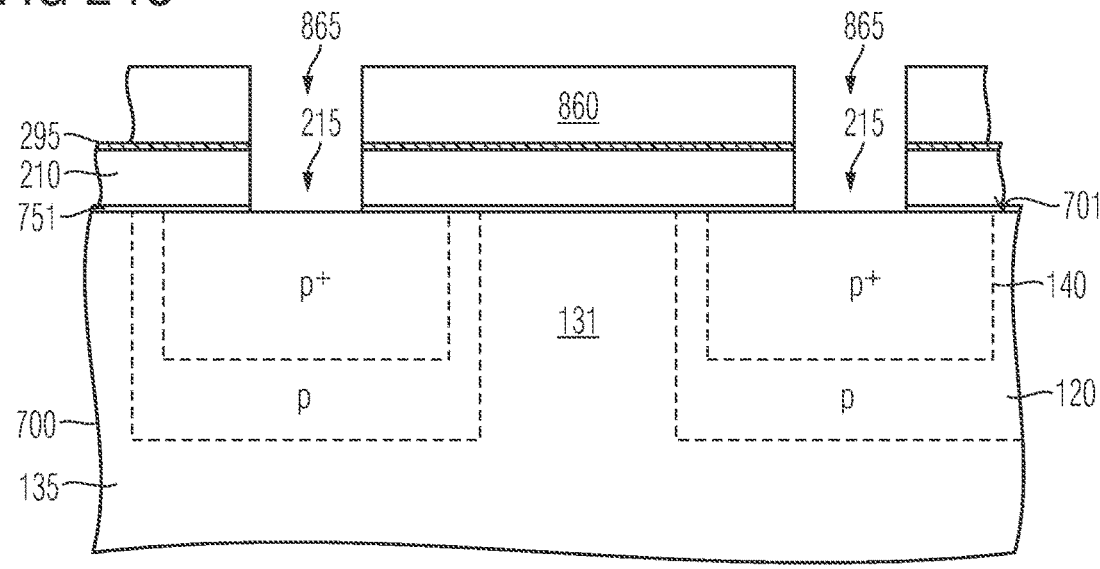
FIG. 24C is a schematic vertical cross-sectional view of the semiconductor substrate portion of FIG. 24A along line C-C.

FIGS. 24B and 24C show the layer stack that includes the gate dielectric liner 751, a dielectric layer structure 210 and a protection layer 295. The dielectric layer structure 210 may include at least one of a silicon oxide based on the deposition of TEOS and silicate glass, for example, PSG (phosphorous silicate glass). The protection layer 295 may include at least one layer from silicon nitride, titanium nitride and carbon, by way of example.

A metal layer may be deposited, for example a layer containing at least one of nickel (Ni) and aluminum (Al). A pre-silicidation heat treatment may locally transform the phase of the deposited metal into a transitional phase of a metal silicide, wherein the protection layer 295 may protect the dielectric layer structure 210 against degradation. Unreacted metal and the protection layer 295 may be removed. A further heat treatment may transform the transitional phase of the metal silicide into a thin contact layer 311 formed exclusively at the exposed portions of the main surface 701.

A further layer or layer stack including conductive materials such as metals, for example, at least one of aluminum, copper, tungsten, titanium and titanium nitride may be deposited and patterned by photolithography to form a first load electrode 310.

Figure 25A:
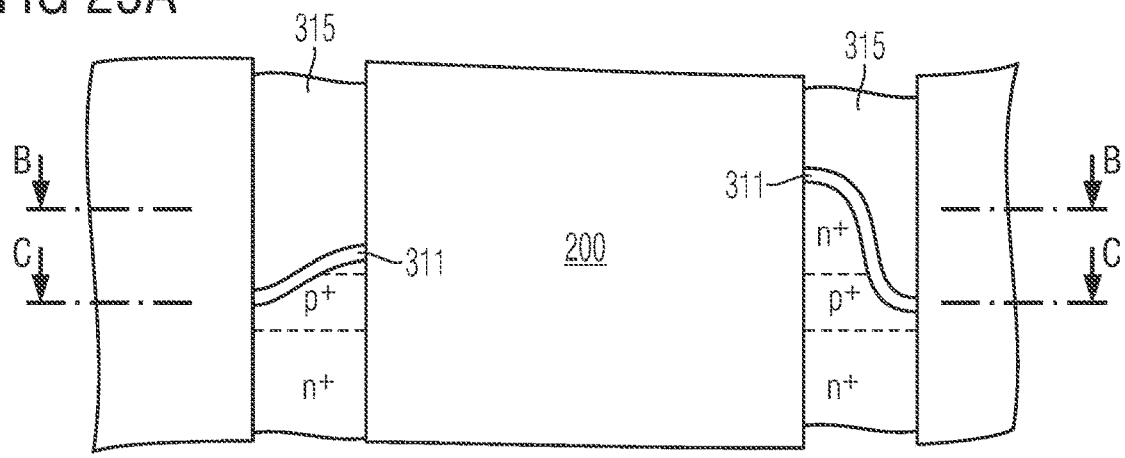
FIG. 25A is a schematic horizontal cross-sectional view of the semiconductor substrate portion of FIG. 24A along a plane parallel to the main surface, after forming a first load electrode and planar source contact structures.
Figure 25B:
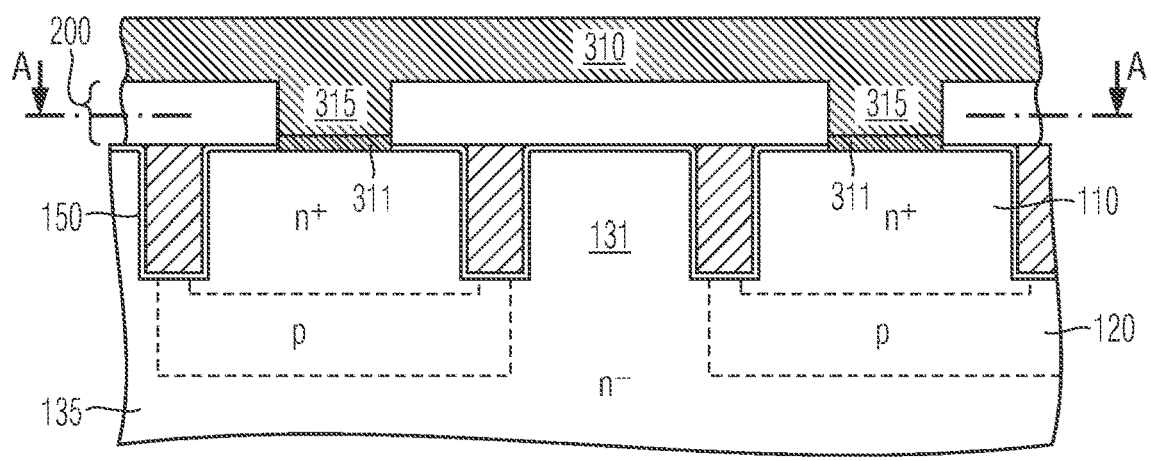
FIG. 25B is a schematic vertical cross-sectional view of the semiconductor substrate portion of FIG. 25A along line B-B.
Figure 25C:
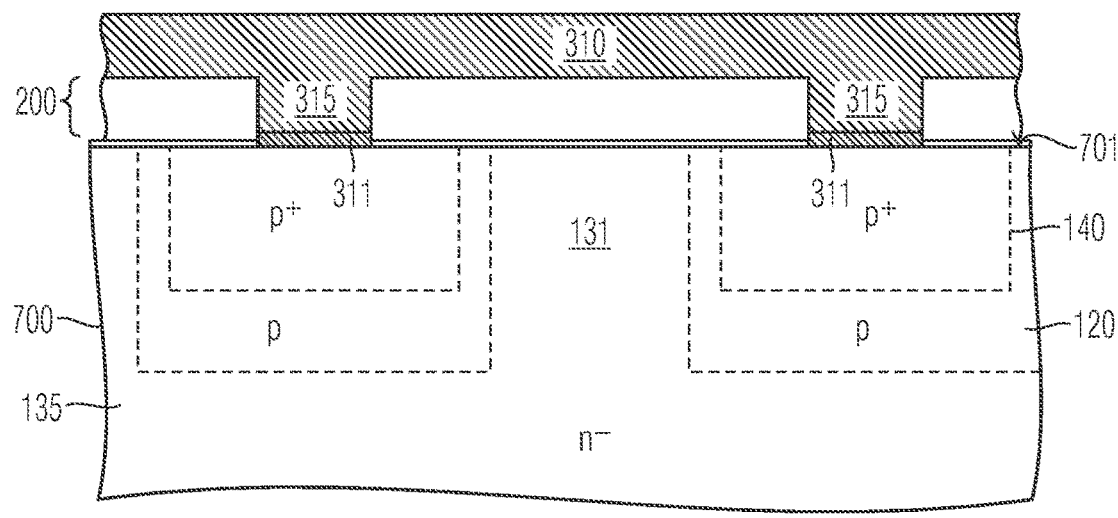
FIG. 25C is a schematic vertical cross-sectional view of the semiconductor substrate portion of FIG. 25A along line C-C.

FIGS. 25A to 25C show the first load electrode 310 as well as source contact structures 315 extending through openings in an interlayer dielectric 200 that may include remnant portions of the dielectric layer structure 210 and portions of the gate dielectric liner 751 of FIGS. 24B to 24C. The source contact structures 315 electrically connect the first load electrode 310 with both the source regions 110 and the pinning regions 140. The source contact structures 315 include a contact layer 311 forming low-resistive contacts with the source regions 110 and with the pinning regions 140. The contact layer 311 may include a silicide, e.g., a nickel silicide.

Figure 26A:
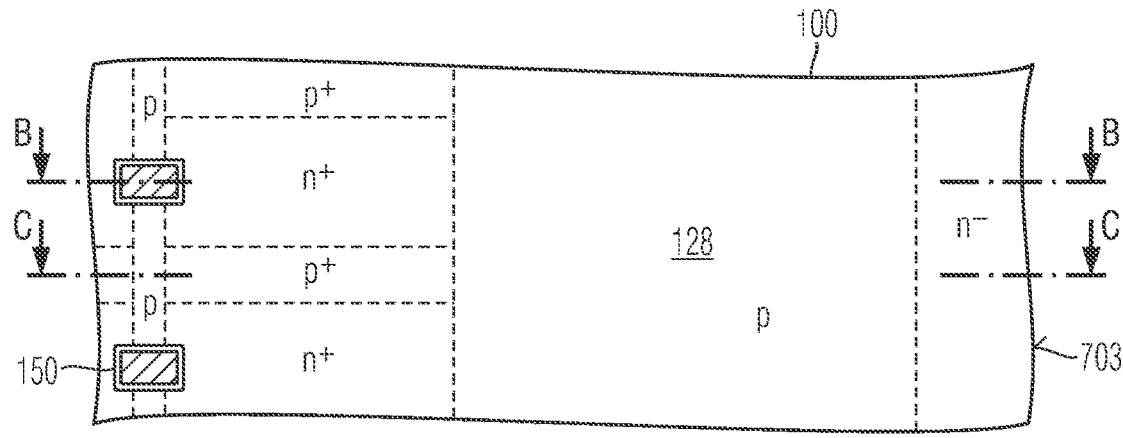
FIG. 26A is a schematic horizontal cross-sectional view of another portion of the semiconductor substrate of FIG. 25A in a termination area of a device region.
Figure 26B:
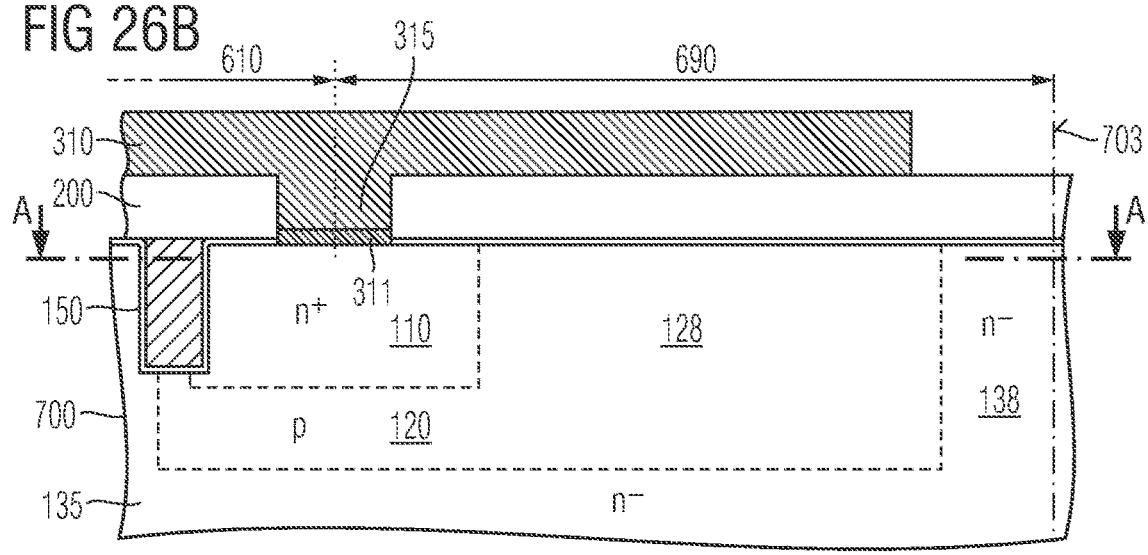
FIG. 26B is a schematic vertical cross-sectional view of the semiconductor substrate portion of FIG. 26A along line B-B.
Figure 26C:
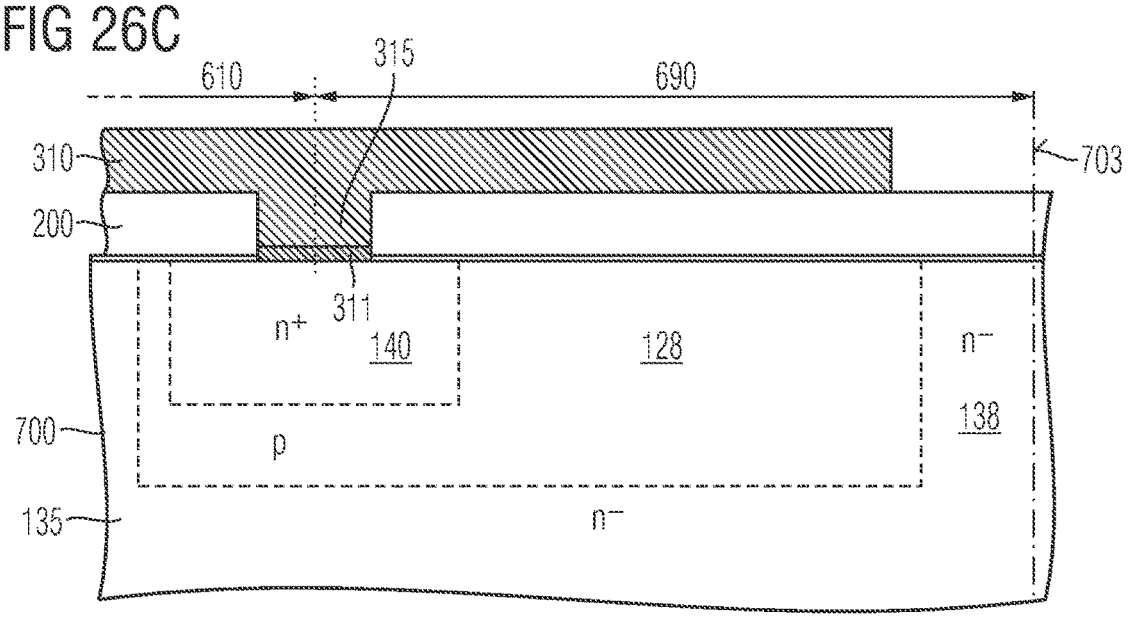
FIG. 26C is a schematic vertical cross-sectional view of the semiconductor substrate portion of FIG. 26A along line C-C.

FIGS. 26A to 26C refer to a termination construction in a termination area 690 between a cell area 610 including a plurality of transistor cells oriented along the trench gate structures 150 and a lateral edge 703 of a semiconductor die defined in the semiconductor substrate 700. The outermost body region 120 may include a junction termination portion 128 that directly adjoins the main surface 701 and which may be significantly wider than a body region 120 within the cell area 610. An outermost source contact structure 315 may be formed between the outermost trench gate structure 150 and the lateral edge 703. An n-type column 138 may separate the junction termination portion 128 from the lateral edge 703.

Figure 27A:
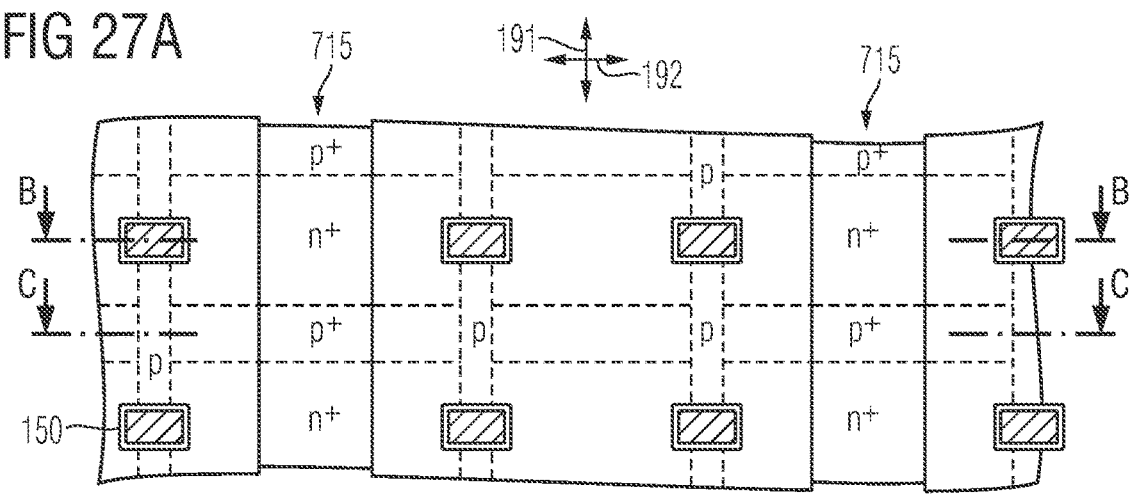
FIG. 27A is a schematic horizontal cross-sectional view of a portion of a semiconductor substrate for illustrating a method of manufacturing semiconductor devices with source and pinning regions formed self-aligned to body regions according to an embodiment concerning deep source contact structures, after forming source contact trenches.
Figure 27B:
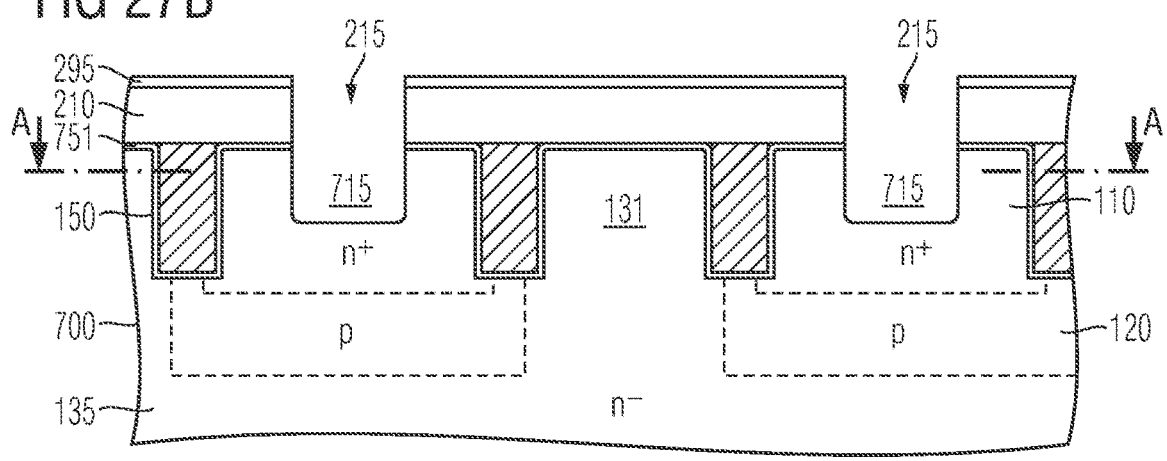
FIG. 27B is a schematic vertical cross-sectional view of the semiconductor substrate portion of FIG. 27A along line B-B.
Figure 27C:
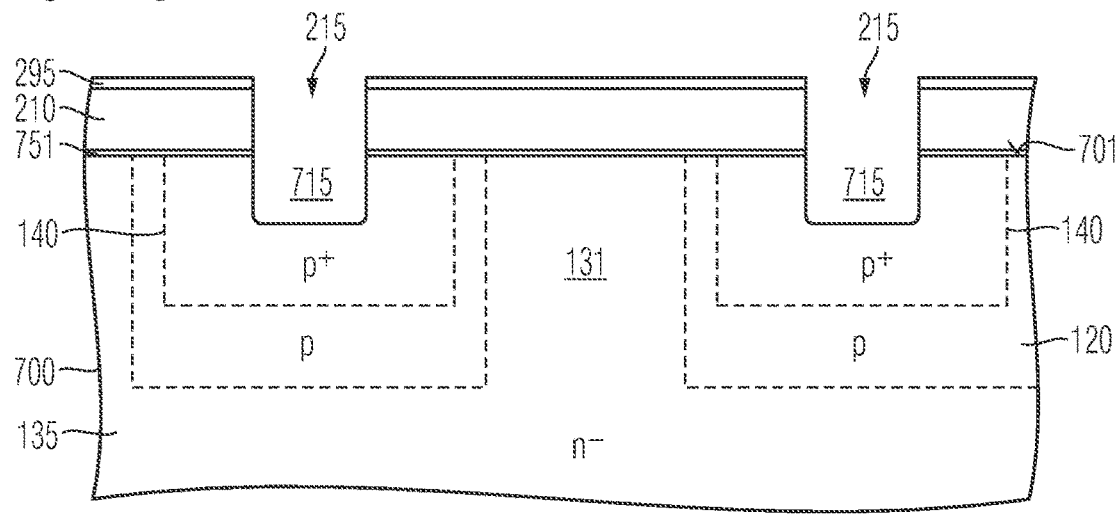
FIG. 27C is a schematic vertical cross-sectional view of the semiconductor substrate portion of FIG. 27A along line C-C.

FIGS. 27A to 27C relate to the formation of deep source contact structures 315 including a portion extending into the semiconductor substrate 700. Based on a source contact mask 860 as illustrated in FIGS. 24A to 24C contact openings 215 are formed in the interlayer dielectric 200 and source contact trenches 715 may be etched into the semiconductor substrate 700 in the vertical projection of the contact openings 215. After or prior to forming the source contact trenches 715 the source contact mask 860 is removed.

As illustrated in FIGS. 27B and 27C the source contact trenches 715 may be stripe-shaped with a horizontal longitudinal extension parallel to the first horizontal direction 191. A vertical extension of the source contact trenches 715 may be at least 50% of a vertical extension of the trench gate structures 150. The process may proceed as described with respect to FIGS. 25A to 25C.

Figure 28A:
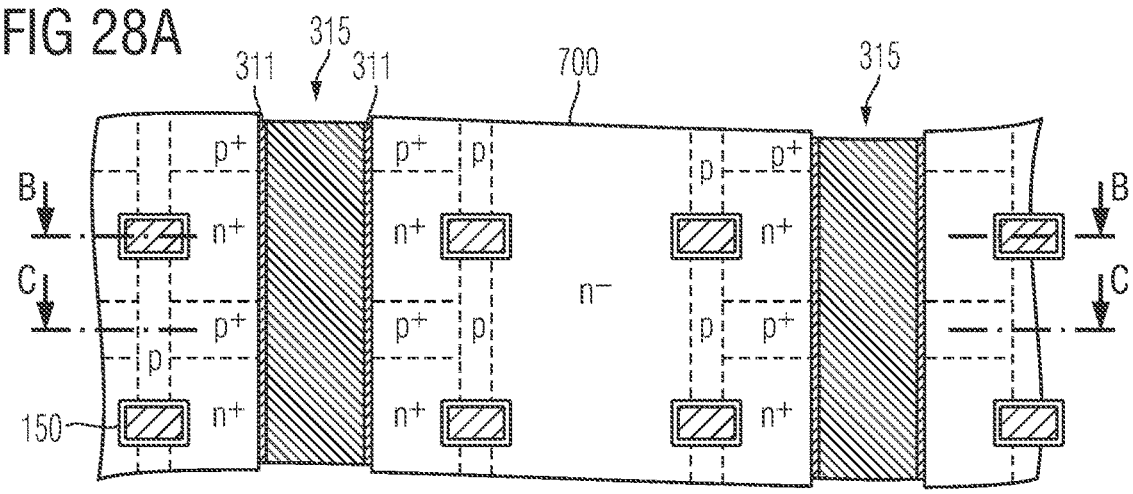
FIG. 28A is a schematic horizontal cross-sectional view of the semiconductor substrate portion of FIG. 27A, after forming a first load electrode structure and source contact structures extending into the semiconductor substrate.
Figure 28B:
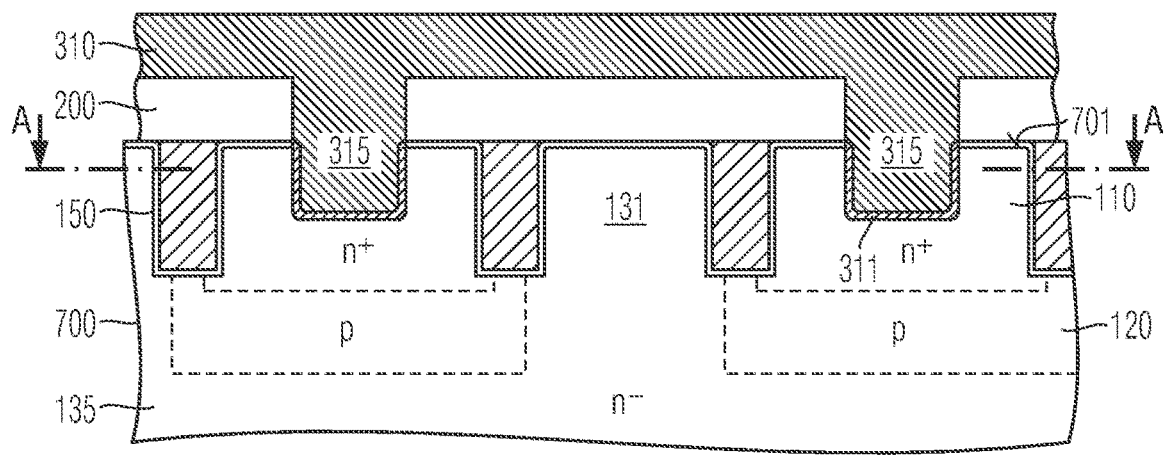
FIG. 28B is a schematic vertical cross-sectional view of the semiconductor substrate portion of FIG. 28A along line B-B.
Figure 28C:
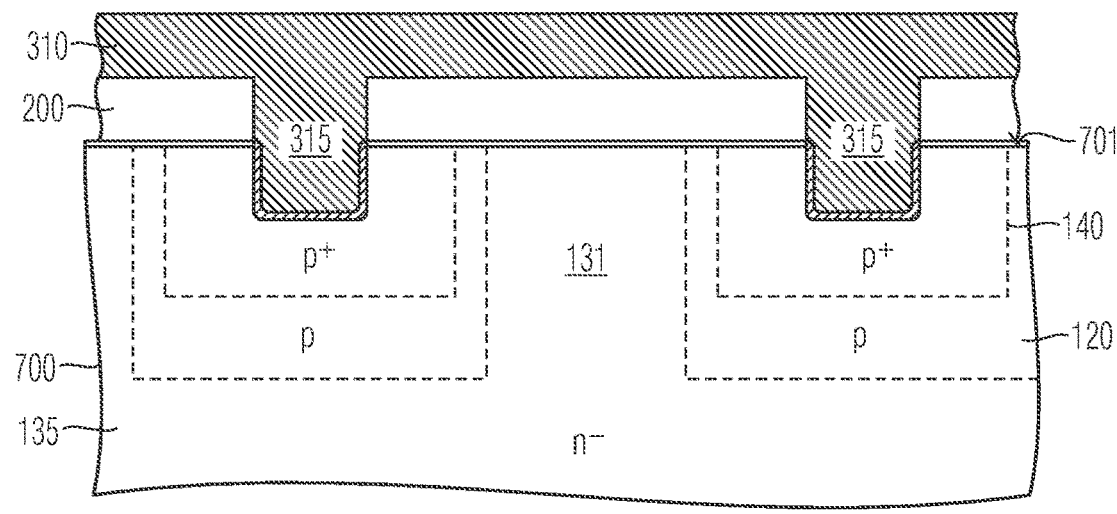
FIG. 28C is a schematic vertical cross-sectional view of the semiconductor substrate portion of FIG. 28A along line C-C.

According to FIGS. 28A to 28C a contact layer 311 including a metal silicide is formed both at the bottom of the source contact structures 315 and along sidewalls of the source contact structures 315.

Figure 29A:
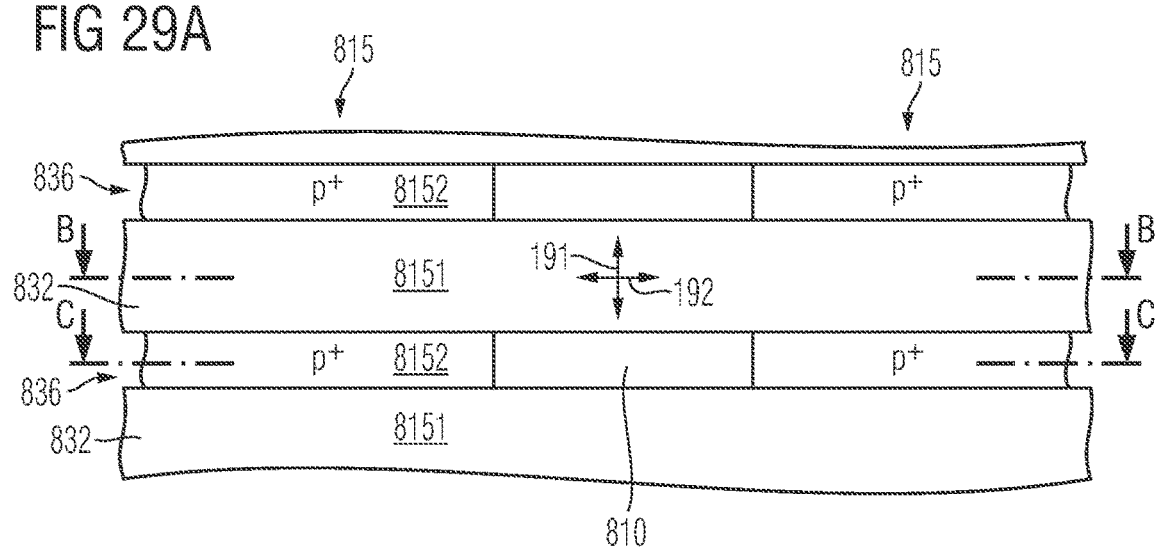
FIG. 29A is a schematic plan view of a portion of a semiconductor substrate for illustrating a method of manufacturing semiconductor devices with source and pinning regions formed self-aligned to body regions according to another embodiment related to deep pinning regions, after forming the deep pinning regions.
Figure 29B:
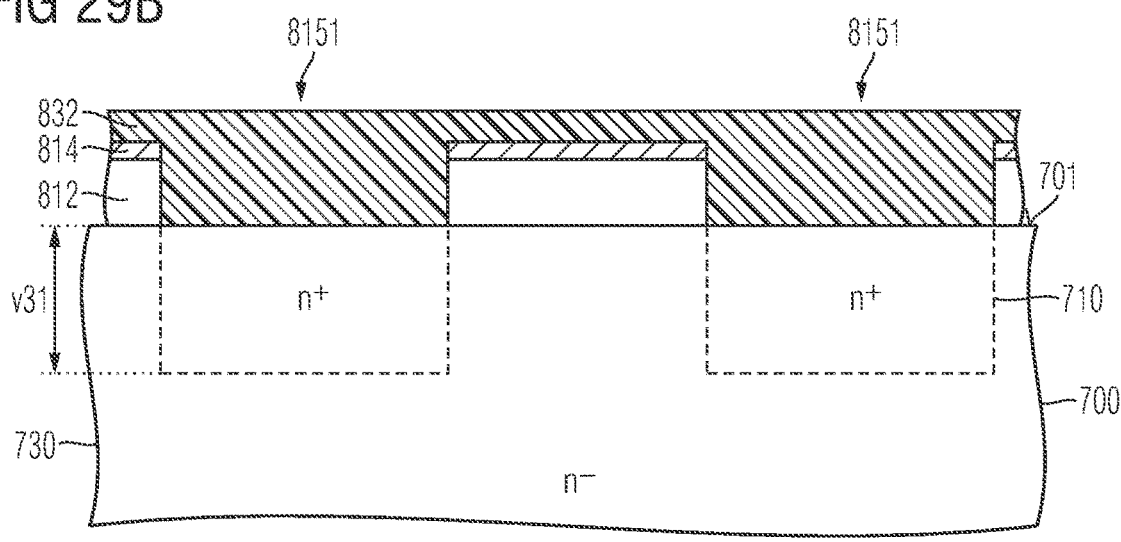
FIG. 29B is a schematic vertical cross-sectional view of the semiconductor substrate portion of FIG. 29A along line B-B.
Figure 29C:
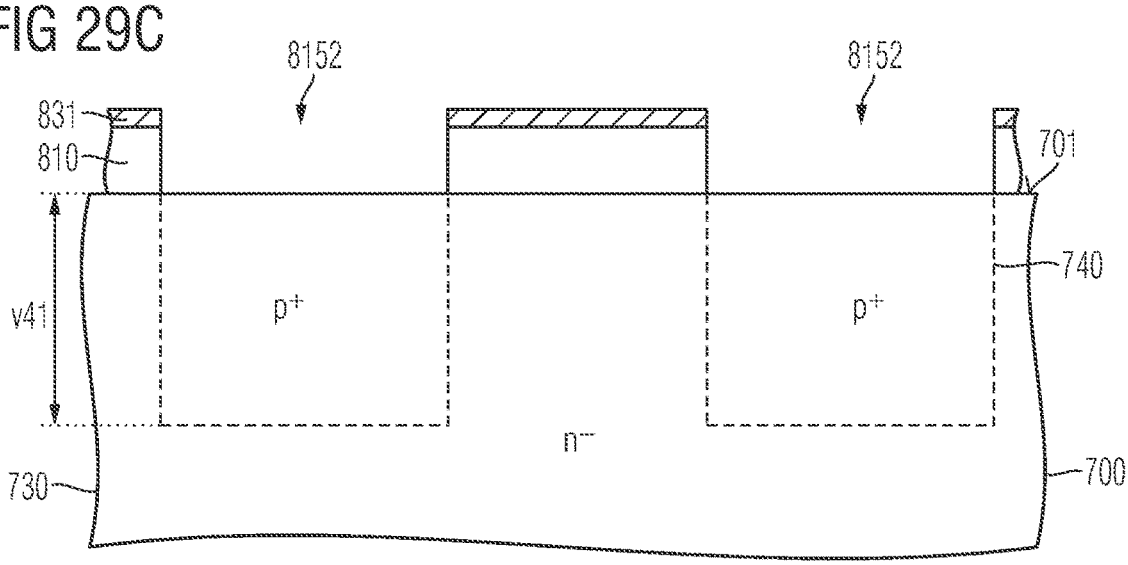
FIG. 29C is a schematic vertical cross-sectional view of the semiconductor substrate portion of FIG. 29A along line C-C.

FIGS. 29A to 29C refer to an alternative to the process described with reference to FIGS. 18A to 18C, wherein a vertical extension v41 of the pinning implant zone 740 is significantly greater than a vertical extension v31 of the source implant zone 710. For example, the vertical extension v41 of the pinning implant zone 740 may be greater than a vertical extension of the body implant zone 720 as illustrated in FIGS. 21B to 21C.

FIGS. 30A to 33C refer to a process in which self-alignment between the implants for the body implant zones 720 and the source implant zones 710 is achieved by a spacer process.

After epitaxy of the drift layer 730 a second dopant mask 820 for defining body regions is formed by photolithography and body implant zones 720 are formed in the vertical projection of second mask openings 825 in the second dopant mask 820.

Figure 30A:
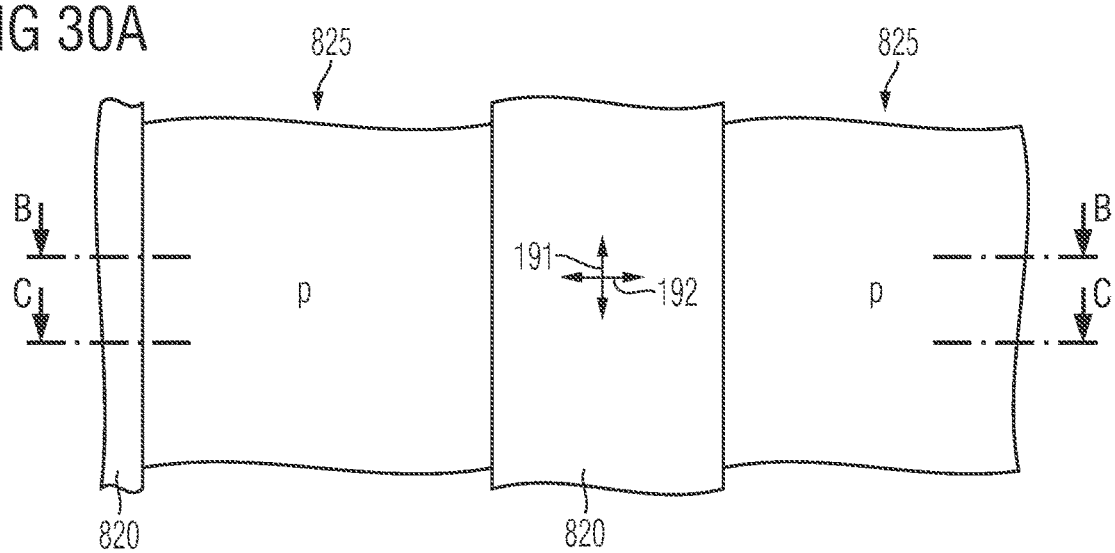
FIG. 30A is a schematic plan view of a portion of a semiconductor substrate for illustrating a method of manufacturing semiconductor devices with source and pinning regions formed self-aligned to body regions according to an embodiment including a spacer process, after forming body implant zones below second mask openings defining the body regions.
Figure 30B:
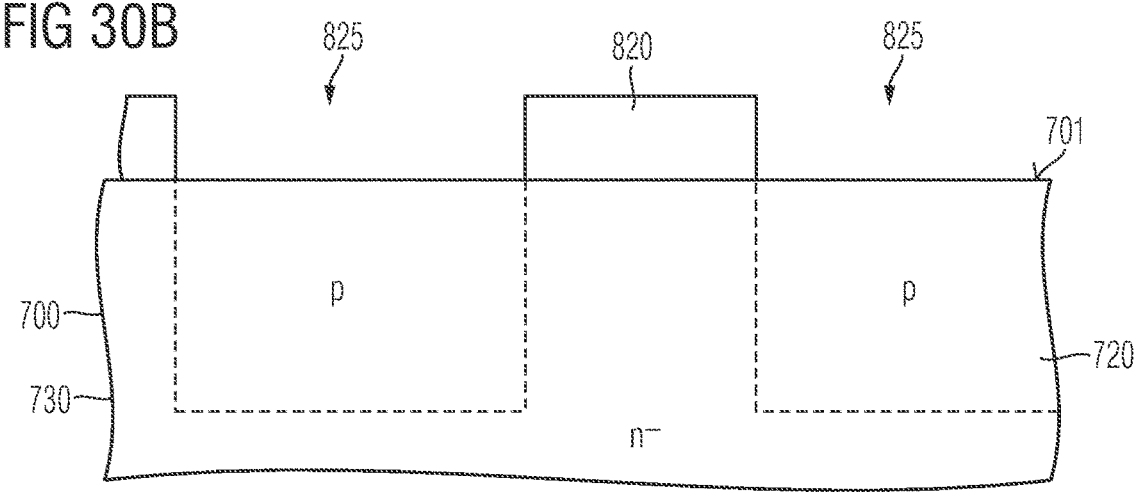
FIG. 30B is a schematic vertical cross-sectional view of the semiconductor substrate portion of FIG. 30A along line B-B.
Figure 30C:
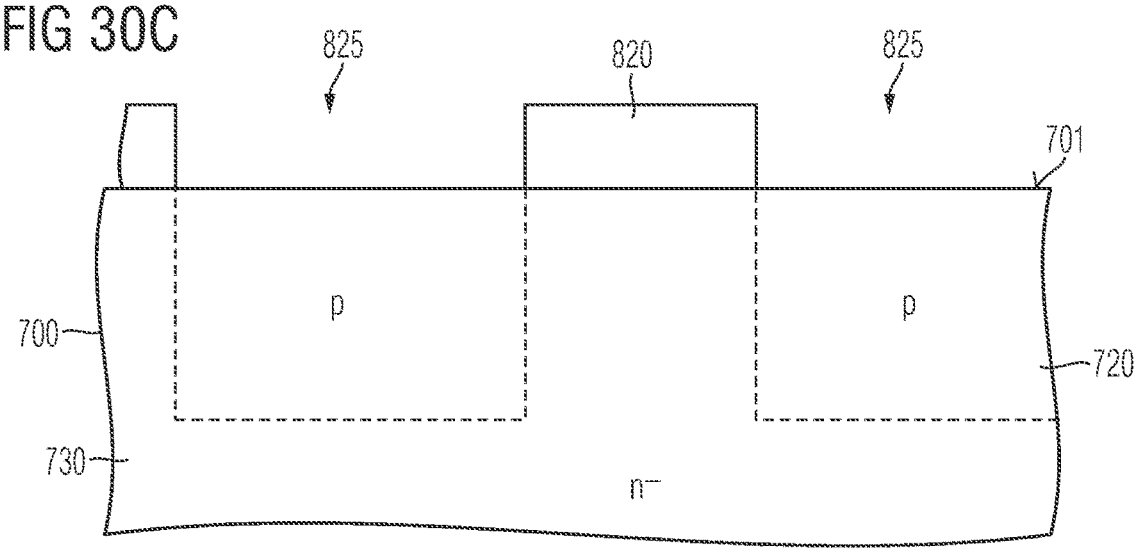
FIG. 30C is a schematic vertical cross-sectional view of the semiconductor substrate portion of FIG. 30A along line C-C.

FIGS. 30A to 30C show the second dopant mask 820 with stripe-shaped second mask openings 825, wherein longitudinal axes of the second mask openings 825 extend along a first horizontal direction 191. The body implant zones 720 are formed directly below the second mask openings 825.

A spacer structure 827 is formed along vertical sidewalls of the second mask openings 825. For example, a conformal layer of uniform thickness may be deposited and anisotropically etched, for example, by ion beam etching. A material of the spacer structure 827 may show high etch selectivity with respect to the material of the second dopant mask 820. For example, the spacer structure 827 may include carbon, polycrystalline silicon, silicon nitride, or a silicon oxide different from a silicon oxide of the second dopant mask 820.

Figure 31A:
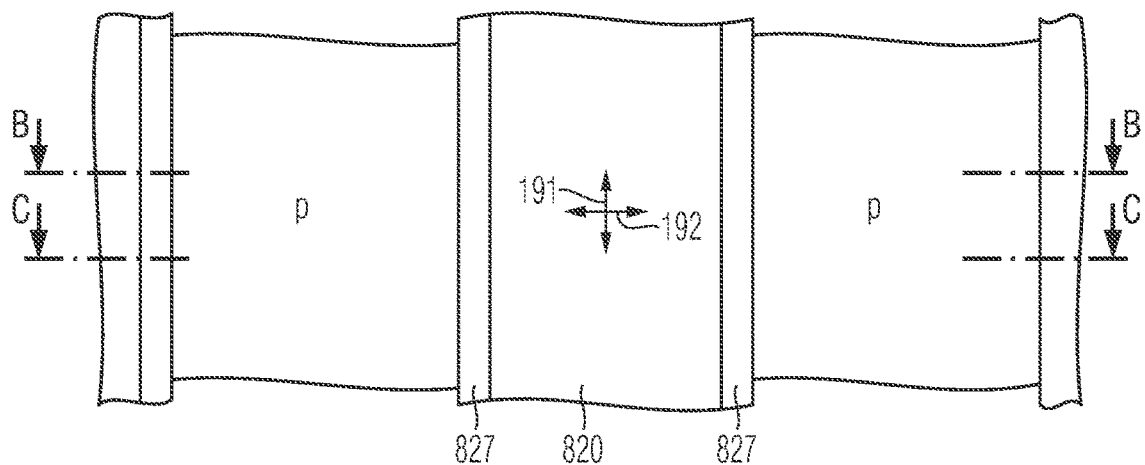
FIG. 31A is a schematic plan view of the semiconductor substrate portion of FIG. 30A, after forming spacer structures along sidewalls of the second mask openings to form first mask openings.
Figure 31B:
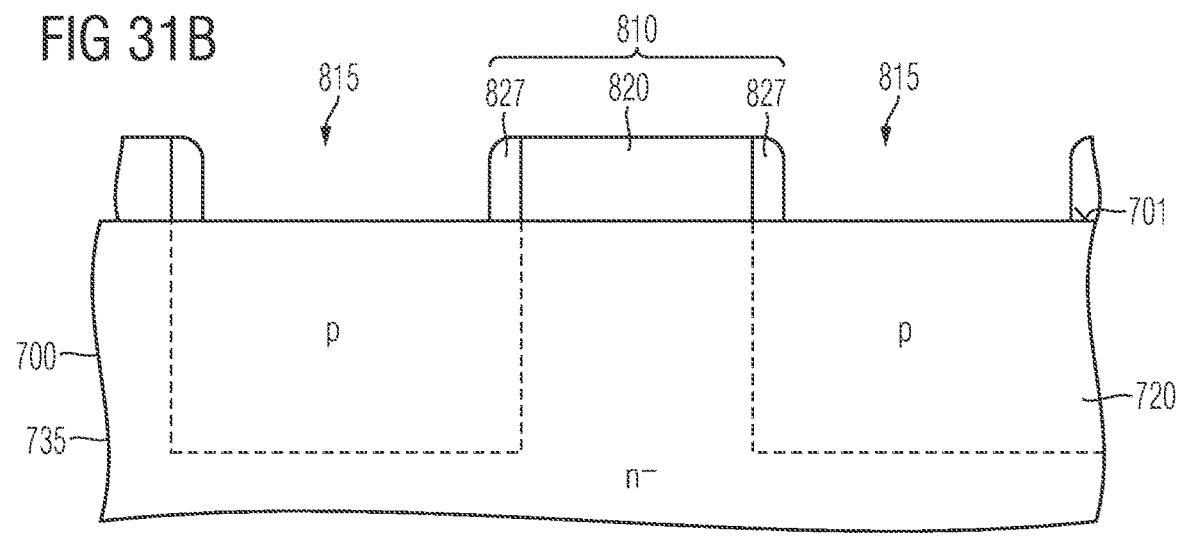
FIG. 31B is a schematic vertical cross-sectional view of the semiconductor substrate portion of FIG. 31A along line B-B.
Figure 31C:
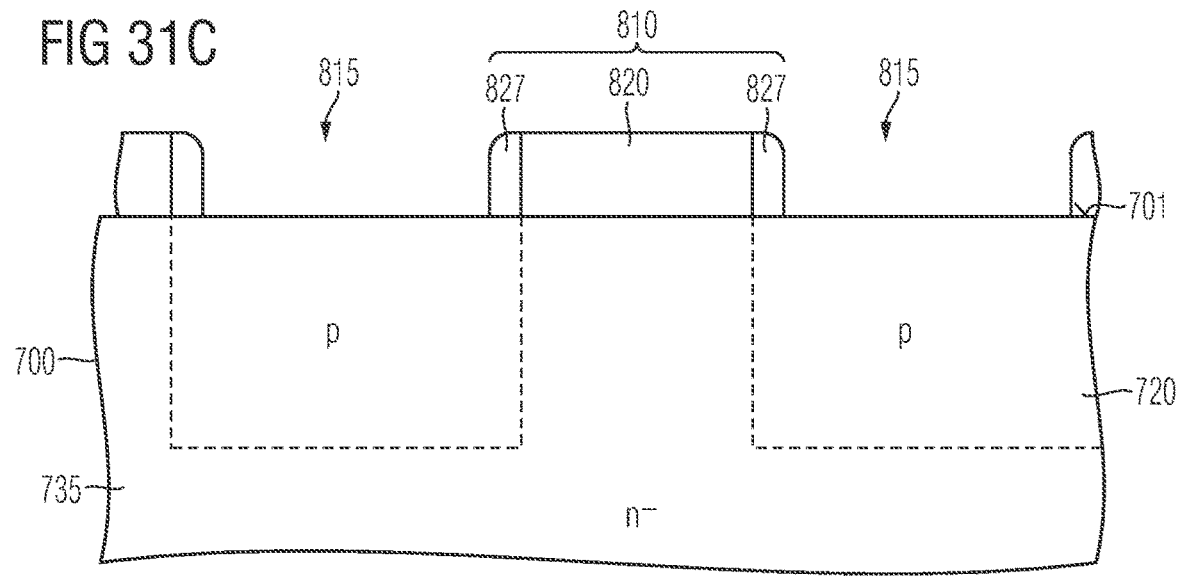
FIG. 31C is a schematic vertical cross-sectional view of the semiconductor substrate portion of FIG. 31A along line C-C.

As illustrated in FIGS. 31A to 31C a physical etch of a conformal layer results in spacer structures 827 extending along vertical sidewalls of the second dopant mask 820. The combination of the spacer structures 827 and the second dopant mask 820 forms a first dopant mask 810 including first mask openings 815 defining source and pinning regions.

A first selection mask 831 may be formed that covers second segments 8152 of the first mask openings 815. The first selection mask 831 includes first selection openings 835 extending along the second horizontal direction 192 and exposing first segments 8151 of the first mask openings 815. The first selection mask 831 and the first dopant mask 810 are used as combined implant mask for forming source implant zones 710.

Figure 32A:
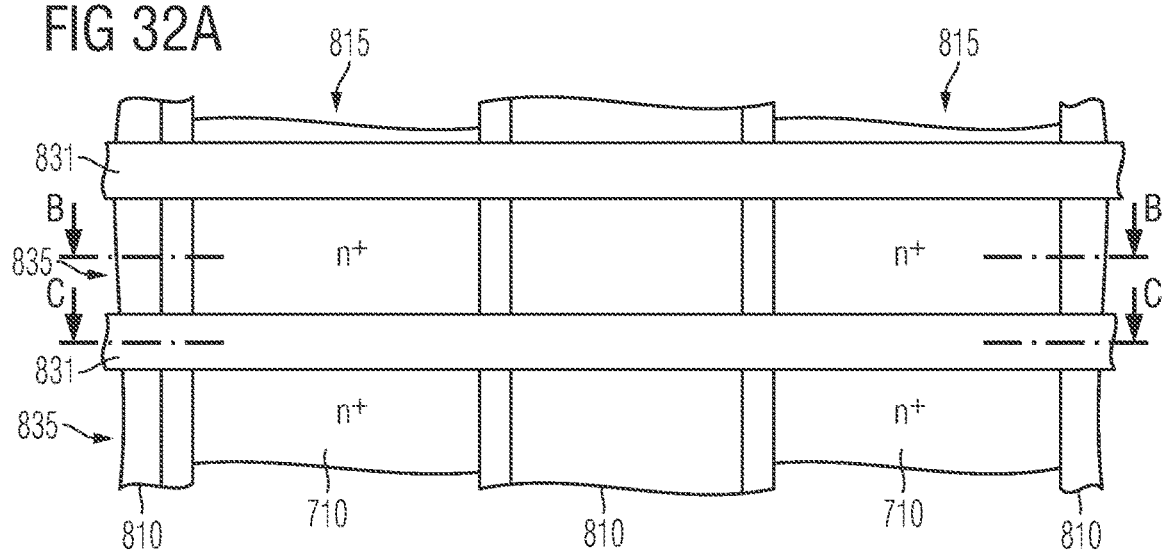
FIG. 32A is a schematic plan view of the semiconductor substrate portion of FIG. 31A, after forming source implant zones in first segments of the body implant zones.
Figure 32B:
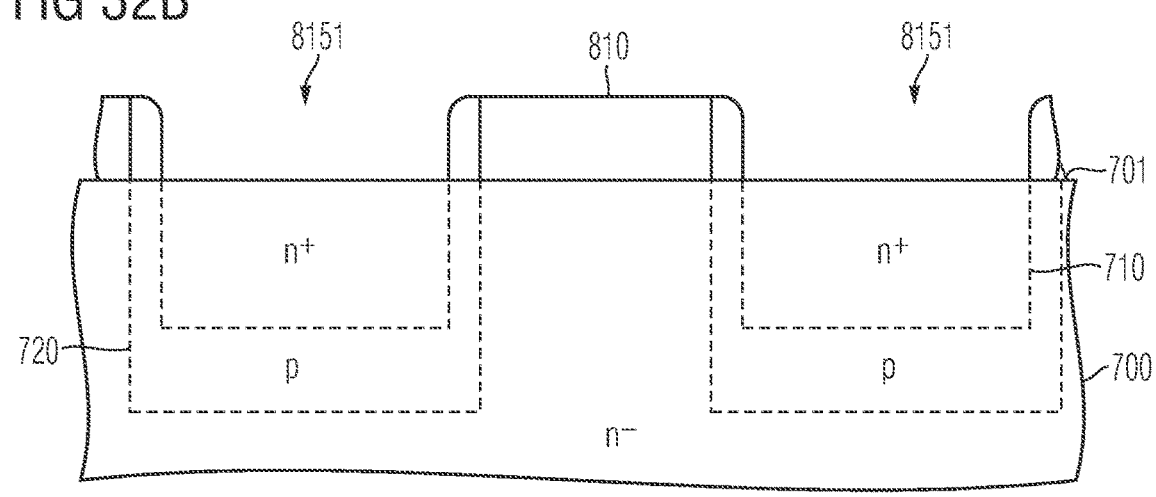
FIG. 32B is a schematic vertical cross-sectional view of the semiconductor substrate portion of FIG. 32A along line B-B.
Figure 32C:
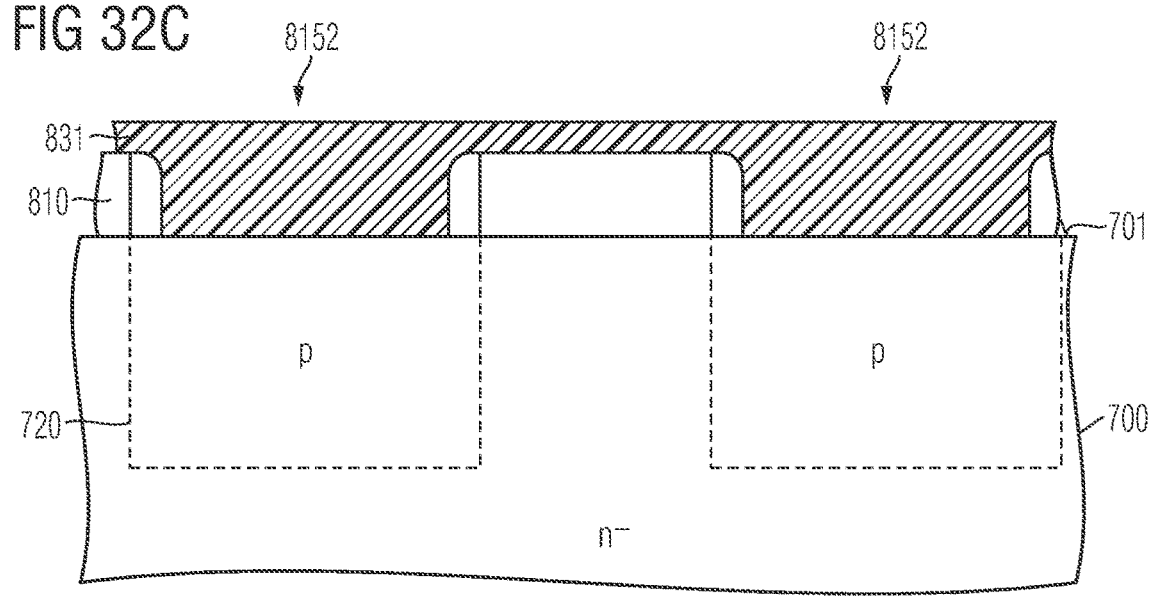
FIG. 32C is a schematic vertical cross-sectional view of the semiconductor substrate portion of FIG. 32A along line C-C.

FIGS. 32A to 32C show the first dopant mask 810 and the first selection mask 831 that covers second segments 8152 of the first mask openings 815. Source implant zones 710 are formed in portions of the body implant zones 720 directly below the first segments 8151 of the first mask openings 815.

The first selection mask 831 is replaced with a complementary second selection mask 832 covering the first segments 8151 of the first mask openings 815 and including second selection openings 836 exposing the second segments 8152. The second selection mask 832 and the first dopant mask 810 are used as combined implant mask for forming pinning implant zones 740.

Figure 33A:
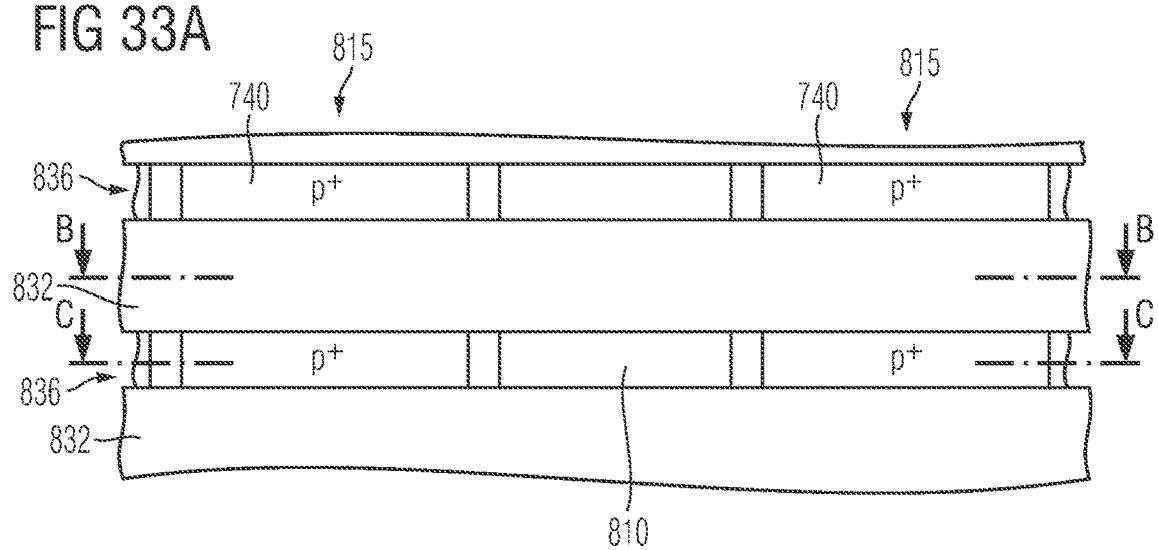
FIG. 33A is a schematic plan view of the semiconductor substrate portion of FIG. 32A, after forming pinning implant zones in second segments of the body implant zones.
Figure 33B:
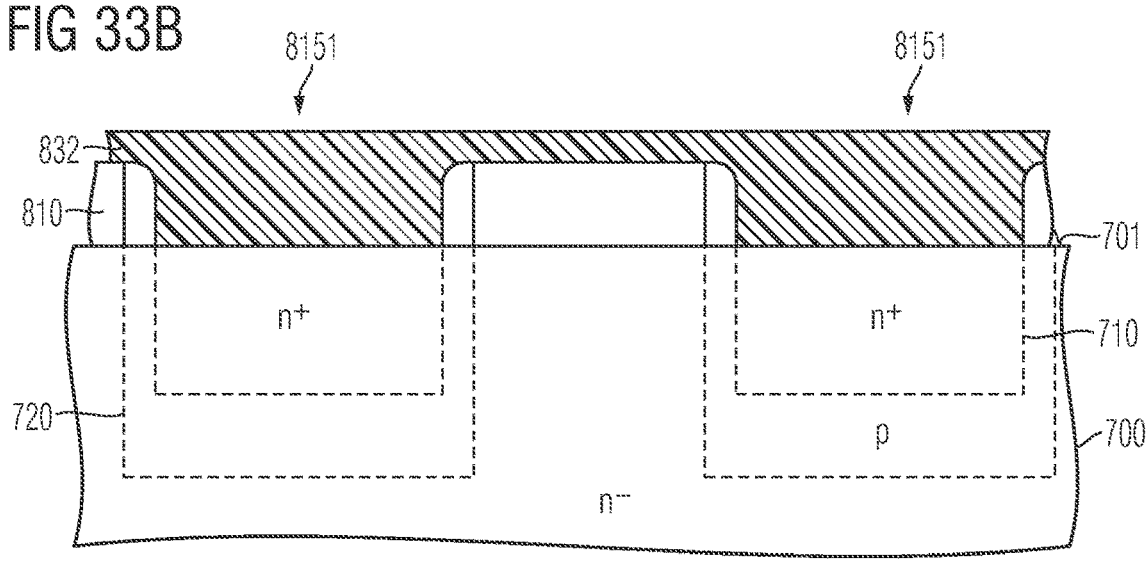
FIG. 33B is a schematic vertical cross-sectional view of the semiconductor substrate portion of FIG. 33A along line B-B.
Figure 33C:
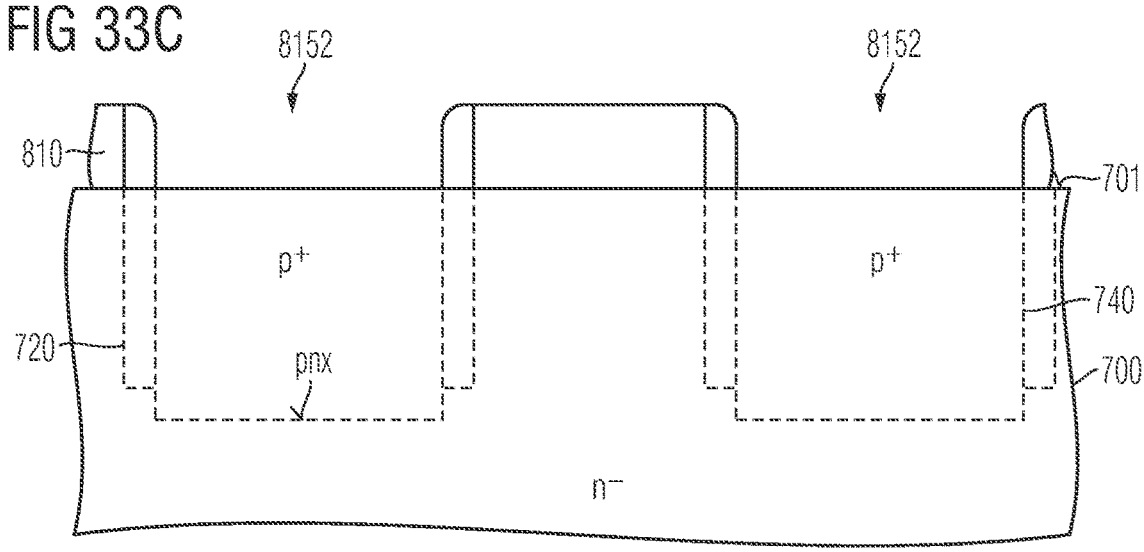
FIG. 33C is a schematic vertical cross-sectional view of the semiconductor substrate portion of FIG. 33A along line C-C.

As illustrated in FIGS. 33A to 33C the second selection mask 832 covers the first segments 8151 of the first mask openings 815 and the source implant zones 710. The pinning implant zones 740 are directly below the exposed second segments 8152 of the first mask openings 815. A vertical extension of the pinning implant zones 740 may be greater than a vertical extension of the body implant zone 720.

Figure 34A:
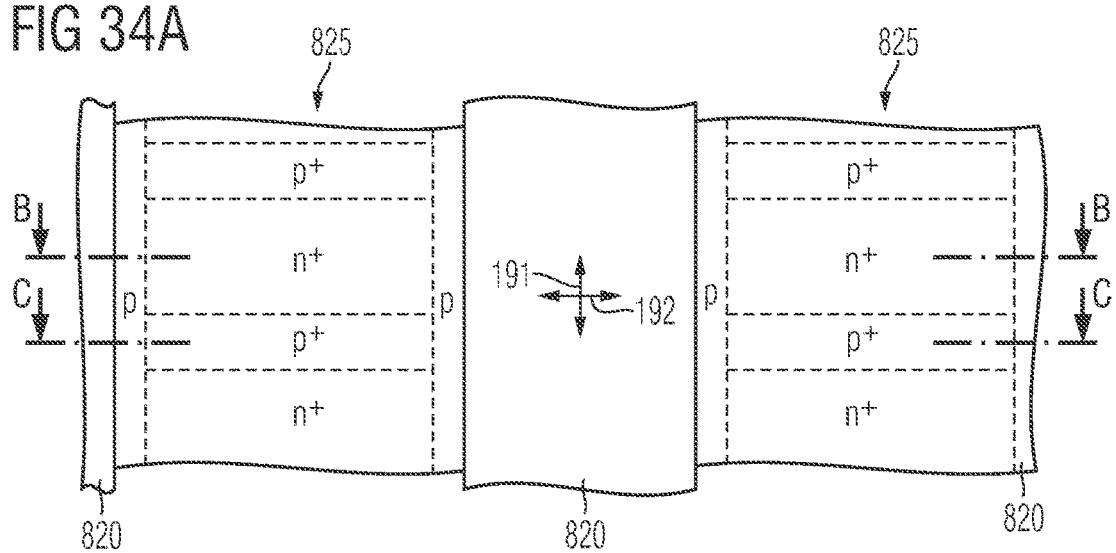
FIG. 34A is a schematic plan view of a portion of a semiconductor substrate for illustrating a method of manufacturing semiconductor devices with source and pinning regions formed self-aligned to body regions according to an embodiment concerning a multistep epitaxy process and deep body implant zones.
Figure 34B:
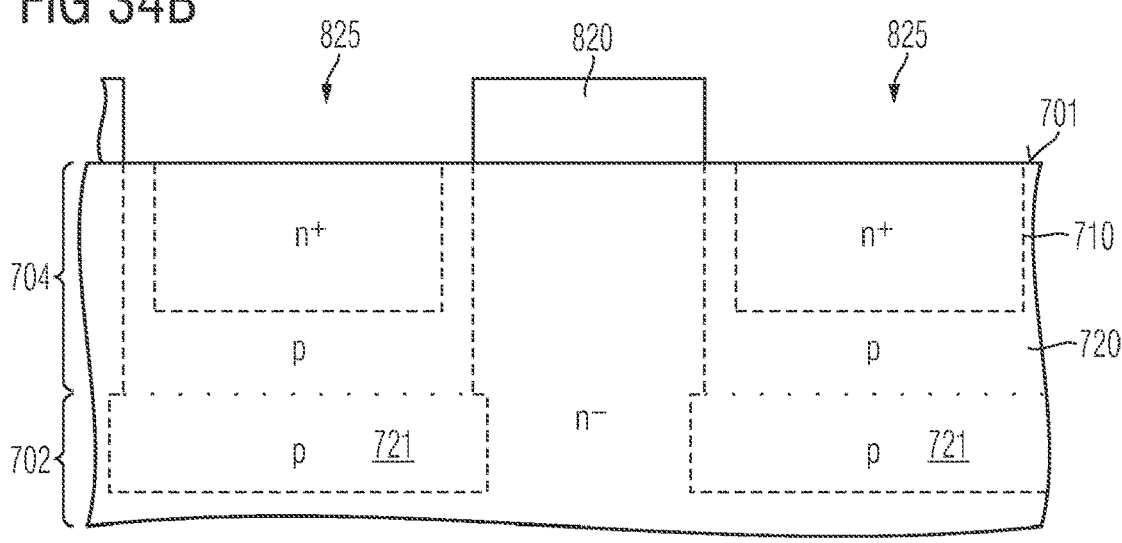
FIG. 34B is a schematic vertical cross-sectional view of the semiconductor substrate portion of FIG. 34A along line B-B.
Figure 34C:
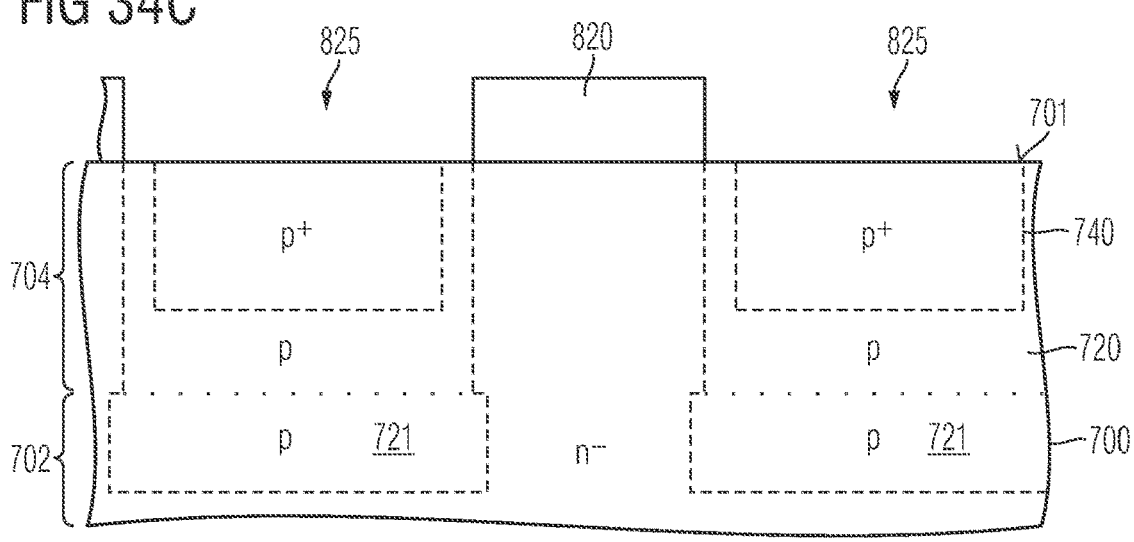
FIG. 34C is a schematic vertical cross-sectional view of the semiconductor substrate portion of FIG. 34A along line C-C.

FIGS. 34A to 34C refer to a further embodiment concerning a multi-step epitaxy process. A first epitaxial sublayer 702 is formed on a process surface of a base substrate. Deep body implant zones 721 are formed in the first epitaxial sublayer 702. A second epitaxial sublayer 704 is formed on the first epitaxial sublayer 702. Then body implant zones 720, pinning implant zones 740 and source implant zones 710 are formed in the second epitaxial sublayer 704 according to the above described embodiments, wherein the body implant zones 720 are formed directly above the deep body implant zones 721. A heat treatment activating the dopants forms body regions combining the body implant zones 720 and the deep body implant zones 721.

The multi-step epitaxy process facilitates deeper source regions and deeper gate trench structures such that the effective channel width of transistor cells can further be increased. Since the widths of the deep body implant zones 721 and the body implant zones 720 along the first horizontal direction 191 can be selected independently, design parameters for the shielding functionality can be decoupled from the cell pitch.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   trench gate structures comprising a gate electrode and extending from a first surface into a semiconductor body of silicon carbide and spaced apart from one another along a first horizontal direction;
   a body region with a longitudinal axis parallel to the first horizontal direction, wherein the trench gate structures extend into the body region, and wherein first sections of first pn junctions between the body region and a drift structure are tilted to the first surface and parallel to the first horizontal direction; and
   source regions forming second pn junctions with the body region,
   wherein a gate length of the gate electrode along a second horizontal direction orthogonal to the first horizontal direction is greater than a channel length between the first sections of the first pn junctions and the second pn junctions.

2. The semiconductor device of claim 1, wherein an aspect ratio between a vertical extension of the trench gate structures and a gate width of the trench gate structures along the first horizontal direction is greater one.

3. The semiconductor device of claim 1, wherein the drift structure comprises a drift zone at a distance to the first surface and a current spread region between the first surface and the drift zone, and wherein the current spread region forms the first sections of the first pn junctions.

4. The semiconductor device of claim 1, wherein a vertical extension of the body region is greater than a vertical extension of the trench gate structures.

5. The semiconductor device of claim 1, further comprising:
   a pinning region between a source contact structure and the drift zone, wherein the pinning region is electrically connected to the source contact structure and configured to pin an avalanche breakdown between the drift structure and the source contact structure at an auxiliary pn junction between the pinning region and the drift zone.

6. The semiconductor device of claim 5, wherein a dopant concentration in the pinning region is higher than in the body region.

7. The semiconductor device of claim 5, wherein the pinning region forms a $n/n^+$ or $p/p^+$ junction with the body region.

8. The semiconductor device of claim 5, wherein a distance between the auxiliary pn junction and the first surface is greater than a vertical extension of the body region.

9. The semiconductor device of claim 5, wherein the pinning region extends along a vertical direction orthogonal to the first surface from the source contact structure to the auxiliary pn junction.

10. The semiconductor device of claim 1, wherein the source contact structure is formed on the first surface.

11. The semiconductor device of claim 10, further comprising:
    body contact zones laterally directly connecting the body region with the source contact structure.

12. The semiconductor device of claim 1, wherein the source contact structure extends from the first surface into the semiconductor body.

13. The semiconductor device of claim 12, wherein a vertical extension of the source contact structure is at least 90% of a vertical extension of the trench gate structure.

14. The semiconductor device of claim 1, wherein a vertical extension of the source regions is at most 20% of a vertical extension of the trench gate structures.

15. The semiconductor device of claim 1, wherein a vertical extension of the source regions is at least 90% of a vertical extension of the trench gate structures.

16. The semiconductor device of claim 1, wherein the trench gate structures comprise a gate electrode, a gate dielectric separating the gate electrode from a body regions at a first side of the trench gate structures, and a separation dielectric separating the gate electrode from the body region at a second side of the trench gate structures, and wherein the separation dielectric is thicker than the gate dielectric.

17. The semiconductor device of claim 1, wherein the body region comprises passivation zones adjoining second sides of the trench gate structure and spaced apart from first sides of the trench gate structures, and wherein a net dopant concentration in the passivation zones is at least twice than high as in portions of the body region outside the passivation zones.

18. The semiconductor device of claim 17, wherein the passivation zones are directly connected to source contact structures.

19. The semiconductor device of claim 1, further comprising:
    a highly conductive auxiliary structure extending from the first surface into a portion of the drift structure forming the first sections of the first pn junctions.

20. The semiconductor device of claim 19, wherein a vertical extension of the auxiliary structure is at least 50% of a vertical extension of the trench gate structures.

21. The semiconductor device of claim 19, wherein a heavily doped portion of a current spread region directly adjoins the auxiliary structure.

22. The semiconductor device of claim 21, wherein the current spread region comprises a lightly doped portion between the body region and the heavily doped portion.

23. A semiconductor device, comprising:
    trench gate structures extending from a first surface into a semiconductor body of silicon carbide and spaced apart from one another along a first horizontal direction;
    a body region with a longitudinal axis parallel to the first horizontal direction, wherein the trench gate structures extend into the body region and wherein first sections of first pn junctions between the body region and a drift structure are tilted to the first surface and parallel to the first horizontal direction and wherein a vertical extension of the body region is greater than a vertical extension of the trench gate structures; and a channel blocking structure at a bottom of the trench gate structures, the channel blocking structure being configured to suppress formation of an inversion channel in a portion of the body region along a bottom surface of the trench gate structures within a maximum operating range of a gate voltage of the semiconductor device.

24. The semiconductor device of claim 23, wherein at least first longitudinal sidewalls of the trench gate structures orthogonal to the first horizontal direction at a first side of the trench gate structures are parallel to main crystal planes.

25. The semiconductor device of claim 23, wherein opposing longitudinal sidewalls of the trench gate structures are parallel to main crystal planes.

26. The semiconductor device of claim 23, wherein a bottom of the trench gate structures is parallel to a main crystal plane.

27. The semiconductor device of claim 23, wherein opposing longitudinal sidewalls of the trench gate structures orthogonal to the first horizontal direction are parallel to each other.

28. The semiconductor device of claim 23, wherein opposing longitudinal sidewalls of the trench gate structures orthogonal to the first horizontal direction are parallel to each other and tilted with respect to a normal to the first surface by an off-axis angle.

29. A semiconductor device, comprising:
a drift structure comprising a drift zone at a distance to a first surface of a semiconductor body comprising silicon carbide and a current spread region between the first surface and the drift zone;
a body region with a longitudinal axis parallel to a first horizontal direction, wherein along a second horizontal direction orthogonal to the first horizontal direction the body region is formed between the current spread region and a source region;
trench gate structure extending into the body region; and
a source contact structure extending into the semiconductor body and adjoining the source region.

30. The semiconductor device of claim 29, further comprising:
a pinning region in low-resistive contact with the source contact structure and forming an auxiliary pn junction with the drift zone directly below the source contact structure.

* * * * *

UNITED STATES PATENT AND TRADEMARK OFFICE
CERTIFICATE OF CORRECTION

PATENT NO. : 10,964,808 B2
APPLICATION NO. : 16/144880
DATED : March 30, 2021
INVENTOR(S) : Meiser et al.

Page 1 of 1

It is certified that error appears in the above-identified patent and that said Letters Patent is hereby corrected as shown below:

In the Claims

Column 30, Line 32 Claim 16, change "from a body" to -- from body --

Signed and Sealed this
Twenty-ninth Day of June, 2021

Drew Hirshfeld
*Performing the Functions and Duties of the*
*Under Secretary of Commerce for Intellectual Property and*
*Director of the United States Patent and Trademark Office*